(12) United States Patent
Park et al.

(10) Patent No.: US 12,122,952 B2
(45) Date of Patent: Oct. 22, 2024

(54) INORGANIC NANOPARTICLE COMPOSITION, LIGHT-EMITTING DEVICE, METHOD OF MANUFACTURING LIGHT-EMITTING DEVICE, AND ELECTRONIC APPARATUS INCLUDING LIGHT-EMITTING DEVICE

(71) Applicant: Samsung Display Co., Ltd., Yongin-si (KR)

(72) Inventors: Myoungjin Park, Yongin-si (KR); Yunku Jung, Yongin-si (KR); Jonghoon Kim, Yongin-si (KR); Sungwoon Kim, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 253 days.

(21) Appl. No.: 17/448,820

(22) Filed: Sep. 24, 2021

(65) Prior Publication Data

US 2022/0098484 A1 Mar. 31, 2022

(30) Foreign Application Priority Data

Sep. 29, 2020 (KR) .......... 10-2020-0127398

(51) Int. Cl.
*C09K 11/02* (2006.01)
*C09K 11/08* (2006.01)
(Continued)

(52) U.S. Cl.
CPC ............ *C09K 11/883* (2013.01); *C09K 11/54* (2013.01); *H10K 71/135* (2023.02); *H10K 71/15* (2023.02);
(Continued)

(58) Field of Classification Search
CPC ... C09K 11/02; C09K 11/025; C09K 11/0883; C09K 11/08; C09K 11/0805;
(Continued)

(56) References Cited

U.S. PATENT DOCUMENTS 9,054,330 B2   6/2015  Qian et al.
2015/0062687 A1* 3/2015  Milliron ............ G02F 1/0018
                                                  427/126.3
2018/0151817 A1   5/2018  Cho et al.

FOREIGN PATENT DOCUMENTS

KR   10-2012-0038472 A   4/2012
KR   10-2013-0047943 A   5/2013
(Continued)

OTHER PUBLICATIONS

Machine translation of KR2015-0041477A, 20 pages. (Year: 2015).*

*Primary Examiner* — Matthew E. Hoban
*Assistant Examiner* — Lynne Edmondson
(74) *Attorney, Agent, or Firm* — Lewis Roca Rothgerber Christie LLP

(57) ABSTRACT

An inorganic nanoparticle composition includes an inorganic nanoparticle and a highly fluorinated solvent, and the inorganic nanoparticle includes an inorganic material and a F-containing charge-transporting organic ligand. A light-emitting device with the inorganic nanoparticle composition, for example, as a material for forming at least a portion of an electron transport region in the light-emitting device. An electronic apparatus includes the light-emitting device.

18 Claims, 3 Drawing Sheets

(51) Int. Cl.
*C09K 11/54* (2006.01)
*C09K 11/56* (2006.01)
*C09K 11/88* (2006.01)
*H10K 71/13* (2023.01)
*H10K 71/15* (2023.01)
*B82Y 20/00* (2011.01)
*B82Y 30/00* (2011.01)
*B82Y 40/00* (2011.01)
*H10K 50/11* (2023.01)
*H10K 50/115* (2023.01)
*H10K 71/00* (2023.01)
*H10K 101/10* (2023.01)
*H10K 102/00* (2023.01)

(52) U.S. Cl.
CPC ............... *B82Y 20/00* (2013.01); *B82Y 30/00* (2013.01); *B82Y 40/00* (2013.01); *H10K 50/11* (2023.02); *H10K 50/115* (2023.02); *H10K 71/00* (2023.02); *H10K 2101/10* (2023.02); *H10K 2102/00* (2023.02)

(58) Field of Classification Search
CPC . C09K 11/0811; C09K 11/0816; C09K 11/54; C09K 11/56; C09K 11/565; C09K 11/567; C09K 11/62; C09K 11/60; C09K 11/61; C09K 11/64; C09K 11/68; C09K 11/71; C09K 11/6468
See application file for complete search history.

(56) References Cited

FOREIGN PATENT DOCUMENTS

| | | |
|---|---|---|
| KR | 10-2015-0041477 A | 4/2015 |
| KR | 10-2016-0033520 A | 3/2016 |
| KR | 10-1740429 B1 | 5/2017 |
| KR | 10-2018-0059363 A | 6/2018 |

* cited by examiner

INORGANIC NANOPARTICLE COMPOSITION, LIGHT-EMITTING DEVICE, METHOD OF MANUFACTURING LIGHT-EMITTING DEVICE, AND ELECTRONIC APPARATUS INCLUDING LIGHT-EMITTING DEVICE

CROSS-REFERENCE TO RELATED APPLICATION

This application claims priority to and the benefit of Korean Patent Application No. 10-2020-0127398, filed on Sep. 29, 2020, in the Korean Intellectual Property Office, the entire content of which is hereby incorporated by reference.

BACKGROUND

1. Field

One or more aspects of embodiments of the present disclosure relate to an inorganic nanoparticle composition, a light-emitting device, a method of manufacturing the light-emitting device, and an electronic apparatus including the light-emitting device.

2. Description of Related Art

Light-emitting devices are devices that convert electrical energy into light energy. Non-limiting examples of such light-emitting devices include organic light-emitting devices that utilize organic materials as a light-emitting material, quantum dot light-emitting devices that utilize quantum dots as a light-emitting material, and/or the like.

An example light-emitting device includes a first electrode, a hole transport region, an emission layer, an electron transport region, and a second electrode, which are sequentially stacked. Holes provided from the first electrode may move toward the emission layer through the hole transport region, and electrons provided from the second electrode may move toward the emission layer through the electron transport region. The holes and the electrons may recombine in the emission layer to produce excitons. These excitons may transition from an excited state to a ground state to thereby generate light.

SUMMARY

One or more aspects of embodiments of the present disclosure are directed toward an inorganic nanoparticle composition, a light-emitting device, a method of manufacturing the light-emitting device, and an electronic apparatus including the light-emitting device. When a light-emitting device is formed utilizing the inorganic nanoparticle composition, orthogonality at an interface between adjacent layers may be improved, and thus, the processing efficiency may be improved.

Additional aspects will be set forth in part in the description that follows and, in part, will be apparent from the description, or may be learned by practice of the presented embodiments of the disclosure.

One or more embodiments of the present disclosure provide an inorganic nanoparticle composition including an inorganic nanoparticle and a highly fluorinated solvent, wherein the inorganic nanoparticle may include an inorganic material and a fluorine-containing (F-containing) charge-transporting organic ligand.

One or more embodiments of the present disclosure provide a light-emitting device including a first electrode, a second electrode facing the first electrode, an interlayer located between the first electrode and the second electrode and including an emission layer,
wherein the interlayer may include an electron transport region located between the emission layer and the second electrode, the electron transport region may include an inorganic nanoparticle and a highly fluorinated solvent.

One or more embodiments of the present disclosure provide a method of manufacturing a light-emitting device may include forming at least one layer in an electron transport region by providing the inorganic nanoparticle composition on an emission layer on a first electrode, and providing a second electrode on the emission layer.

One or more embodiments of the present disclosure provide an electronic apparatus including the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 1 is a schematic cross-sectional view of a light-emitting device according to an embodiment;

DETAILED DESCRIPTION

Figure 2:
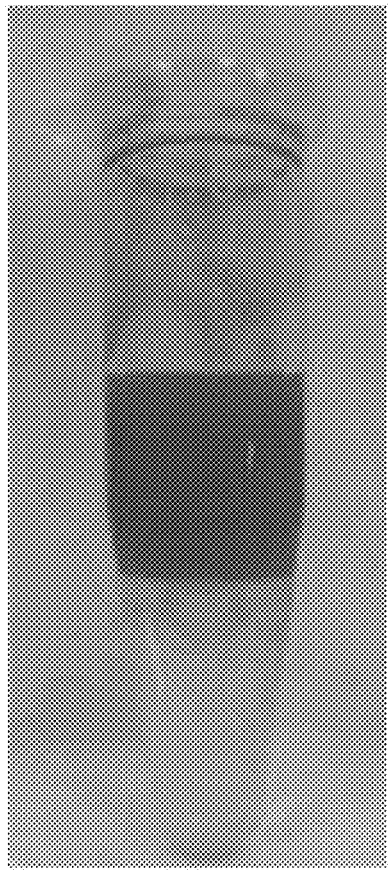
FIG. 2 is a photographic image demonstrating orthogonality in an inorganic nanoparticle composition according to one or more embodiments.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description. As utilized herein, the term "and/or" includes any and all combinations of one or more of the associated listed items. Throughout the disclosure, the expression "at least one of a, b or c", "at least one selected from a, b, and c", or the like indicates only a, only b, only c, both (e.g., simultaneously) a and b, both (e.g., simultaneously) a and c, both (e.g., simultaneously) b and c, all of a, b, and c, or variations thereof.

As the present disclosure allows for various suitable changes and numerous embodiments, selected embodiments will be illustrated in the drawings and described in more detail in the written description. Effects, features, and methods of achieving the present disclosure will be obvious by referring to example embodiments of the present disclosure with reference to the attached drawings. The present disclosure may, however, be embodied in many different forms and should not be construed as being limited to the embodiments set forth herein.

In the embodiments described in the present specification, an expression utilized in the singular encompasses the expression of the plural and vice versa, unless it has a clearly different meaning in the context.

In the present specification, it is to be understood that the terms such as "including," "having," and "comprising" are intended to indicate the existence of the features or components disclosed in the specification, and are not intended to preclude the possibility that one or more other features or components may exist or may be added.

It will be understood that when a layer, region, or component is referred to as being "on" or "onto" another layer, region, or component, it may be directly or indirectly formed over the other layer, region, or component. For example, for example, intervening layers, regions, or components may be present. When an element is referred to as being "directly on," "directly connected to," or "directly coupled to" another element, there are no intervening elements present.

The sizes and dimensions of components in the drawings may be exaggerated for convenience of explanation. In other words, because sizes and thicknesses of components in the drawings are arbitrarily illustrated for convenience of explanation, embodiments are not limited thereto.

The term "room temperature" as utilized herein refers to a temperature of about 25° C.

Inorganic Nanoparticle Composition

A nanoparticle composition according to one or more embodiments may include an inorganic nanoparticle and a highly fluorinated solvent, wherein the inorganic nanoparticle may include an inorganic material and a fluorine-containing (F-containing) charge-transporting organic ligand.

In some embodiments, the inorganic nanoparticle may include an inorganic material, and the inorganic material may include: an oxide, a nitride, a sulfide, or an oxynitride of zinc (Zn), molybdenum (Mo), tungsten (W), nickel (Ni), magnesium (Mg), zirconium (Zr), tin (Sn), tantalum (Ta), hafnium (Hf), aluminum (Al), titanium (Ti), or barium (Ba); or any combination thereof.

In an embodiment, the inorganic nanoparticle may include zinc oxide (ZnO), molybdenum oxide ($MoO_3$), tungsten oxide ($WO_3$), nickel oxide (NiO), zinc magnesium oxide (ZnMgO), zinc aluminum oxide (ZnAlO), titanium dioxide ($TiO_2$), magnesium oxide (MgO), zirconium oxide ($ZrO_2$), tin oxide (SnO), tin dioxide ($SnO_2$), tantalum oxide ($Ta_2O_3$), hafnium oxide ($HfO_3$), aluminum oxide ($Al_2O_3$), zirconium silicon oxide ($ZrSiO_4$), barium titanium oxide ($BaTiO_3$), barium zirconium oxide ($BaZrO_3$), or any combination thereof.

For example, the inorganic material may be selected from ZnO, $MoO_3$, $WO_3$, and NiO.

In some embodiments, the inorganic nanoparticle may further include a doping material (e.g., dopant). For example, the doping material may include lithium (Li), sodium (Na), potassium (K), rubidium (Rb), cesium (Cs), beryllium (Be), magnesium (Mg), calcium (Ca), strontium (Sr), barium (Ba), copper (Cu), aluminum (Al), gallium (Ga), indium (In), silicon (Si), or any combination thereof.

For example, the inorganic material may be doped with the doping material in a form of a metal ion.

In an embodiment, the inorganic nanoparticle may include:

a ZnO nanoparticle, a $MoO_3$ nanoparticle, a $WO_3$ nanoparticle, or a NiO nanoparticle (an inorganic material, for example an intrinsic or undoped inorganic material); or a ZnO nanoparticle, a $MoO_3$ nanoparticle, a $WO_3$ nanoparticle, or a NiO nanoparticle (an inorganic material), each further including Li, Na, K, Rb, Cs, Be, Mg, Ca, Sr, Ba, Cu, Al, Ga, In, Si, or any combination thereof (a doping material).

The inorganic nanoparticle may provide excellent or suitable charge mobility.

In some embodiments, an average diameter of the inorganic nanoparticle may be in a range of about 3 nanometers (nm) to about 15 nm. When the average diameter of the inorganic nanoparticle is within this range, charge mobility and external light extraction efficiency of the light-emitting device may be improved.

In some embodiments, the inorganic nanoparticle may have a structure in which the inorganic material is capped with the F-containing charge-transporting organic ligand.

In some embodiments, the F-containing charge-transporting organic ligand may be a compound represented by Formula 1 or a salt represented by Formula 2:

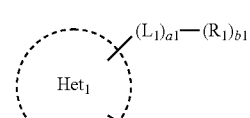

Formula 1

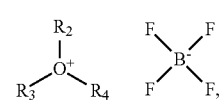

Formula 2 wherein, in Formulae 1 and 2, ring $Het_1$ may be a π electron-depleted nitrogen-containing $C_1$-$C_{60}$ cyclic group, $L_1$ and $L_2$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 and a2 may each independently be an integer from 0 to 5, and when a1 is 2 or greater, at least two $L_1$(s) may be identical to or different from each other, and when a2 is 2 or greater, at least two $L_2$(s) may be identical to or different from each other, $Y_1$ may be —OH, —COOH, —$NH_2$, or —SH, $R_1$ to $R_4$ may each independently be hydrogen, deuterium, —F, —Cl, —Br, —I, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and at least one of the b1 $R_1(s)$ may be —F or a fluorine-containing group, and b1 may be an integer from 1 to 20, and when b1 is 2 or greater, at least two $R_1(s)$ may be identical to or different from each other.

The π electron-depleted nitrogen-containing $C_1$-$C_{60}$ cyclic group may be i) a first ring, ii) a condensed ring in which at least two first rings are condensed, or iii) a condensed ring in which at least two second rings are condensed, the first ring may be a furan group, a thiophene group, a pyrrole group, a silole group, an oxazole group, an isoxazole group, an oxadiazole group, an isoxadiazole group, oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, a triazasilole group, a pyridine group, a pyrimidine group, a pyrazine group, a pyridazine group, or a triazine group, and the second ring may be a cyclopentane group, a cyclohexane group, a cyclopentadiene group, a cyclohexene group, a benzene group, a furan group, a thiophene group, a pyrrole group, a silole group, an indene group, a benzofuran group, a benzothiophene group, an indole group, or a benzosilole group.

In an embodiment, the π electron-depleted nitrogen-containing $C_1$-$C_{60}$ cyclic group unsubstituted or substituted with at least one $R_1$ may be an azaindole group, an azaindene group, an azabenzosilole group, an azabenzothiophene group, an azabenzofuran group, an azacarbazole group, an azafluorene group, an azadibenzosilole group, an azadibenzothiophene group, an azadibenzoselenophene group, a pyridine group, a pyrimidine group, a pyrazine group, a pyridazine group, a triazine group, a quinoline group, an isoquinoline group, a quinoxaline group, a quinazoline group, a phenanthroline group, an acridine group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with at least one $R_1$.

The F-containing group may be an organic group substituted with at least one —F.

For example, the F-containing group may be a $C_1$-$C_{60}$ alkyl group substituted with at least one —F, a $C_2$-$C_{60}$ alkenyl group substituted with at least one —F, a $C_2$-$C_{60}$ alkynyl group substituted with at least one —F, a $C_1$-$C_{60}$ alkoxy group substituted with at least one —F, a $C_3$-$C_{10}$ cycloalkyl group substituted with at least one —F, a $C_1$-$C_{10}$ heterocycloalkyl group substituted with at least one —F, a $C_3$-$C_{10}$ cycloalkenyl group substituted with at least one —F, a $C_1$-$C_{10}$ heterocycloalkenyl group substituted with at least one —F, a $C_6$-$C_{60}$ aryl group substituted with at least one —F, a $C_6$-$C_{60}$ aryloxy group substituted with at least one —F, a $C_6$-$C_{60}$ arylthio group substituted with at least one —F, a $C_1$-$C_{60}$ heteroaryl group substituted with at least one —F, a $C_1$-$C_{60}$ heteroaryloxy group substituted with at least one —F, a $C_1$-$C_{60}$ heteroarylthio group substituted with at least one —F, a monovalent non-aromatic condensed polycyclic group substituted with at least one —F, or a monovalent non-aromatic condensed heteropolycyclic group substituted with at least one —F.

In addition to —F, the F-containing group may be further substituted with: deuterium (—D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with at least one of deuterium, —F, —Cl, —Br, —I, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), or —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), or —P(=O)($Q_{21}$)($Q_{22}$); —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$); or any combination thereof.

$Q_1$ to $Q_3$, $Q_{11}$ to $Q_{13}$, $Q_{21}$ to $Q_{23}$, and $Q_{31}$ to $Q_{33}$ may each independently be the same as described below.

In some embodiments, the F-containing charge-transporting organic ligand may be a compound represented by Formula 1-1 or a salt represented by Formula 2-1 or Formula 2-2:

Formula 1-1

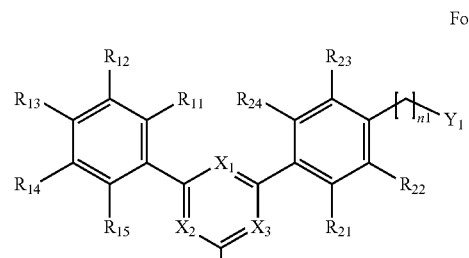

Formula 2-1

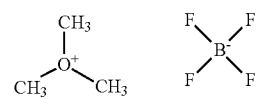

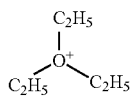 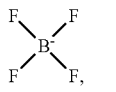

Formula 2-2 wherein, in Formula 1-1, $X_1$ to $X_3$ may each independently be $C(R_{10})$ or N, at least one of $X_1$ to $X_3$ may be N, $Y_1$ may be —OH, —COOH, —NH$_2$, or —SH, n1 may be an integer from 0 to 20, $R_{10}$ to $R_{24}$ may each independently be hydrogen, deuterium, —F, —Cl, —Br, —I, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and at least one of $R_{11}$ to $R_{24}$ may be —F or a $C_1$-$C_{20}$ fluoroalkyl group.

The $C_1$-$C_{20}$ fluoroalkyl group may be a $C_1$-$C_{20}$ alkyl group substituted with at least one —F.

In some embodiments, at least one of $R_{11}$ to $R_{24}$ may be —F or a $C_1$-$C_{20}$ perfluoroalkyl group, for example, a $C_1$-$C_{20}$ alkyl group in which all hydrogen atoms are substituted with —F.

As the F-containing charge-transporting organic ligand includes a F-containing group, the inorganic nanoparticle may have excellent charge transportability. Thus, when the F-containing charge-transporting organic ligand is applied to a light-emitting device, migration of holes and electrons may be facilitated, thus improving efficiency of the light-emitting device.

In some embodiments, $R_{11}$ to $R_{24}$ may be identical to each other, and $R_{11}$ to $R_{24}$ may each be —F or a $C_1$-$C_{20}$ fluoroalkyl group.

In some embodiments, $R_{11}$ to $R_{24}$ may each be —F.

In some embodiments, $R_{11}$ to $R_{24}$ may each be —(CF$_2$)$_{n2}$CF$_3$ (wherein n2 may be an integer from 0 to 10).

In some embodiments, the F-containing charge-transporting organic ligand may cover at least a portion of a surface of the inorganic material.

In some embodiments, the highly fluorinated solvent may include chlorofluorocarbon (CFC), perfluorocarbon (PFC), hydrofluorocarbon (HFC), hydrofluoroolefin (HFO), hydrochlorofluorocarbon (HCFC), hydrochlorofluoroolefin (HCFO), hydrofluoroether (HFE), perfluoropolyether (PFPE), or any combination thereof.

The content of the inorganic nanoparticle in the inorganic nanoparticle composition may be in a range of about 1 percent by weight (wt %) to about 40 wt %, for example, about 1 wt % to about 30 wt %, for example, about 2 wt % to about 20 wt %, or for example, about 3 wt % to about 10 wt %. When the content is within any of these ranges, the inorganic nanoparticle composition may be suitable in terms of charge mobility for applying to a light-emitting device.

The content of the highly fluorinated solvent in the inorganic nanoparticle composition may be in a range of about 60 wt % to about 99 wt %, for example, about 70 wt % to about 98 wt %, or for example, about 80 wt % to about 95 wt %. When the content is within any of these ranges, the inorganic nanoparticle composition may have a high melting point. Thus, the inorganic nanoparticle composition may be advantageously utilized for an inkjet process, and mixing and/or deterioration of materials at an interface between adjacent layers may be prevented or reduced during thin film formation.

In some embodiments, the inorganic nanoparticle composition may have a melting point of 150° C. or greater. In some embodiments, the inorganic nanoparticle composition may have a melting point of 200° C. or greater.

The inorganic nanoparticle composition may have a viscosity in a range of about 1 centipoise (cP) to about 10 cP. When the viscosity of the inorganic nanoparticle composition is within this range, the inorganic nanoparticle composition may be suitably utilized in formation of at least one layer in an interlayer of a light-emitting device by utilizing a solution process.

The inorganic nanoparticle composition may have a surface tension in a range of about 10 dynes/cm to about 40 dynes/cm. When the surface tension of the inorganic nanoparticle composition is within this range, the inorganic nanoparticle composition may be suitably utilized in formation of at least one layer in an interlayer of a light-emitting device by utilizing a solution process.

When the inorganic nanoparticle composition according to one or more embodiments has a high melting point, stain generation while drying may be reduced, and mixing and/or deterioration of materials at an interface between adjacent layers may be prevented or reduced during thin film formation. Thus, the inorganic nanoparticle composition may be utilized advantageously in an inkjet process, and the efficiency may be improved.

Light-Emitting Device

According to an aspect, a light-emitting device may include: a first electrode; a second electrode facing the first electrode; and an interlayer located between the first electrode and the second electrode and including an emission layer, wherein the interlayer may include an electron transport region located between the emission layer and the second electrode, at least a portion of the electron transport region may be formed by utilizing an inorganic nanoparticle composition including an inorganic nanoparticle and a highly fluorinated solvent, and the inorganic nanoparticle may include an inorganic material and a F-containing charge-transporting organic ligand.

In some embodiments, the electron transport region may include an electron transport layer, wherein the electron transport layer may be in direct contact with the emission layer and may be formed by utilizing the inorganic nanoparticle composition.

In one embodiment, the first electrode may be an anode, and the second electrode may be a cathode, and the light-emitting device may further include a hole transport region located between the first electrode and the emission layer, wherein the hole transport region may include a hole injection layer, a hole transport layer, an emission auxiliary layer, an electron blocking layer, or a combination thereof.

In some embodiments, the second electrode may be a transparent electrode having a light transmittance of 50 percent (%) or higher, based on light in a range of a visible light wavelengths.

In one or more embodiments, the light-emitting device may include a capping layer located outside the first electrode and/or outside the second electrode.

In one or more embodiments, the light-emitting device may further include at least one of a first capping layer located outside a first electrode or a second capping layer located outside a second electrode, and at least one of the first capping layer or the second capping layer may include the compound represented by Formula 1. The first capping layer and the second capping layer may respectively be understood by referring to the descriptions of the first capping layer and the second capping layer provided herein.

In some embodiments, the light-emitting device may include:

a first capping layer located outside the first electrode and including the compound represented by Formula 1;

a second capping layer located outside the second electrode and including the compound represented by Formula 1; or the first capping layer and the second capping layer (e.g., simultaneously).

According to one or more embodiments, an electronic apparatus may include the light-emitting device. The electronic apparatus may further include a thin-film transistor. In some embodiments, the electronic apparatus may further include a thin-film transistor including a source electrode and drain electrode, and a first electrode of the light-emitting device may be electrically connected to the source electrode or the drain electrode. The electronic apparatus may further include a color filter, a color-conversion layer, a touchscreen layer, a polarization layer, or any combination thereof. The electronic apparatus may be understood by referring to the description of the electronic apparatus provided herein.

Figure 1:
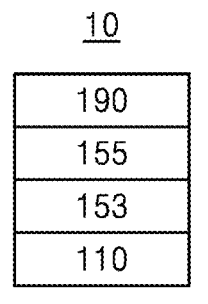

With reference to FIG. 1, the light-emitting device according to an embodiment will be described.

A light-emitting device 10 shown in FIG. 1 may include a first electrode 110, an emission layer 153, an electron transport region 155, and a second electrode 190.

First electrode 110

In FIG. 1, a substrate may be additionally located under the first electrode 110 and/or above the second electrode 190. The substrate may be a glass substrate and/or a plastic substrate. The substrate may be a flexible substrate including plastic having excellent heat resistance and/or durability, for example, polyimide, polyethylene terephthalate (PET), polycarbonate, polyethylene naphthalate, polyarylate (PAR), polyetherimide, or any combination thereof.

The organic light-emitting device may be a bottom emission organic light-emitting device or a top emission organic light-emitting device, depending on the position of the substrate.

The first electrode 110 may be formed by depositing or sputtering, on the substrate, a material for forming the first electrode 110. When the first electrode 110 is an anode, a high work function material that may easily inject holes may be utilized.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combination thereof. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg-Ag), or any combination thereof may be utilized as a material for forming the first electrode 110.

The first electrode 110 may have a single-layered structure including (e.g., consisting of) a single layer, or a multi-layered structure including two or more layers. In some embodiments, the first electrode 110 may have a triple-layered structure of ITO/Ag/ITO.

The light-emitting device may include: i) at least two emitting units sequentially stacked between the first electrode 110 and the second electrode 190; and ii) a charge-generation layer located between the at least two emitting units. When the light-emitting device includes the at least two emitting units and the charge-generation layer, the light-emitting device 10 may be a tandem light-emitting device.

Hole Transport Region

In some embodiments, a hole transport region may be further included between the first electrode 110 and the emission layer 153.

The hole transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The hole transport region may include a hole injection layer, a hole transport layer, an emission auxiliary layer, an electron blocking layer, or a combination thereof.

For example, the hole transport region may have a multi-layered structure, (e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure), wherein the constituting layers of each structure are sequentially stacked on the first electrode 110 in each stated order.

The hole transport region may include a compound represented by Formula 201, a compound represented by Formula 202, or any combination thereof:

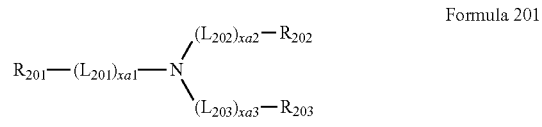

Formula 201

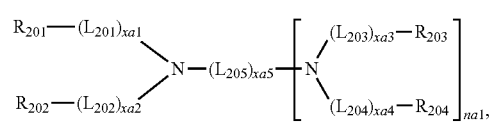

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In some embodiments, the compounds represented by Formulae 201 and 202 may each include at least one of the groups represented by Formulae CY201 to CY217:

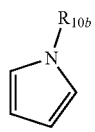
CY201

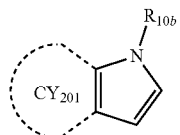
CY202

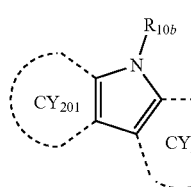
CY203

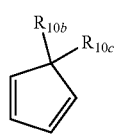
CY204

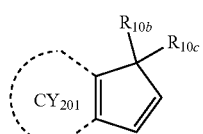
CY205

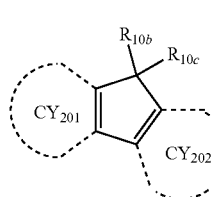
CY206

-continued

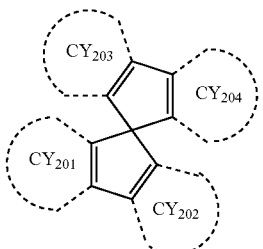
CY207

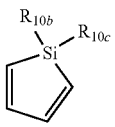
CY208

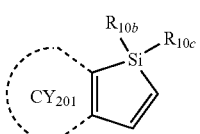
CY209

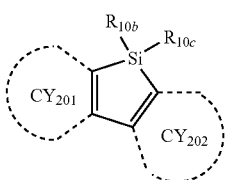
CY210

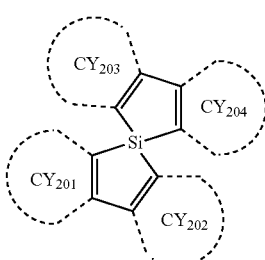
CY211

CY212

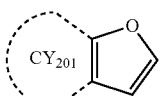
CY213

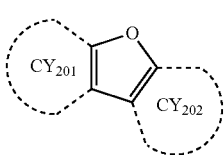
CY214

-continued

CY215

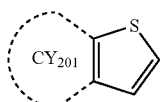
CY216

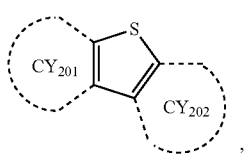
CY217 wherein, in Formulae CY201 to CY217, $R_{10b}$ and $R_{10c}$ may each independently be understood by referring to the description of $R_{10a}$ provided herein, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In some embodiments, in Formulae CY201 to CY217, ring $CY_{201}$ to ring $CY_{204}$ may each independently be a benzene group, a naphthalene group, a phenanthrene group, or an anthracene group.

In some embodiments, the compounds represented by Formulae 201 and 202 may each include at least one of the groups represented by Formulae CY201 to CY203:

In one or more embodiments, the compound represented by Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be a group represented by any one of Formulae CY201 to CY203, xa2 may be 0, and $R_{202}$ may be a group represented by Formulae CY204 to CY207.

In some embodiments, the compounds represented by Formulae 201 and 202 may each not include groups represented by Formulae CY201 to CY203:

In one or more embodiments, the compounds represented by Formula 201 and 202 may each not include groups represented by Formulae CY201 to CY203, and include at least one of the groups represented by Formulae CY204 to CY217.

In some embodiments, the compounds represented by Formulae 201 and 202 may each not include groups represented by Formulae CY201 to CY217:

In some embodiments, the hole transport region may include one of Compounds HT1 to HT44, m-MTDATA, TDATA, 2-TNATA, NPB (NPD), β-NPB, TPD, spiro-TPD, spiro-NPB, methylated-NPB, TAPC, HMTPD, 4,4',4"-tris (N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate) (PANI/PSS), or any combination thereof:

HT1

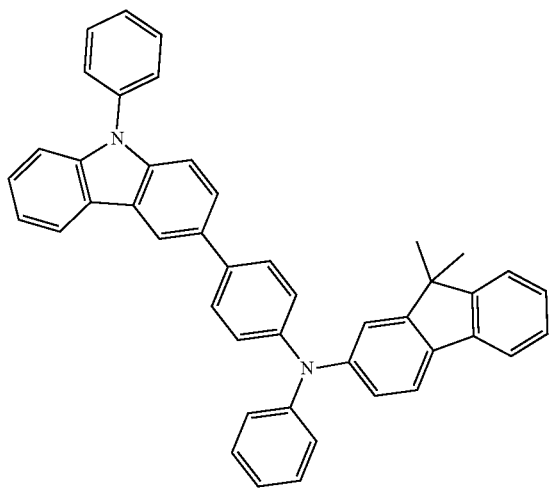

HT2

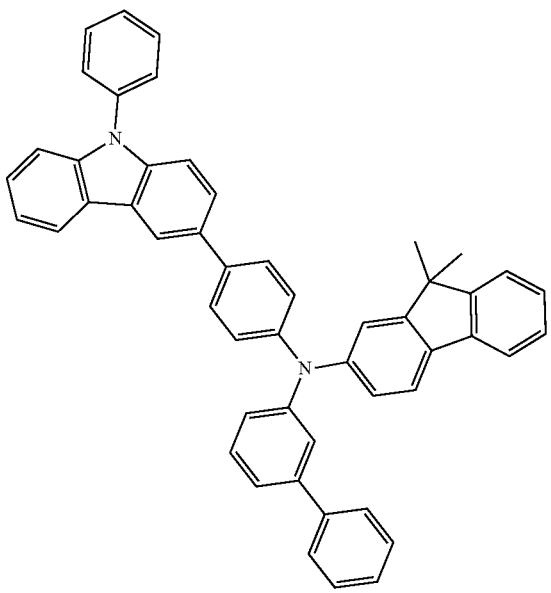

-continued
HT3
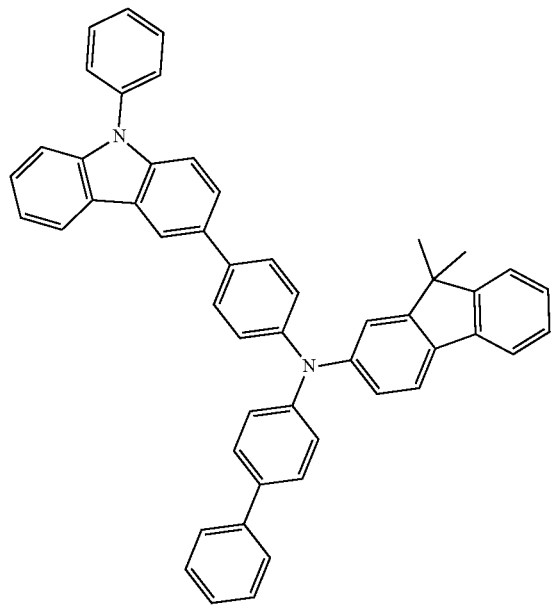
HT4
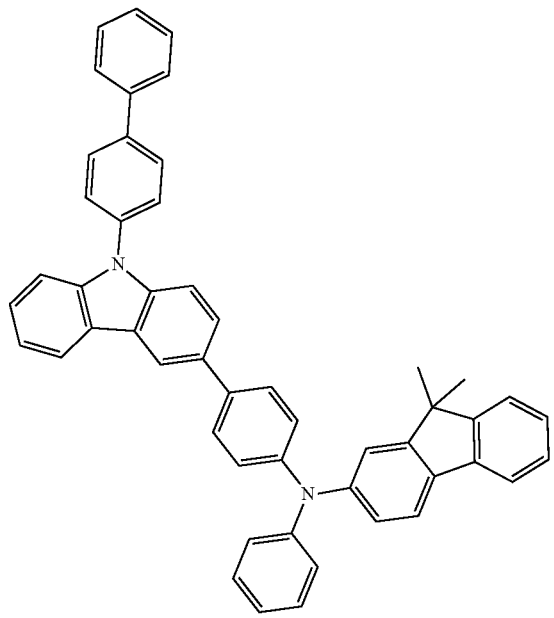
HT5
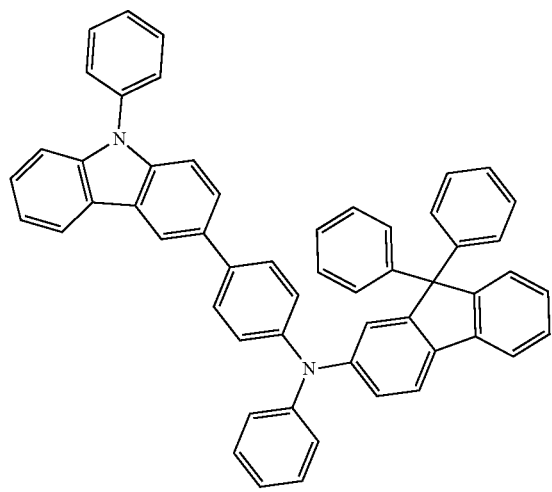
HT6
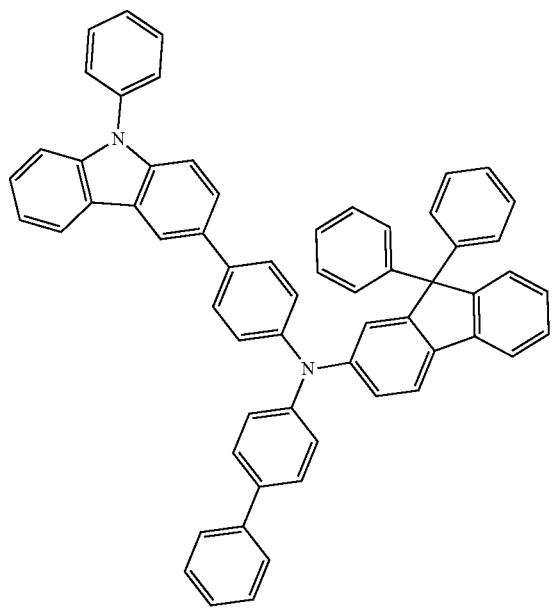

HT7
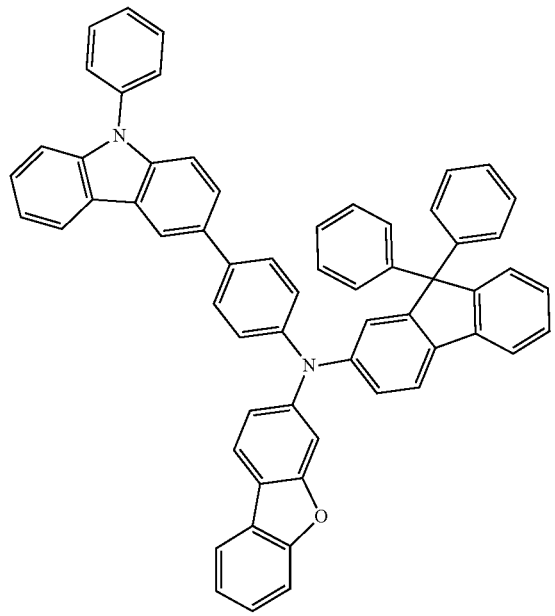
HT8
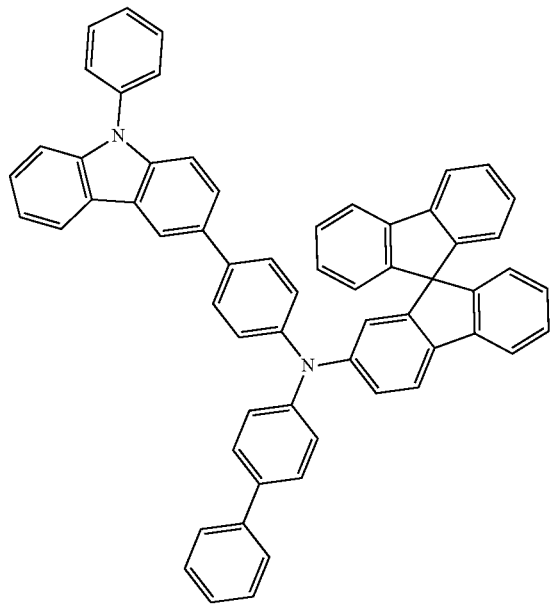
HT9
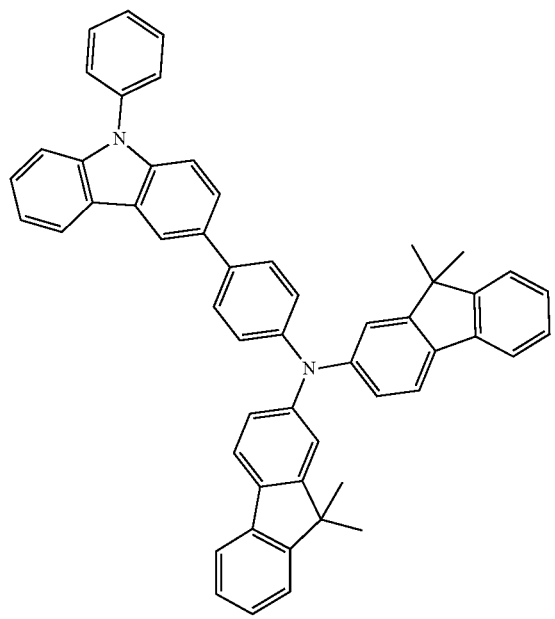
HT10
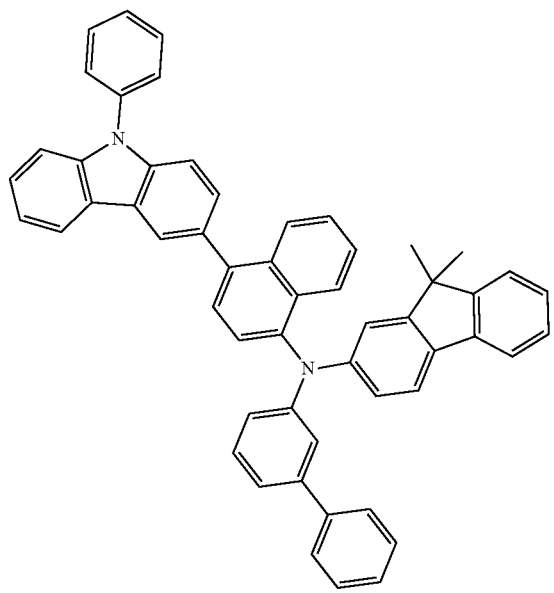

-continued
HT11
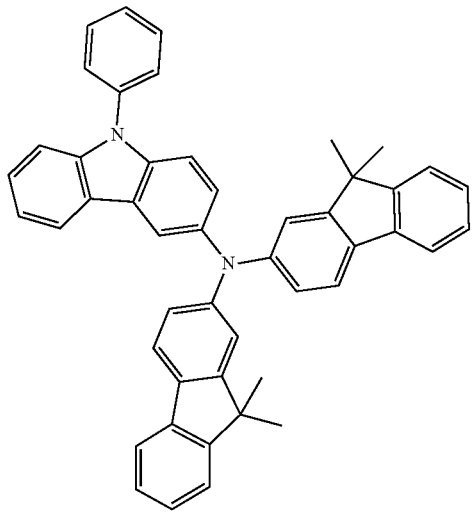
HT12
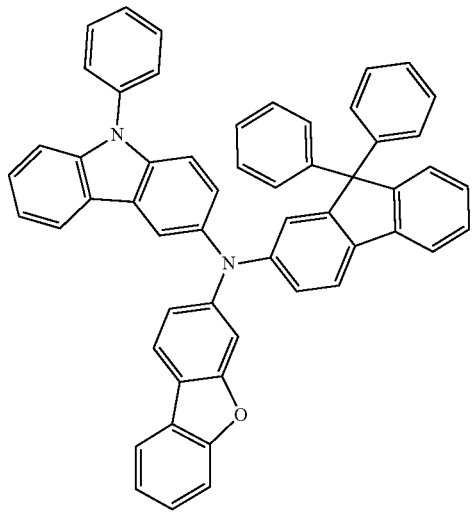
HT13
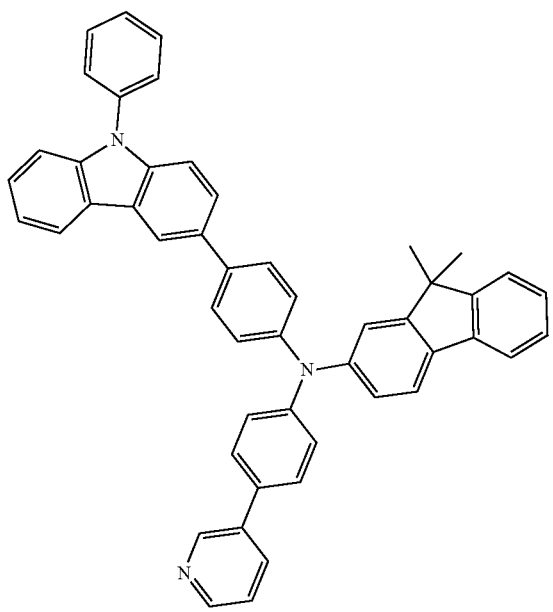
HT14
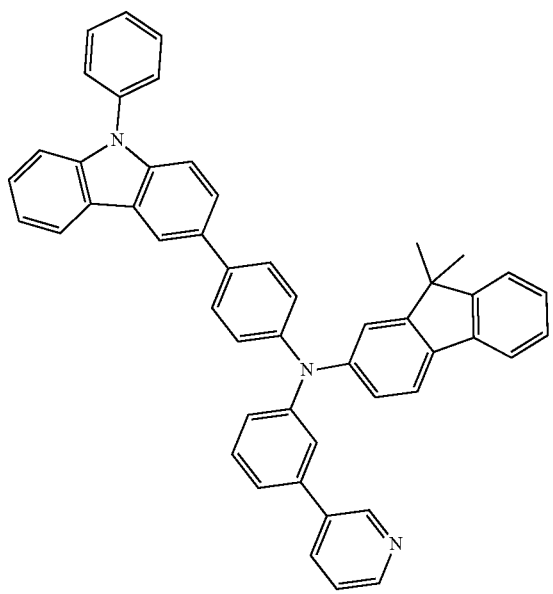
HT15
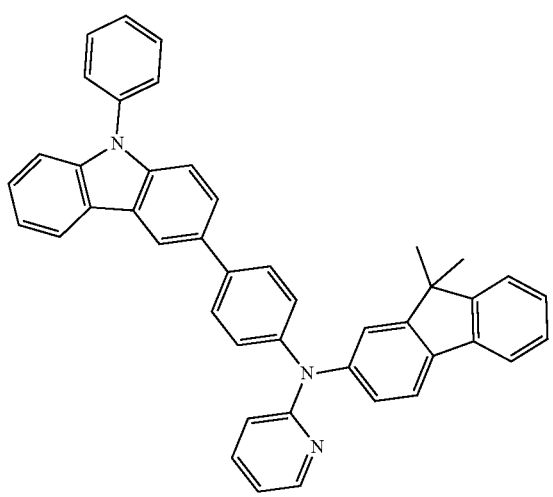
HT16
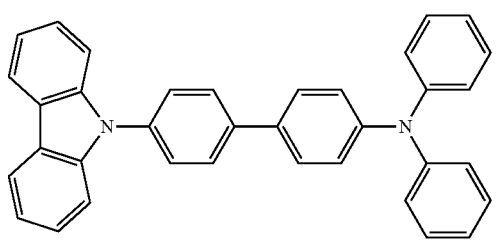

-continued
HT17
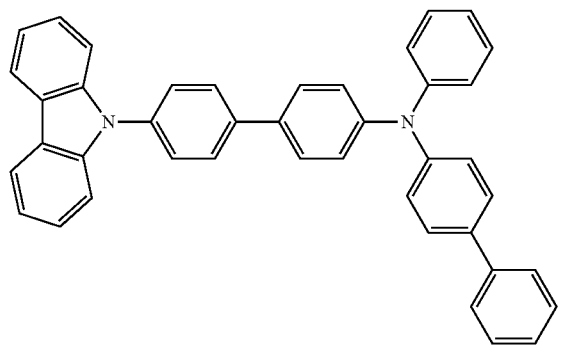
HT18
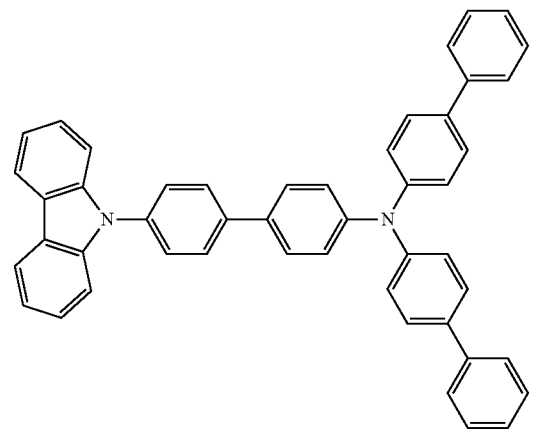
HT19
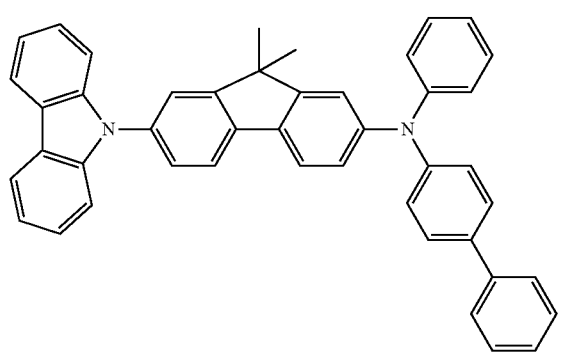
HT20
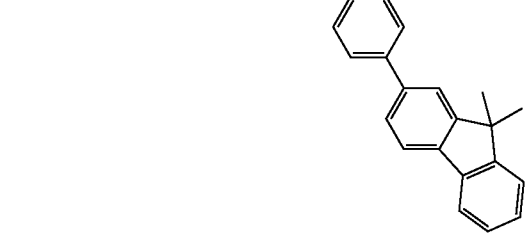
HT21
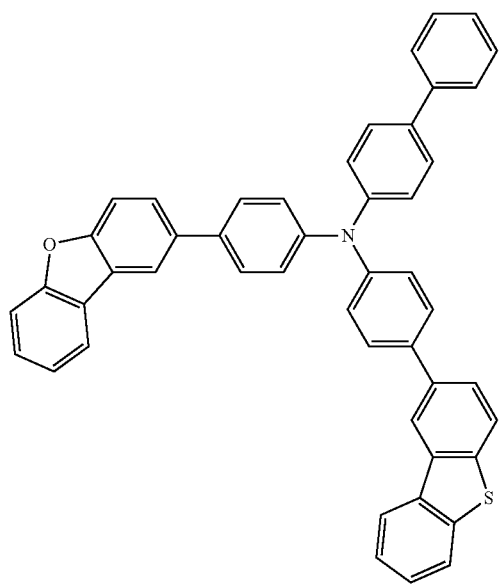
HT22
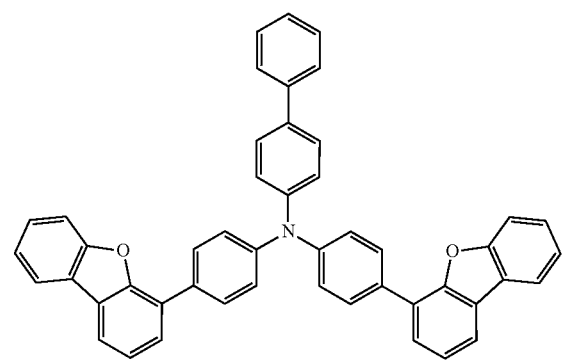

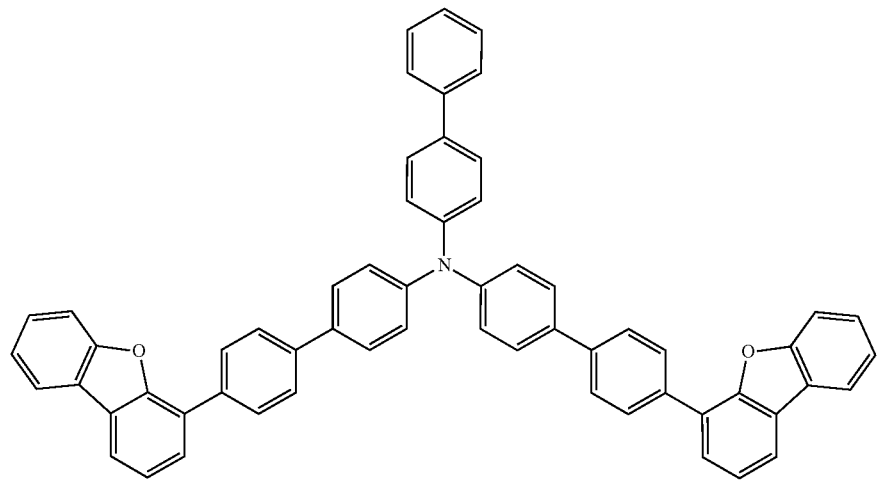
HT23
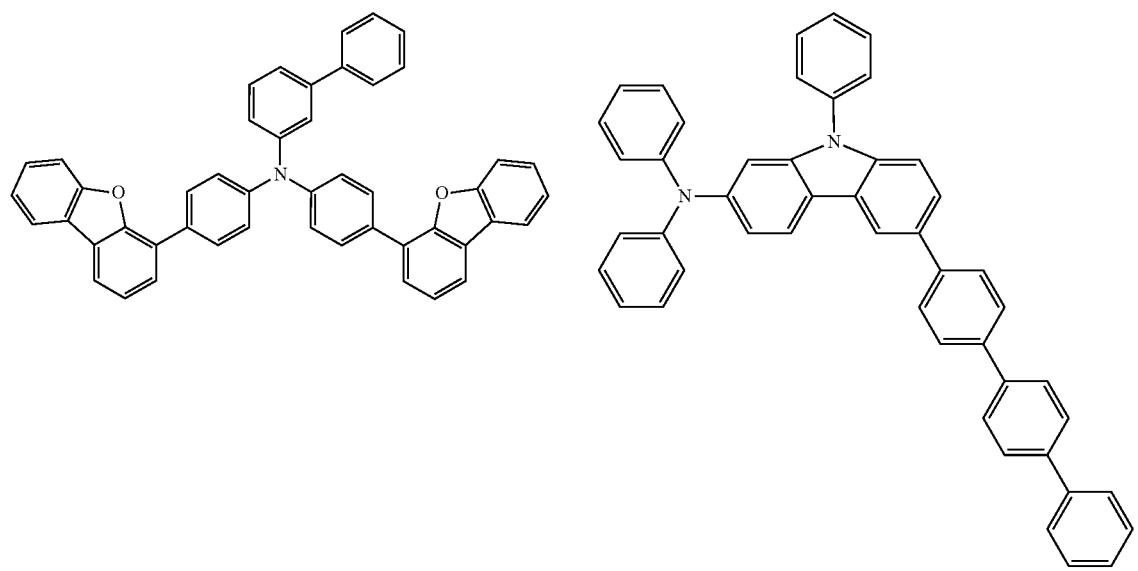
HT24
HT25
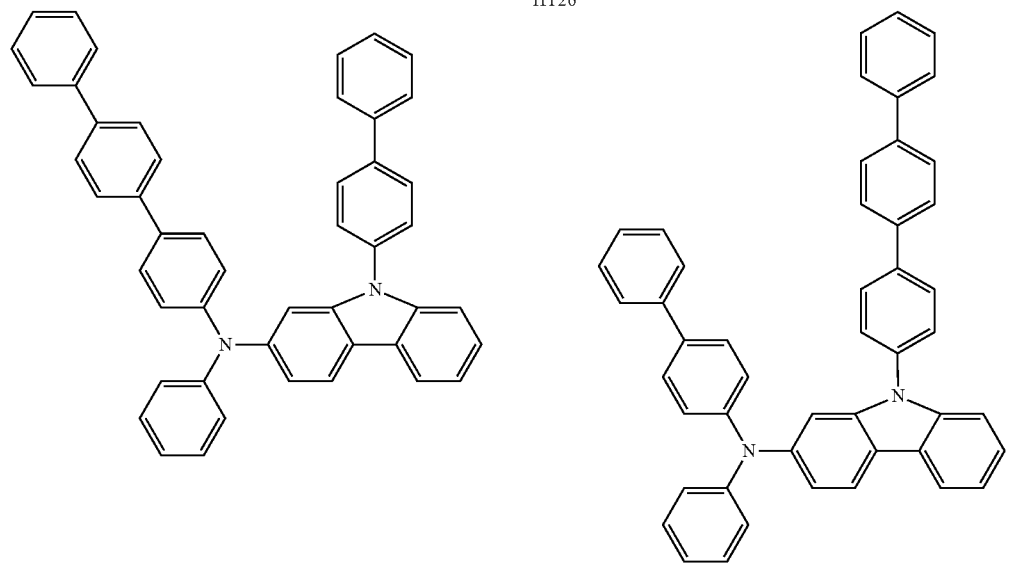
HT26
HT27

-continued
HT28
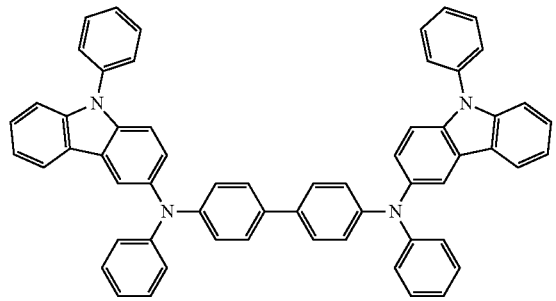
HT29
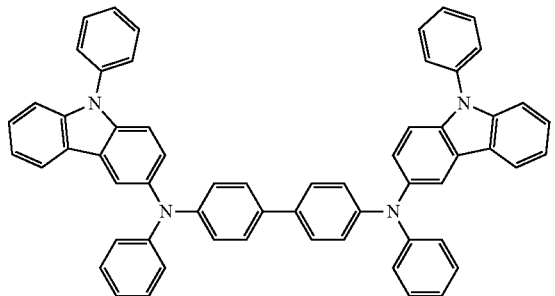
HT30
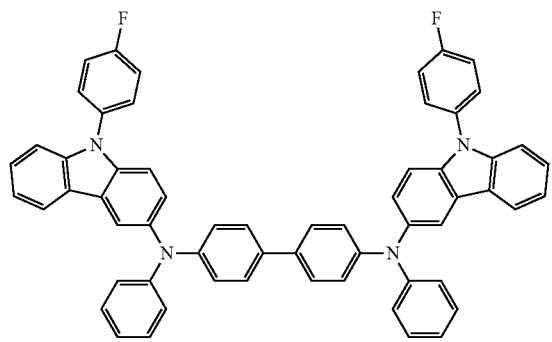
HT31
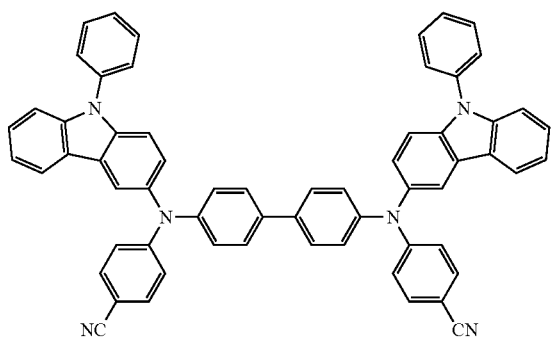
HT32
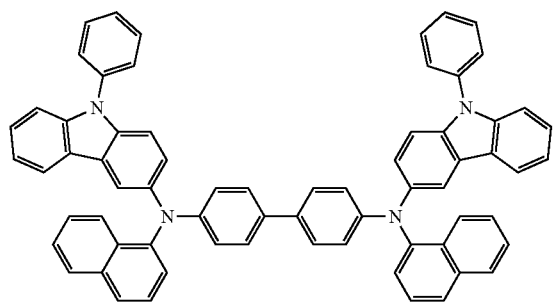
HT33
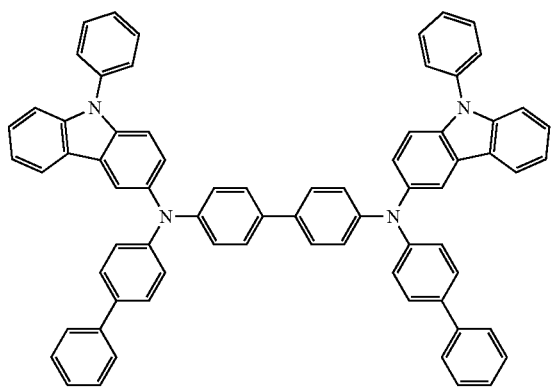
HT34
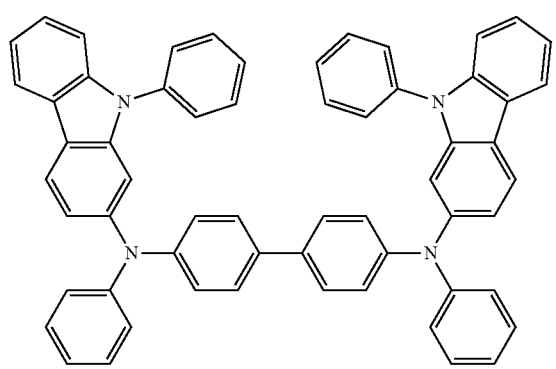
HT35
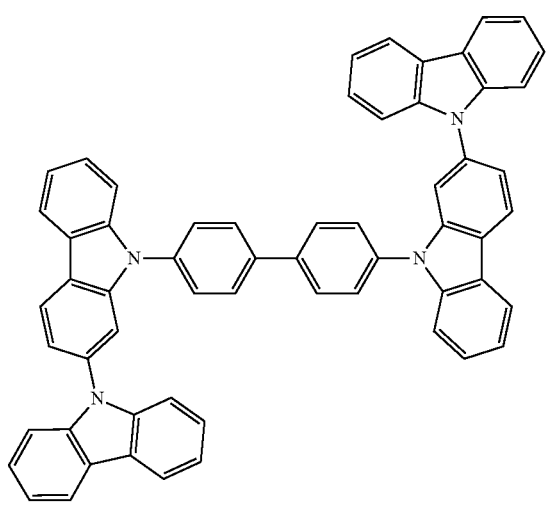

-continued
HT36
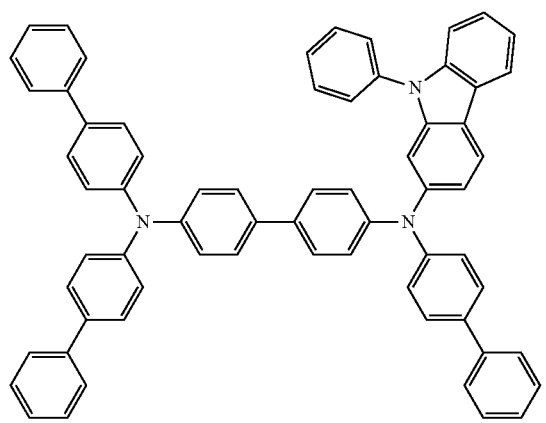
HT37
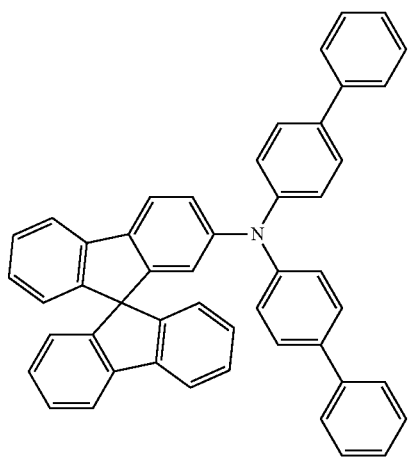
HT38
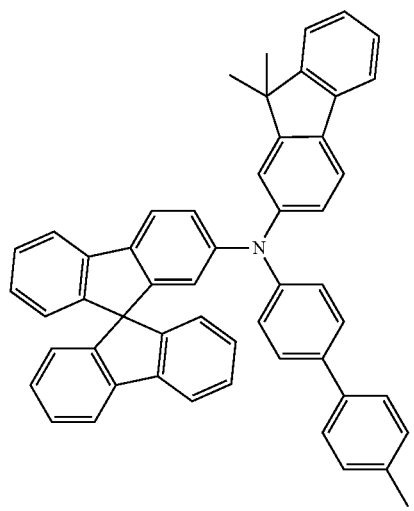
HT39
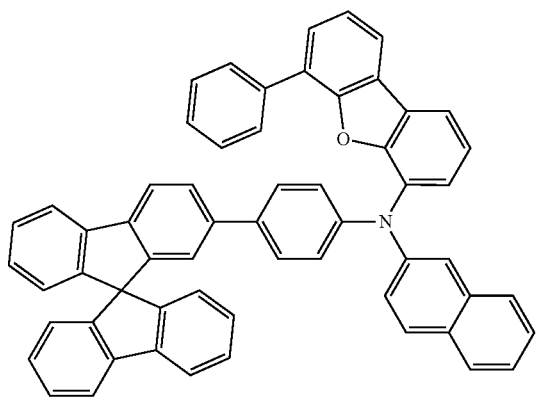
HT40
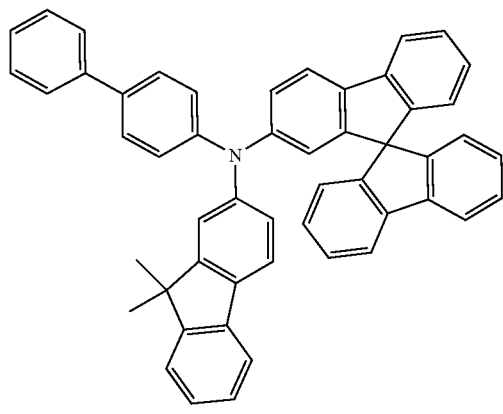
HT41
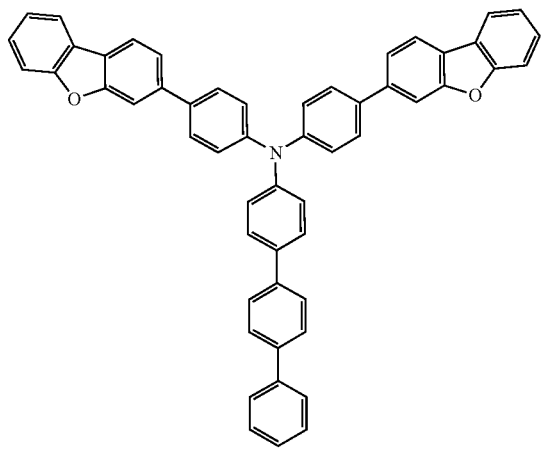

-continued
HT42
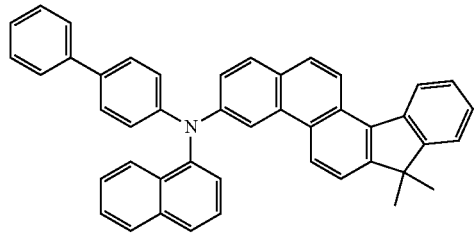
HT43
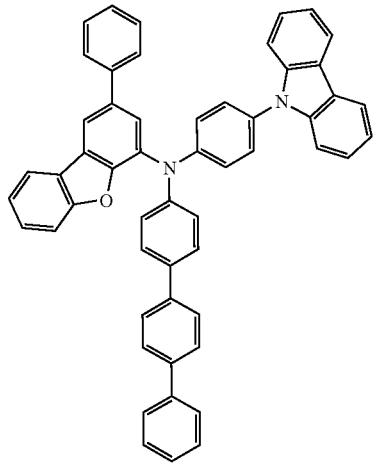
HT44
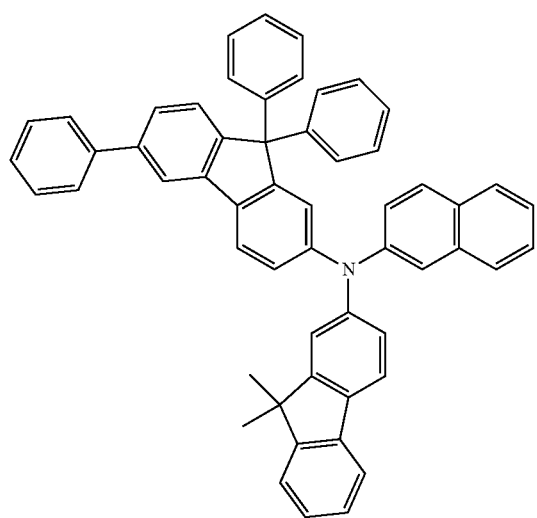
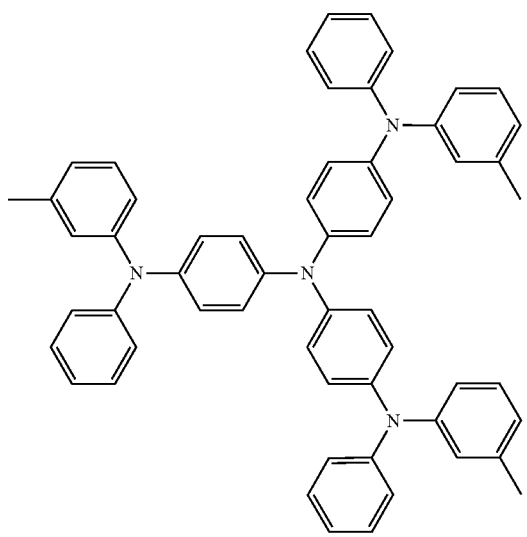
m-MTDATA
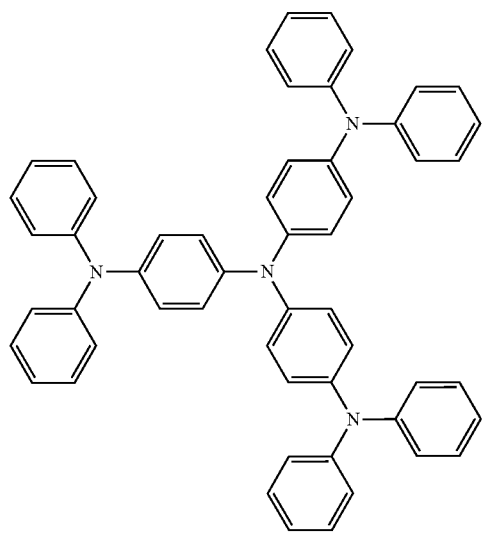
TDATA
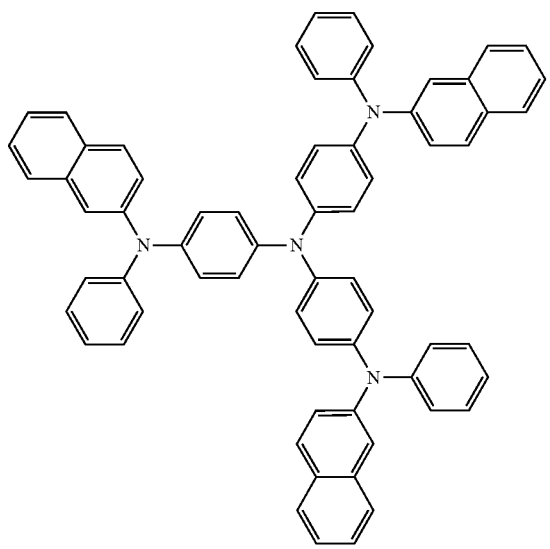
2-TNATA -continued

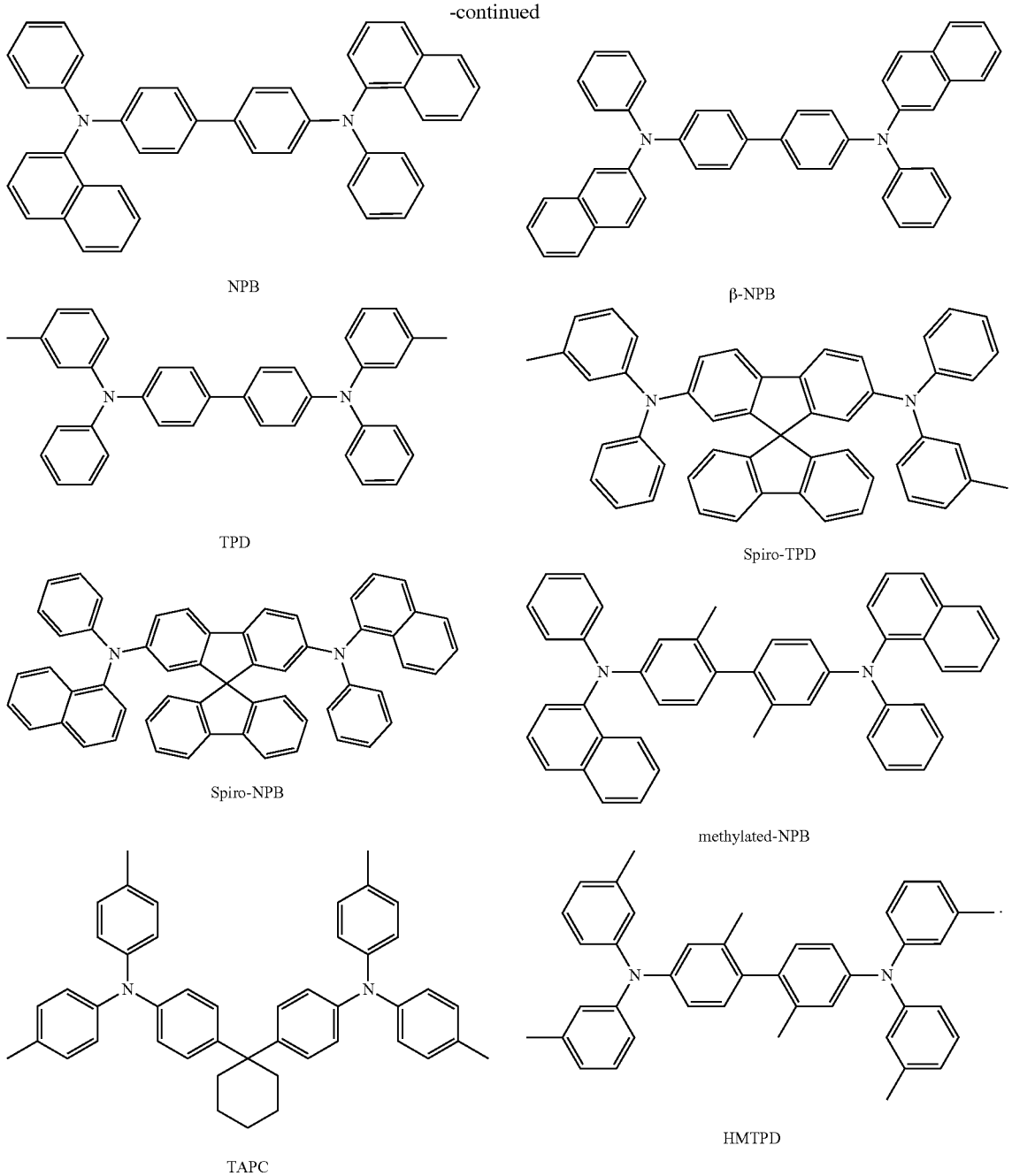

The thickness of the hole transport region may be in a range of about 50 (Angstroms) Å to about 10,000 Å, and in some embodiments, about 100 Å to about 4,000 Å. When the hole transport region includes a hole injection layer, a hole transport layer, or any combination thereof, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase the light emission efficiency of the device by compensating for an optical resonance distance of the wavelength of light emitted by an emission layer. The electron blocking layer may prevent or reduce leakage of electrons to a hole transport region from the emission layer. Materials that may be included in the hole transport region may also be included in an emission auxiliary layer and an electron blocking layer.

p-dopant

The hole transport region may include a charge generating material as well as the aforementioned materials to improve the conductive properties of the hole transport region. The charge generating material may be substantially homogeneously or non-homogeneously dispersed (for example, as a single layer including (e.g., consisting of) charge generating material) in the hole transport region.

The charge generating material may include, for example, a p-dopant.

In some embodiments, a lowest unoccupied molecular orbital (LUMO) energy level of the p-dopant may be −3.5 eV or less.

In some embodiments, the p-dopant may include a quinone derivative, a cyano group-containing compound, a compound including elements EL1 and EL2, or any combination thereof.

Non-limiting examples of the quinone derivative include TCNQ, F4-TCNQ, and/or the like.

Non-limiting examples of the cyano group-containing compound include HAT-CN, a compound represented by Formula 221, and/or the like:

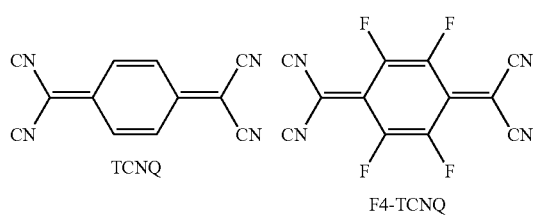

TCNQ

F4-TCNQ

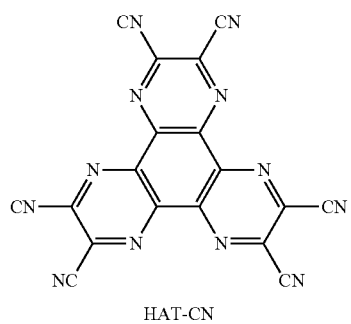

HAT-CN

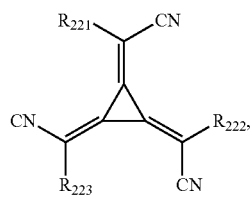

Formula 221 wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including elements EL1 and EL2, element EL1 may be metal, metalloid, or a combination thereof, and element EL2 may be non-metal, metalloid, or a combination thereof.

Non-limiting examples of the metal may include: an alkali metal (e.g., lithium (Li), sodium (Na), potassium (K), rubidium (Rb), cesium (Cs), and/or the like); an alkaline earth metal (e.g., beryllium (Be), magnesium (Mg), calcium (Ca), strontium (Sr), barium (Ba), and/or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); a post-transition metal (e.g., zinc (Zn), indium (In), tin (Sn), and/or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like); and/or the like.

Non-limiting examples of the metalloid include silicon (Si), antimony (Sb), tellurium (Te), and/or the like.

Non-limiting examples of the non-metal include oxygen (O), halogen (e.g., F, Cl, Br, I, and/or the like), and/or the like.

For example, the compound including elements EL1 and EL2 may include a metal oxide, a metal halide (e.g., a metal fluoride, a metal chloride, a metal bromide, a metal iodide, and/or the like), a metalloid halide (e.g., a metalloid fluoride, a metalloid chloride, a metalloid bromide, a metalloid iodide, and/or the like), a metal telluride, or any combination thereof.

Non-limiting examples of the metal oxide may include a tungsten oxide (e.g., WO, $W_2O_3$, $WO_2$, $WO_3$, $W_2O_5$, and/or the like), a vanadium oxide (e.g., VO, $V_2O_3$, $VO_2$, $V_2O_5$, and/or the like), a molybdenum oxide (MoO, $Mo_2O_3$, $MoO_2$, $MoO_3$, $Mo_2O_5$, and/or the like), a rhenium oxide (e.g., $ReO_3$, and/or the like), and/or the like.

Non-limiting examples of the metal halide include an alkali metal halide, an alkaline earth metal halide, a transition metal halide, a post-transition metal halide, a lanthanide metal halide, and/or the like.

Non-limiting examples of the alkali metal halide include LiF, NaF, KF, RbF, CsF, LiCl, NaCl, KCl, RbCl, CsCl, LiBr, NaBr, KBr, RbBr, CsBr, LiI, NaI, KI, RbI, CsI, and/or the like.

Non-limiting examples of the alkaline earth metal halide include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and/or the like.

Non-limiting examples of the transition metal halide include a titanium halide (e.g., $TiF_4$, $TiCl_4$, $TiBr_4$, $TiI_4$, and/or the like), a zirconium halide (e.g., $ZrF_4$, $ZrCl_4$, $ZrBr_4$, $ZrI_4$, and/or the like), a hafnium halide (e.g., $HfF_4$, $HfCl_4$, $HfBr_4$, $HfI_4$, and/or the like), a vanadium halide (e.g., $VF_3$, $VCl_3$, $VBr_3$, $VI_3$, and/or the like), a niobium halide (e.g., $NbF_3$, $NbCl_3$, $NbBr_3$, $NbI_3$, and/or the like), a tantalum halide (e.g., $TaF_3$, $TaCl_3$, $TaBr_3$, $TaI_3$, and/or the like), a chromium halide (e.g., $CrF_3$, $CrCl_3$, $CrBr_3$, $CrI_3$, and/or the like), a molybdenum halide (e.g., $MoF_3$, $MoCl_3$, $MoBr_3$, $MoI_3$, and/or the like), a tungsten halide (e.g., $WF_3$, $WCl_3$, $WBr_3$, $WI_3$, and/or the like), a manganese halide (e.g., $MnF_2$, $MnCl_2$, $MnBr_2$, $MnI_2$, and/or the like), a technetium halide (e.g., $TcF_2$, $TcCl_2$, $TcBr_2$, $TcI_2$, and/or the like), a rhenium halide (e.g., $ReF_2$, $ReCl_2$, $ReBr_2$, $ReI_2$, and/or the like), an iron halide (e.g., $FeF_2$, $FeCl_2$, $FeBr_2$, $FeI_2$, and/or the like), a ruthenium halide (e.g., $RuF_2$, $RuCl_2$, $RuBr_2$, $RuI_2$, and/or the like), an osmium halide (e.g., $OsF_2$, $OsCl_2$, $OsBr_2$, $OsI_2$, and/or the like), a cobalt halide (e.g., $CoF_2$, $CoCl_2$, $CoBr_2$, $CoI_2$, and/or the like), a rhodium halide (e.g., $RhF_2$, $RhCl_2$, $RhBr_2$, $RhI_2$, and/or the like), an iridium halide (e.g., IrF$_2$, IrCl$_2$, IrBr$_2$, IrI$_2$, and/or the like), a nickel halide (e.g., NiF$_2$, NiCl$_2$, NiBr$_2$, NiI$_2$, and/or the like), a palladium halide (e.g., PdF$_2$, PdCl$_2$, PdBr$_2$, PdI$_2$, and/or the like), a platinum halide (e.g., PtF$_2$, PtCl$_2$, PtBr$_2$, PtI$_2$, and/or the like), a copper halide (e.g., CuF, CuCl, CuBr, CuI, and/or the like), a silver halide (e.g., AgF, AgCl, AgBr, AgI, and/or the like), a gold halide (e.g., AuF, AuCl, AuBr, AuI, and/or the like), and/or the like.

Non-limiting examples of the post-transition metal halide include a zinc halide (e.g., ZnF$_2$, ZnCl$_2$, ZnBr$_2$, ZnI$_2$, and/or the like), an indium halide (e.g., InI$_3$ and/or the like), a tin halide (e.g., SnI$_2$ and/or the like), and/or the like.

Non-limiting examples of the lanthanide metal halide include YbF, YbF$_2$, YbF$_3$, SmF$_3$, YbCl, YbCl$_2$, YbCl$_3$, SmCl$_3$, YbBr, YbBr$_2$, YbBr$_3$, SmBr$_3$, YbI, YbI$_2$, YbI$_3$, SmI$_3$, and/or the like.

Non-limiting examples of the metalloid halide include an antimony halide (e.g., SbCl$_5$ and/or the like), and/or the like.

Non-limiting examples of the metal telluride include an alkali metal telluride (e.g., Li$_2$Te, Na$_2$Te, K$_2$Te, Rb$_2$Te, Cs$_2$Te, and/or the like), an alkaline earth metal telluride (e.g., BeTe, MgTe, CaTe, SrTe, BaTe, and/or the like), a transition metal telluride (e.g., TiTe$_2$, ZrTe$_2$, HfTe$_2$, V$_2$Te$_3$, Nb$_2$Te$_3$, Ta$_2$Te$_3$, Cr$_2$Te$_3$, Mo$_2$Te$_3$, W$_2$Te$_3$, MnTe, TcTe, ReTe, FeTe, RuTe, OsTe, CoTe, RhTe, IrTe, NiTe, PdTe, PtTe, Cu$_2$Te, CuTe, Ag$_2$Te, AgTe, Au$_2$Te, and/or the like), a post-transition metal telluride (e.g., ZnTe and/or the like), a lanthanide metal telluride (e.g., LaTe, CeTe, PrTe, NdTe, PmTe, EuTe, GdTe, TbTe, DyTe, HoTe, ErTe, TmTe, YbTe, LuTe, and/or the like), and/or the like.

Emission Layer 153

The emission layer may include a host and a dopant. The dopant may be a phosphorescent dopant, a fluorescent dopant, or any combination thereof.

The amount of the dopant in the emission layer may be in a range of about 0.01 parts to about 15 parts by weight based on 100 parts by weight of the host.

In some embodiments, the emission layer 153 may include quantum dots (e.g., a plurality of quantum dots). A thickness of the emission layer 153 including quantum dots may be in a range of about 7 nm to about 100 nm, or for example, about 15 nm to about 50 nm. When the thickness is within any of these ranges, the light-emitting device may have excellent luminescence efficiency and/or lifespan due to suitable control of pores that may be generated in the quantum dot arrangement.

The emission layer may include a delayed fluorescence material. The delayed fluorescence material may serve as a host or a dopant in the emission layer.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

When the light-emitting device is a full color light-emitting device, the emission layer 153 may be patterned into a red emission layer, a green emission layer, and/or a blue emission layer, according to a sub-pixel. In one or more embodiments, the emission layer may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may be to emit white light.

Host in Emission Layer 153

The host may include a compound represented by Formula 301: Formula 301

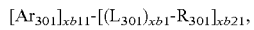

$$[Ar_{301}]_{xb11}\text{-}[(L_{301})_{xb1}\text{-}R_{301}]_{xb21},$$

wherein, in Formula 301,

Ar$_{301}$ may be selected from a substituted or unsubstituted C$_5$-C$_{60}$ carbocyclic group and a substituted or unsubstituted C$_1$-C$_{60}$ heterocyclic group, xb11 may be 1, 2, or 3, L$_{301}$ may be a substituted or unsubstituted C$_3$-C$_{10}$ cycloalkylene group, a substituted or unsubstituted C$_1$-C$_{10}$ heterocycloalkylene group, a substituted or unsubstituted C$_3$-C$_{10}$ cycloalkenylene group, a substituted or unsubstituted C$_1$-C$_{10}$ heterocycloalkenylene group, a substituted or unsubstituted C$_6$-C$_{60}$ arylene group, a substituted or unsubstituted C$_1$-C$_{60}$ heteroarylene group, a substituted or unsubstituted divalent non-aromatic condensed polycyclic group, or a substituted or unsubstituted divalent non-aromatic condensed heteropolycyclic group, xb1 may be 0, 1, 2, 3, 4, or 5, R$_{301}$ may be deuterium, —F, —Cl, —Br, —I, a hydroxyl group, a cyano group, a nitro group, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, a substituted or unsubstituted monovalent non-aromatic condensed heteropolycyclic group, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be 1, 2, 3, 4, or 5, and Q$_{301}$ to Q$_{303}$ may each independently be the same as described in connection with Q$_{11}$.

In some embodiments, when xb11 in Formula 301 is 2 or greater, the at least two Ar$_{301}$(S) may be bound via a single bond.

In some embodiments, the host may include a compound represented by Formula 301-1, a compound represented by Formula 301-2, or any combination thereof:

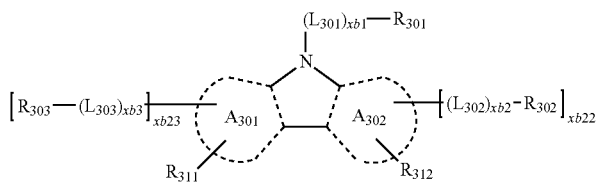

Formula 301-1

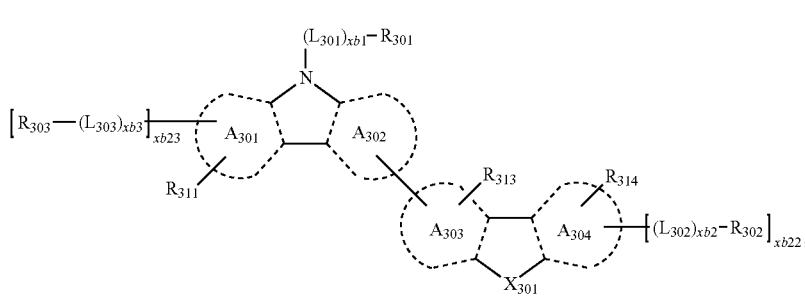

Formula 301-2 wherein, in Formulae 301-1 and 301-2, ring $A_{301}$ to ring $A_{304}$ may each independently be a $C_5$-$C_{60}$ carbocyclic group or a $C_1$-$C_{60}$ heterocyclic group, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each independently be the same as described above, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In some embodiments, the host may include an alkaline earth metal complex. For example, the host may include a Be complex (e.g., Compound H55) or a Mg complex. In some embodiments, the host may be a Zn complex, or any combination thereof.

$Ar_{301}$ and $L_{301}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($O_{301}$)($O_{302}$)($O_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$).

xb21 may be an integer from 1 to 5, and $Q_{301}$ to $Q_{303}$ may each independently be the same as described in connection with $Q_{11}$.

In some embodiments, when xb11 in Formula 301 is 2 or greater, the at least two $Ar_{301}$(S) may be bound via a single bond.

In some embodiments, the host may include a compound represented by Formula 301-1, a compound represented by Formula 301-2, or any combination thereof:

Formula 301-1

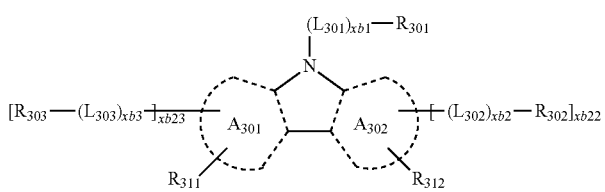

Formula 301-2

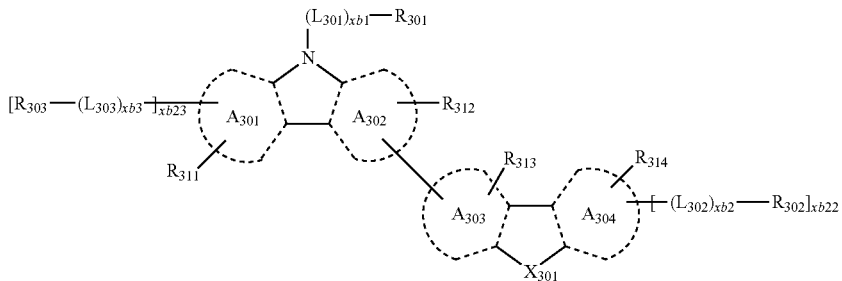

wherein, in Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, C($R_{304}$)($R_{305}$), or Si($R_{304}$)($R_{305}$), xb22 and xb23 may each independently be 0, 1, or 2, $L_{301}$, xb1, and $R_{301}$ may each independently be the same as described above, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may independently be the same as described in connection with $R_{301}$.

In some embodiments, the host may include an alkaline earth metal complex. For example, the host may include a Be complex (e.g., Compound H55) or a Mg complex. In some embodiments, the host may be a Zn complex, or any combination thereof.

In some embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl benzene (mCP), 1,3,5-tri(carbazol-9-yl)benzene (TCP), or any combination thereof:

H1

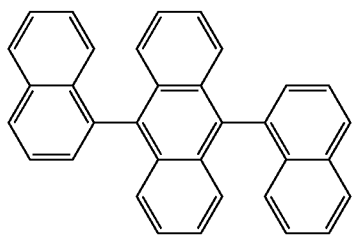

H2

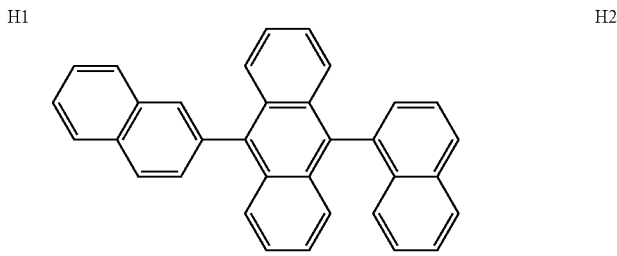

H3

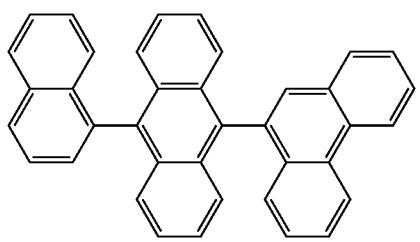

H4

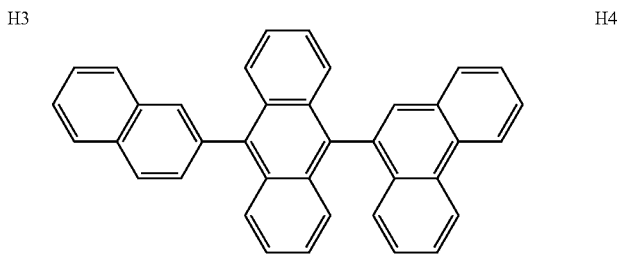

H5

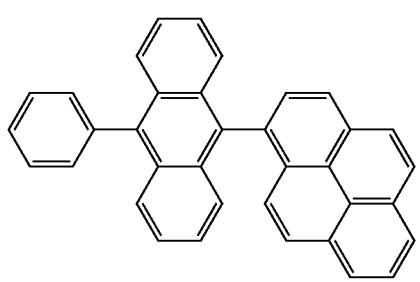

H6

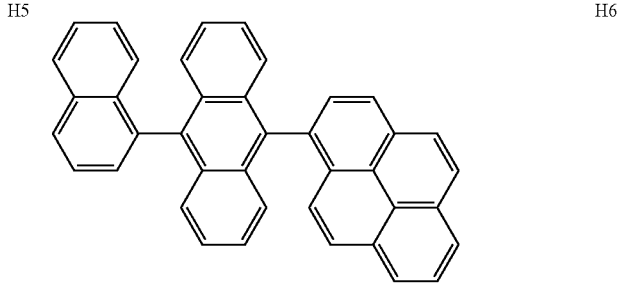

-continued
H7
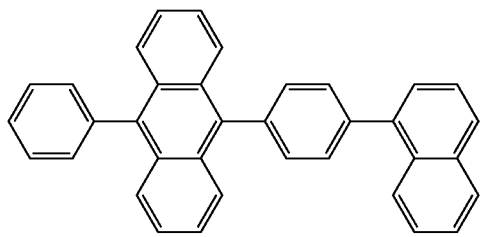
H8
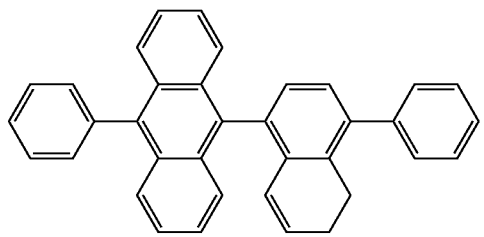
H9
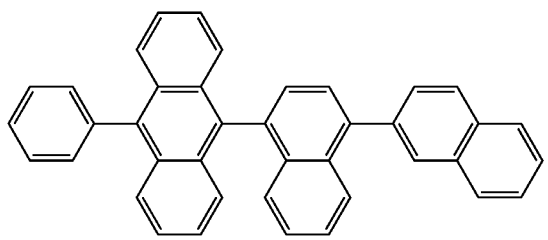
H10
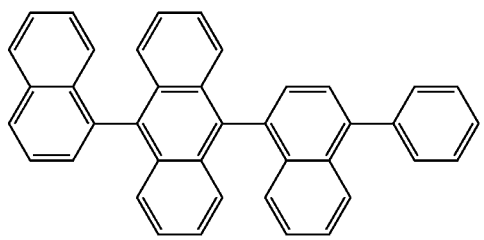
H11
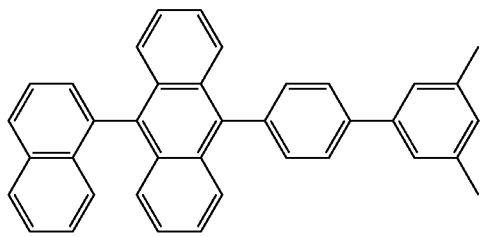
H12
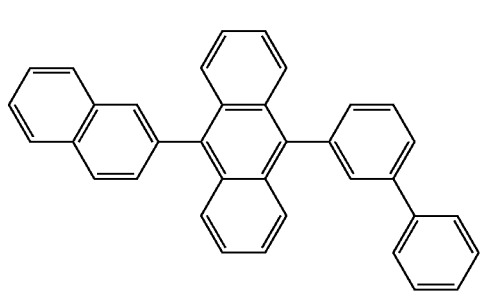
H13
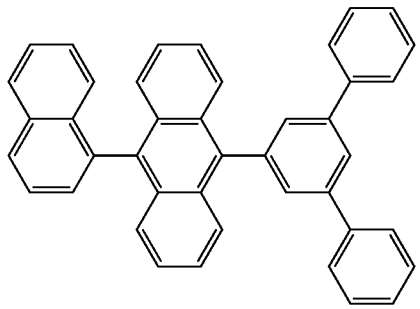
H14
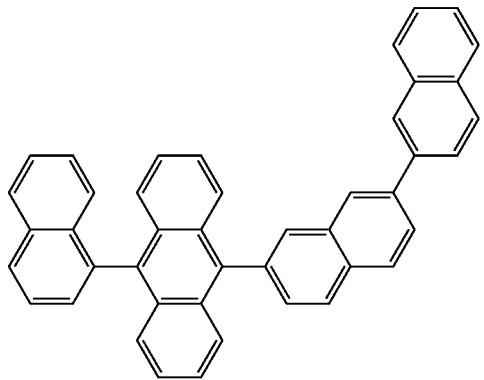
H15
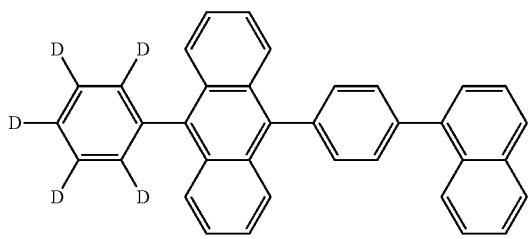
H16
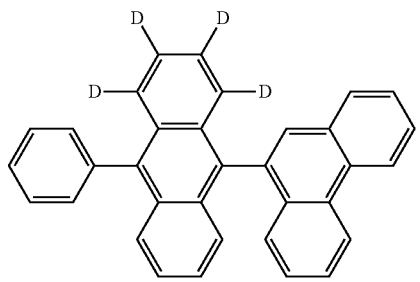

-continued
H17
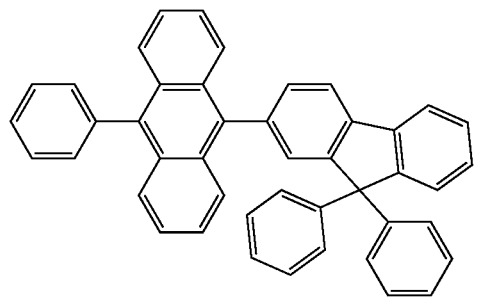
H18
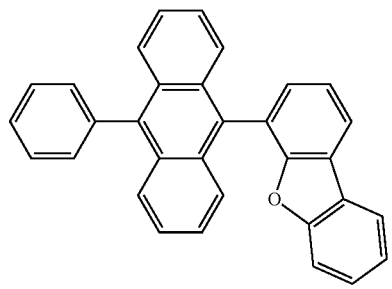
H19
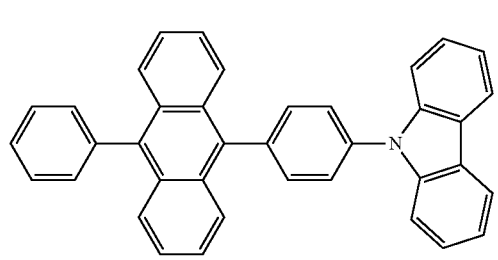
H20
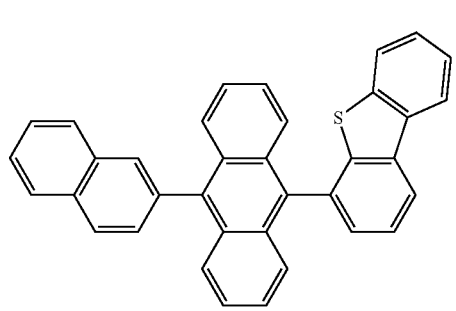
H21
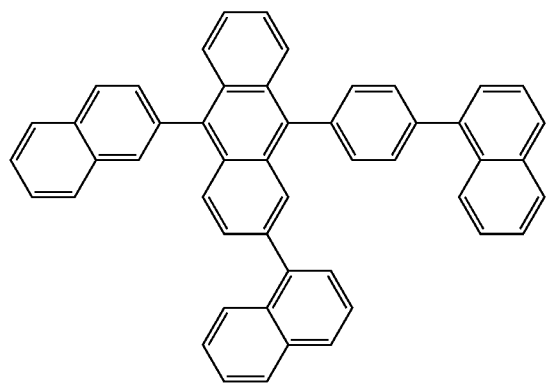
H22
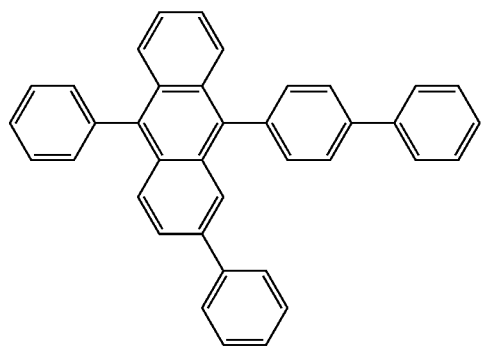
H23
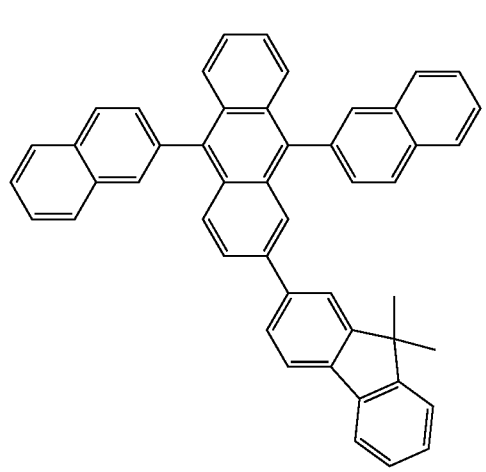
H24
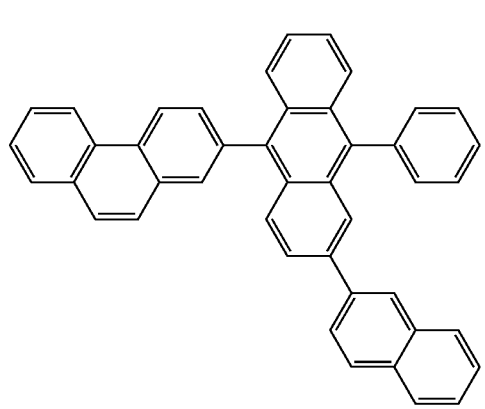

-continued
H25
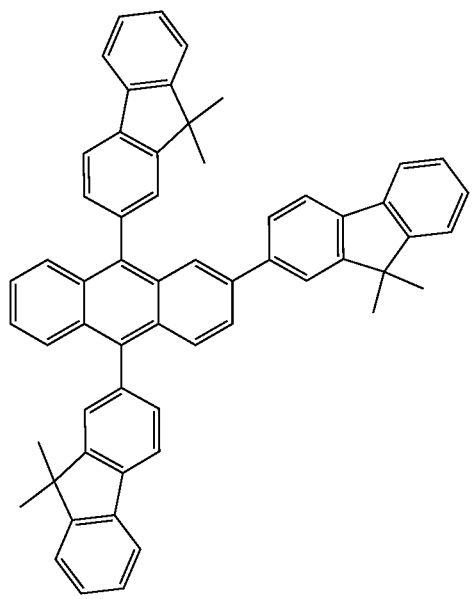
H26
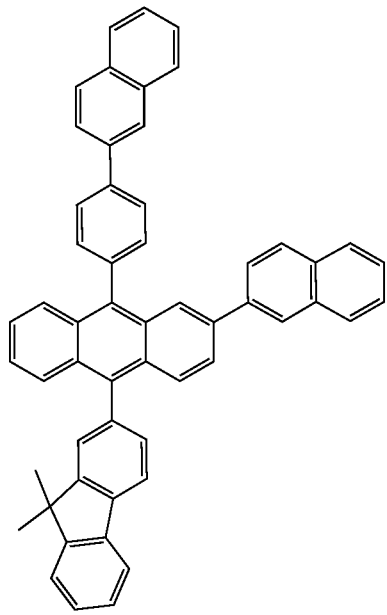
H27
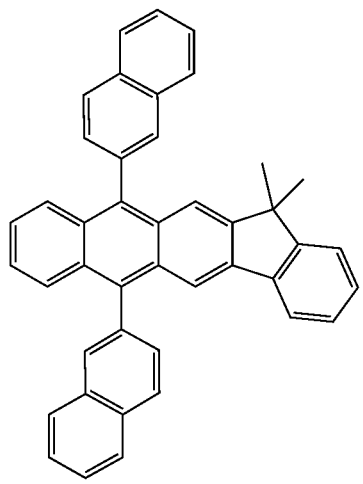
H28
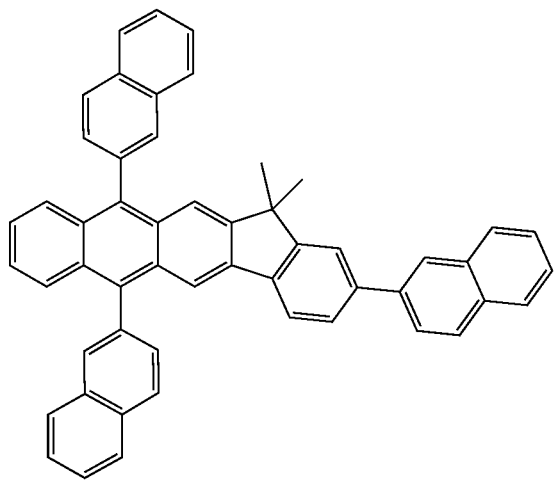
H29
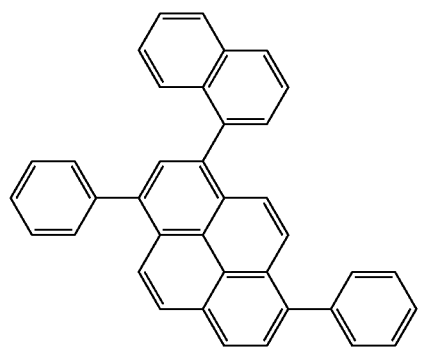
H30
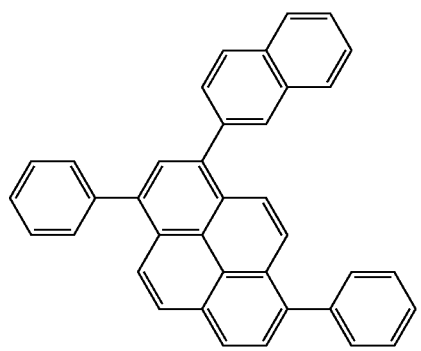

-continued
H31
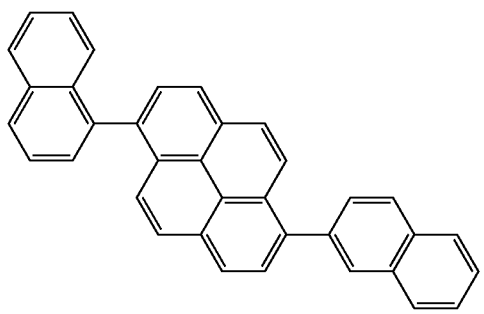
H32
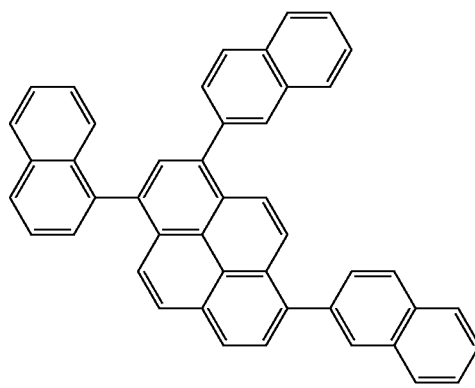
H33
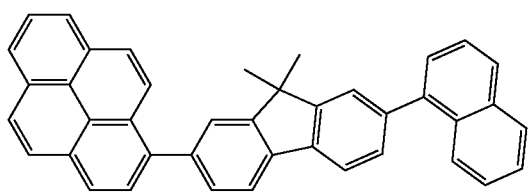
H34
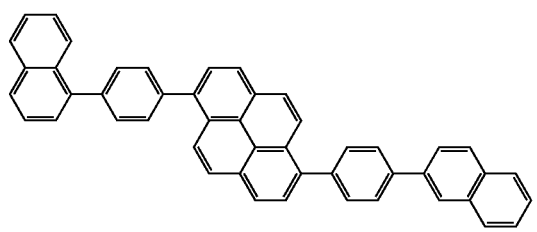
H35
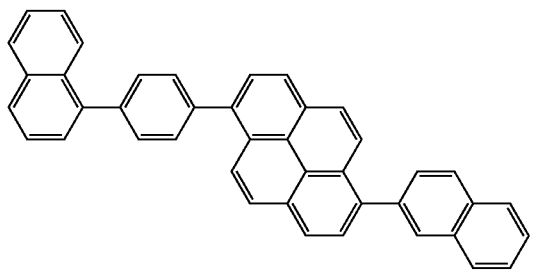
H36
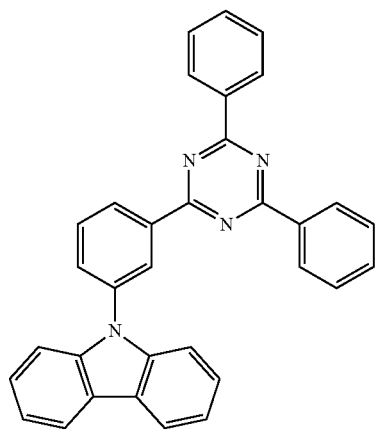
H37
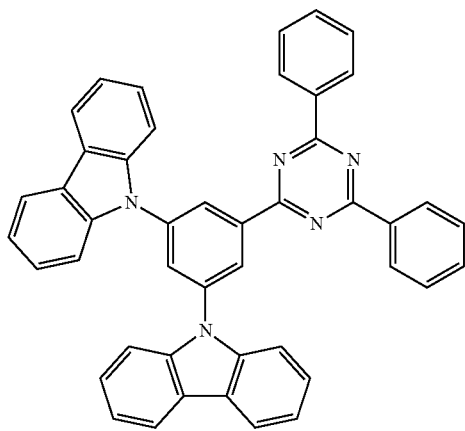
H38
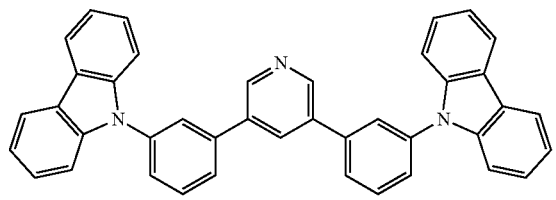

-continued
H39
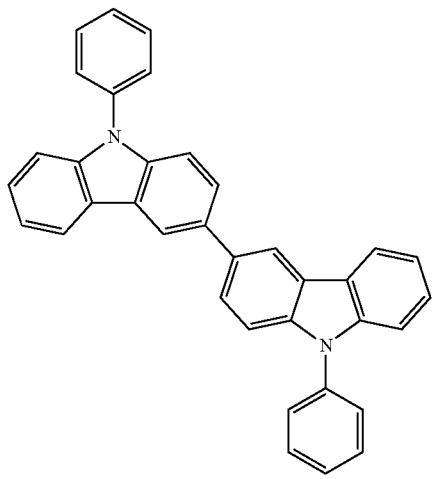
H40
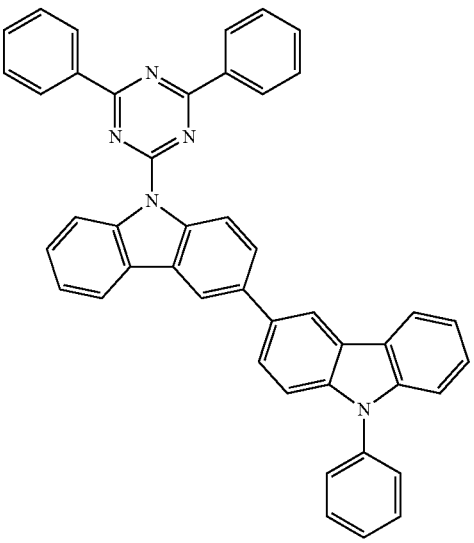
H41
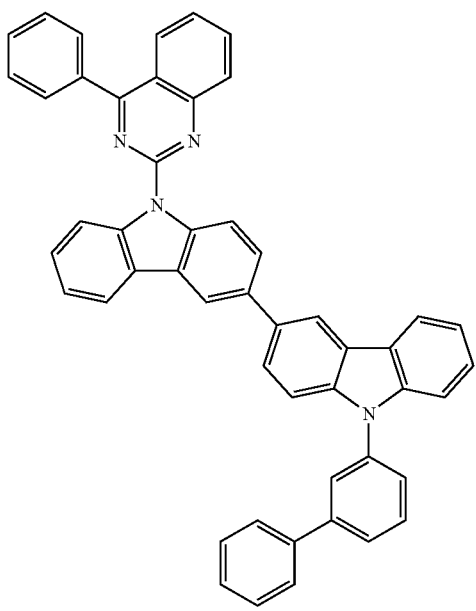
H42
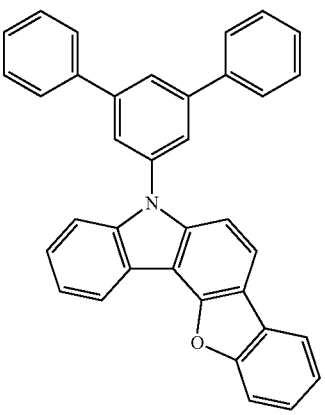
H43
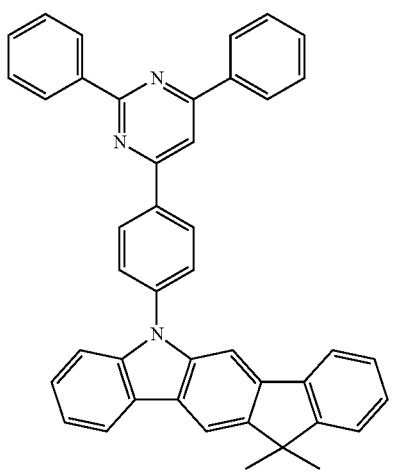
H44
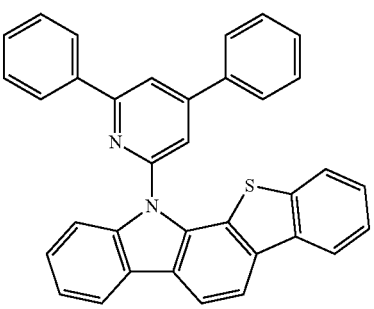

-continued
H45
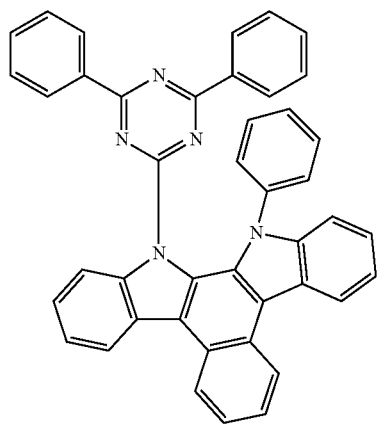
H46
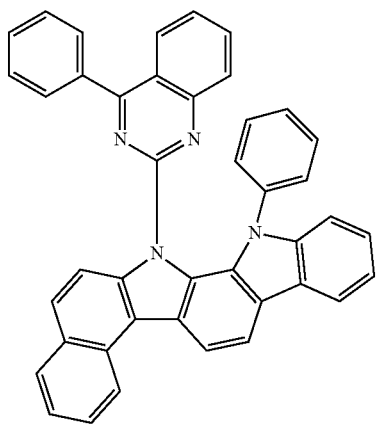
H47
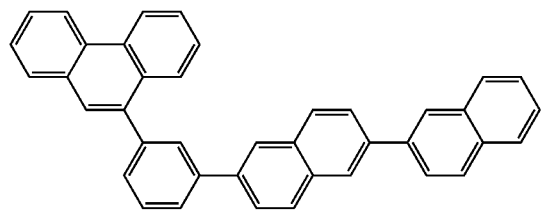
H48
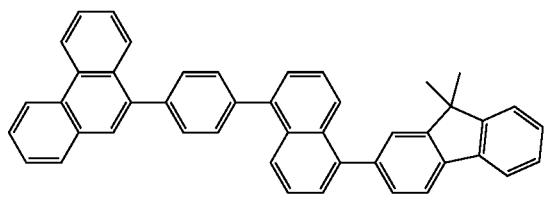
H49
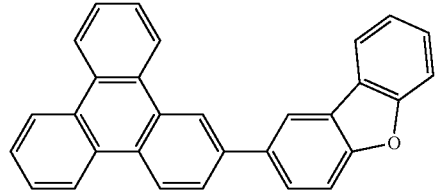
H50
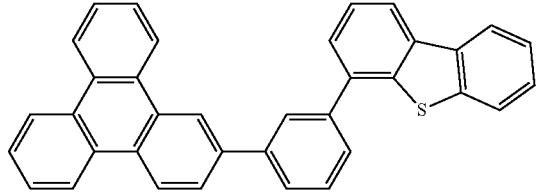
H51
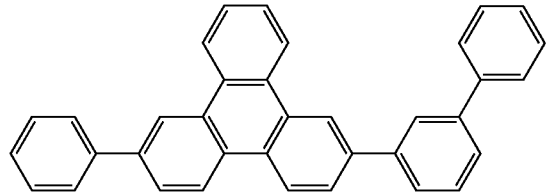
H52
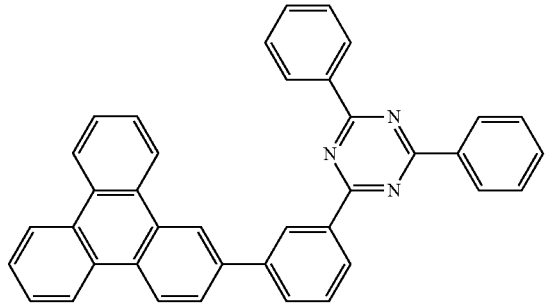
H53
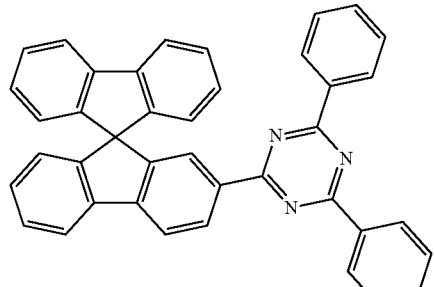
H54
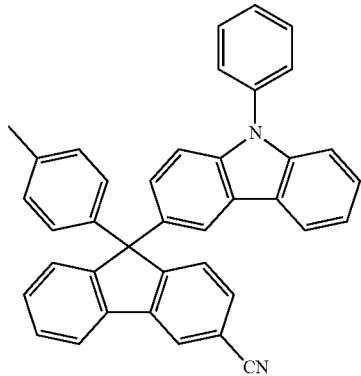

-continued
H55
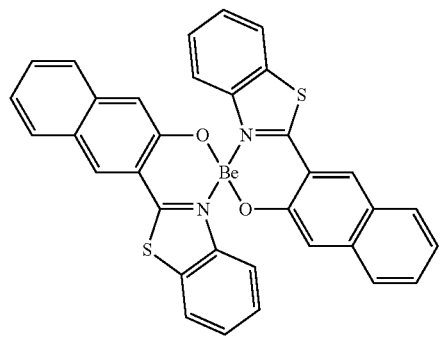
H56
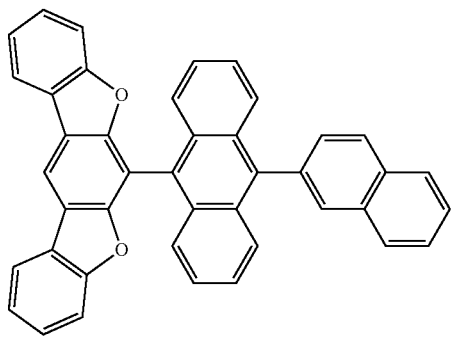
H57
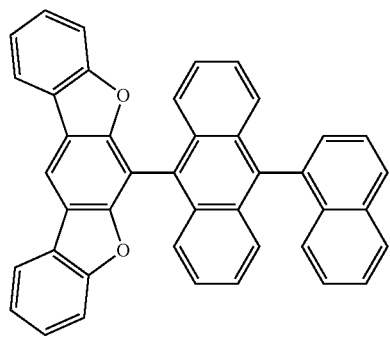
H58
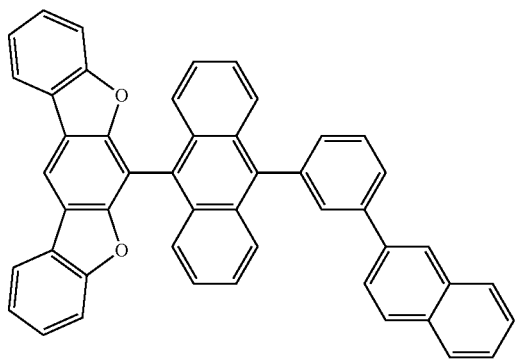
H59
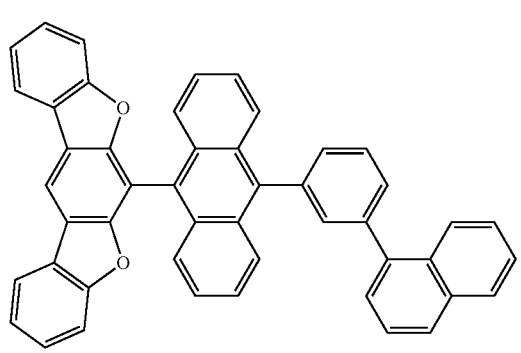
H60
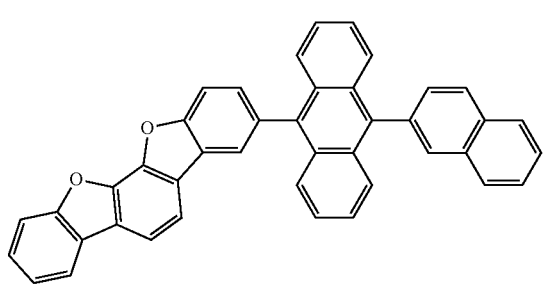
H61
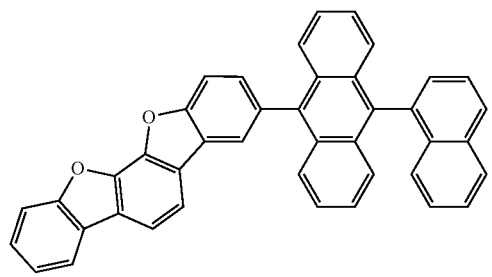
H62
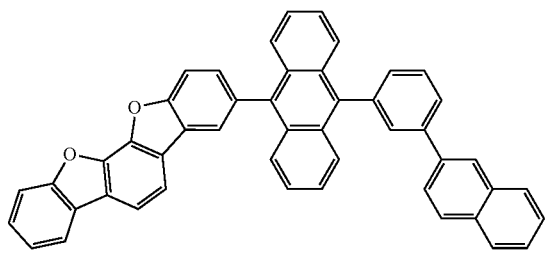

-continued
H63
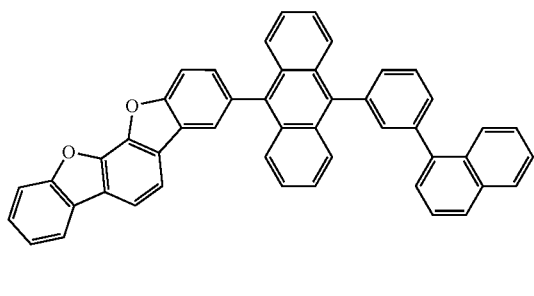
H64
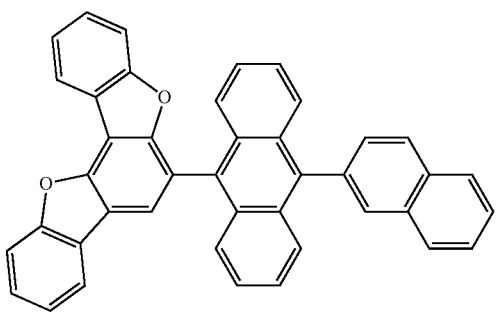
H65
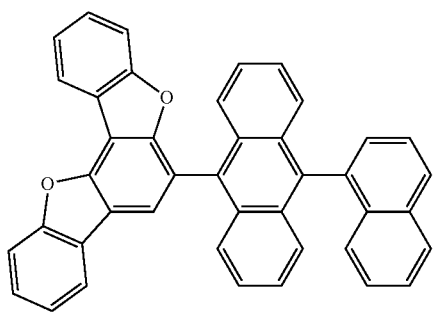
H66
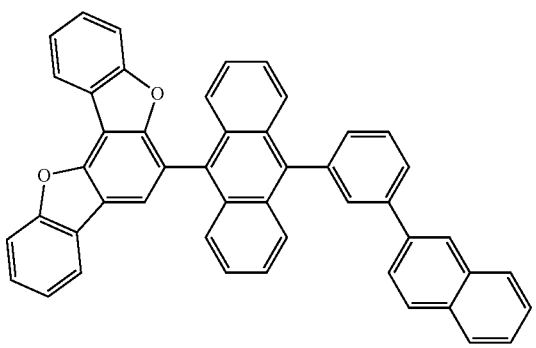
H67
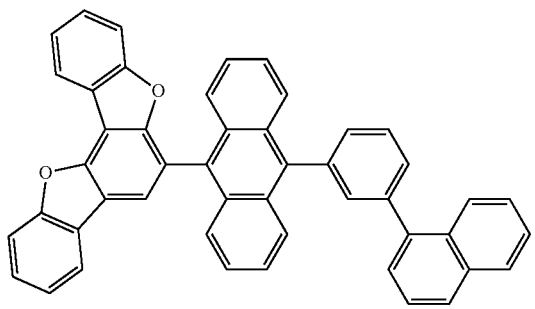
H68
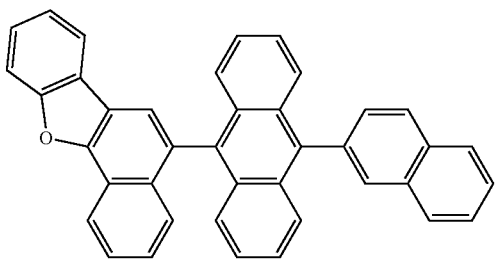
H69
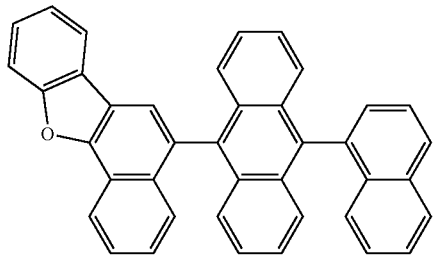
H70
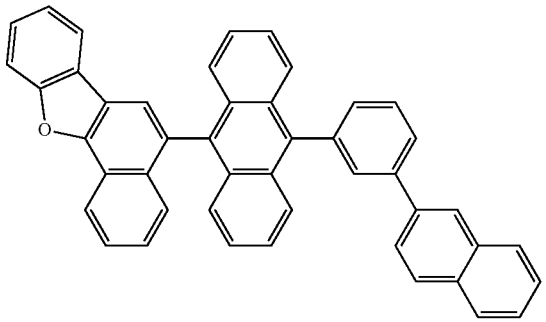

-continued
H71
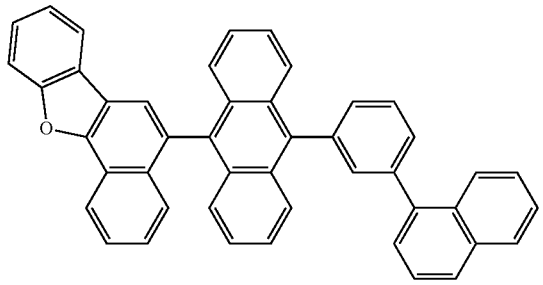
H72
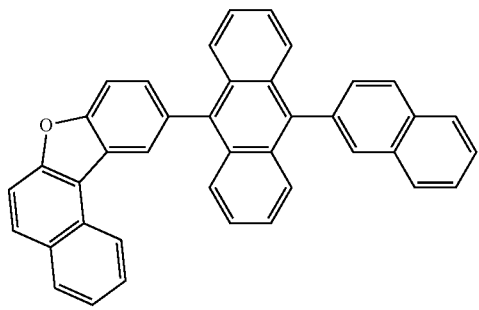
H73
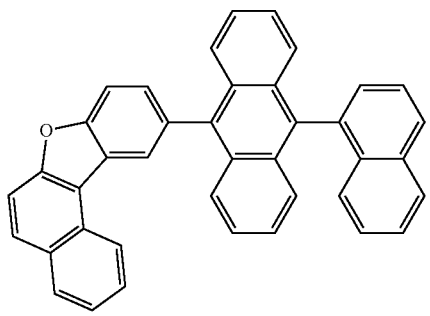
H74
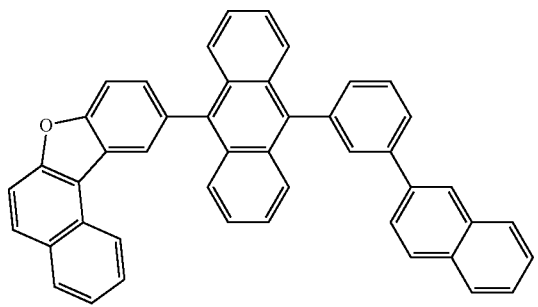
H75
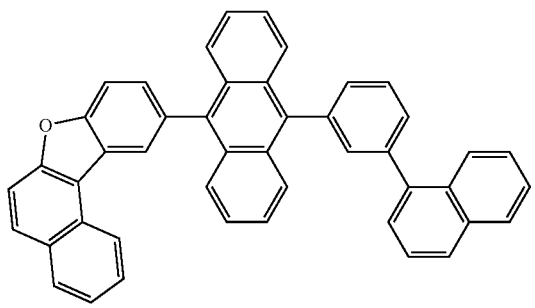
H76
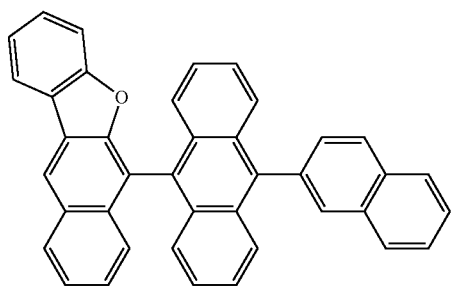
H77
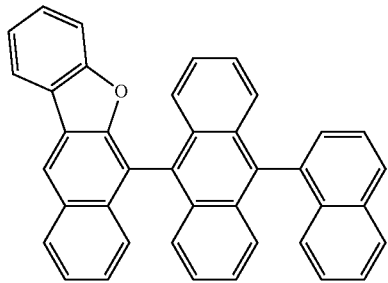
H78
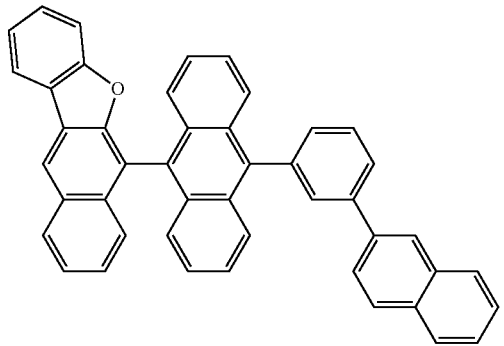

-continued
H79
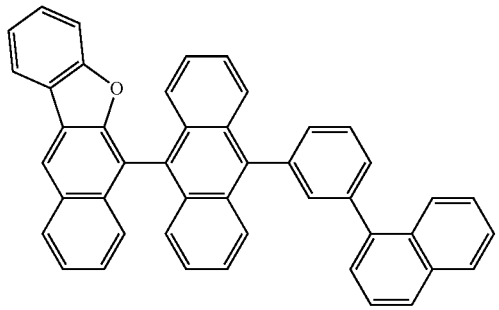
H80
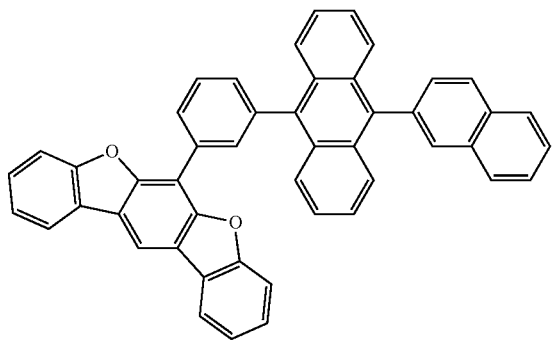
H81
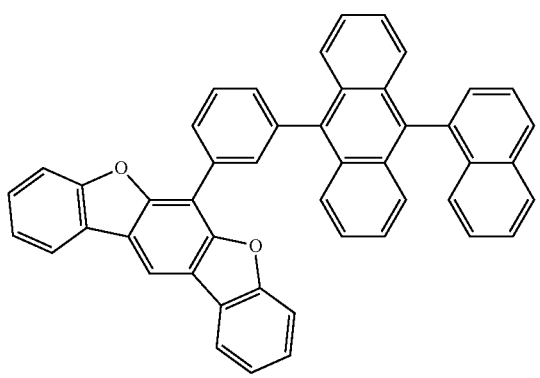
H82
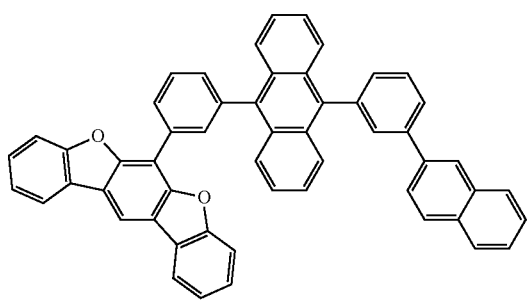
H83
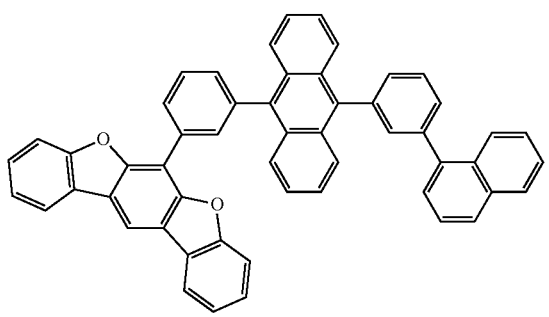
H84
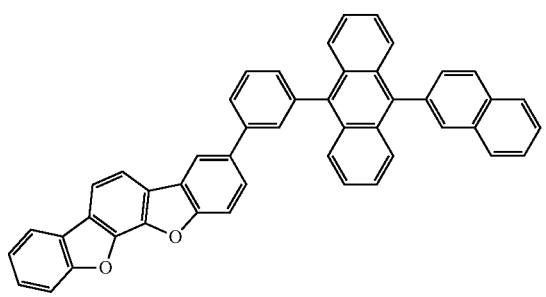
H85
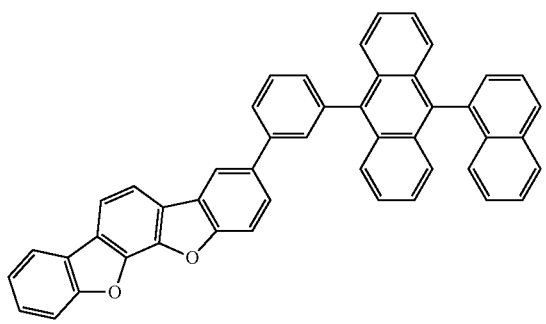
H86
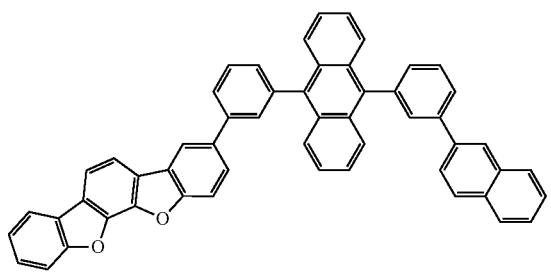

-continued
H87
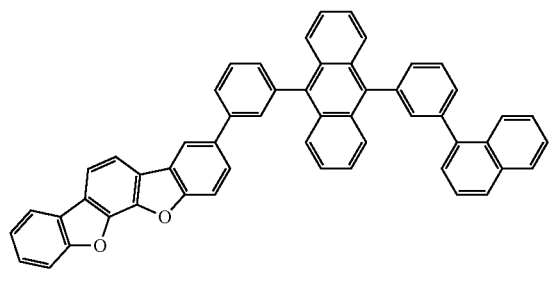
H88
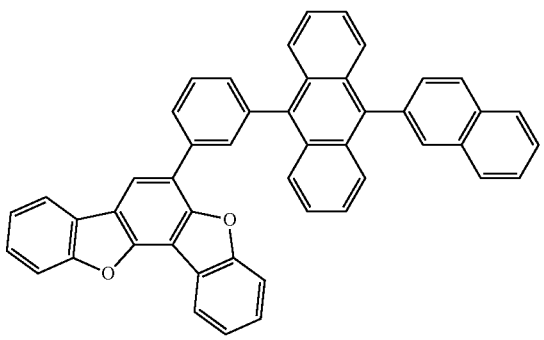
H89
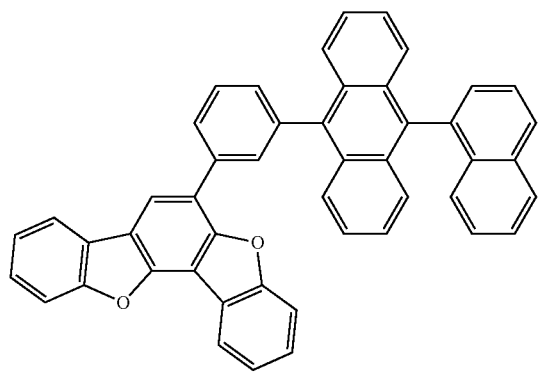
H90
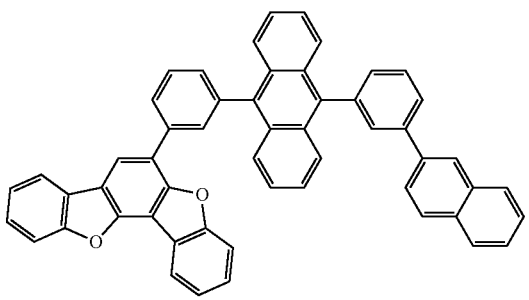
H91
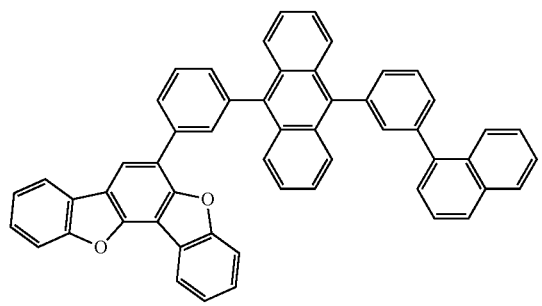
H92
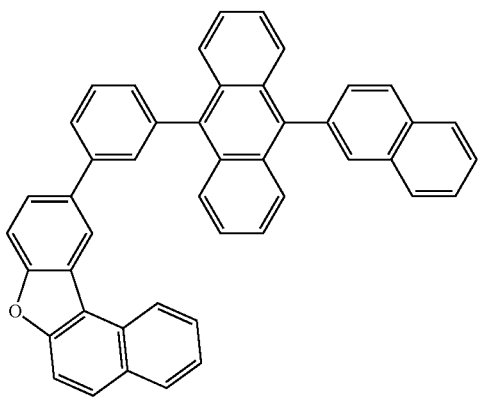
H93
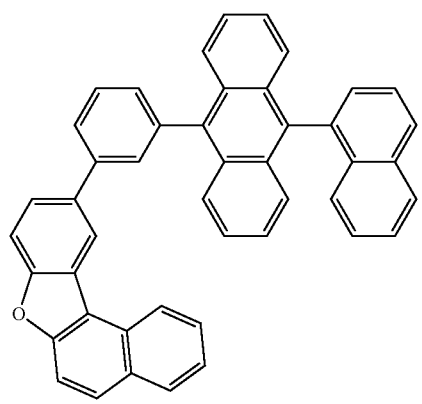
H94
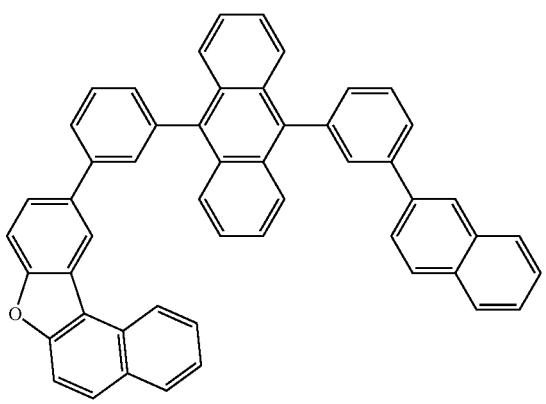

-continued
H95
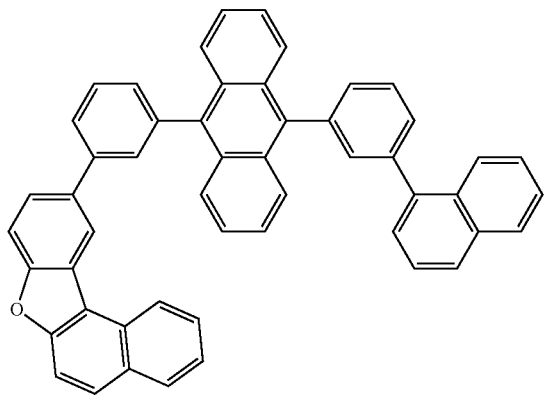
H96
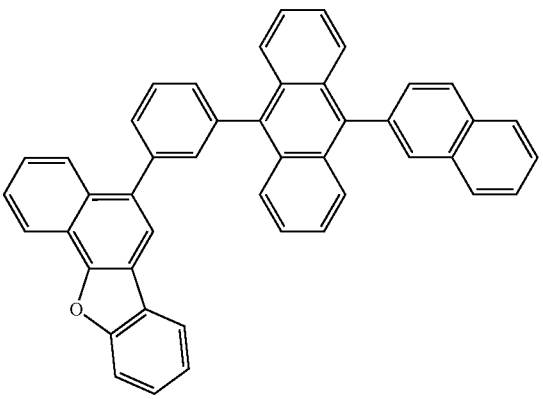
H97
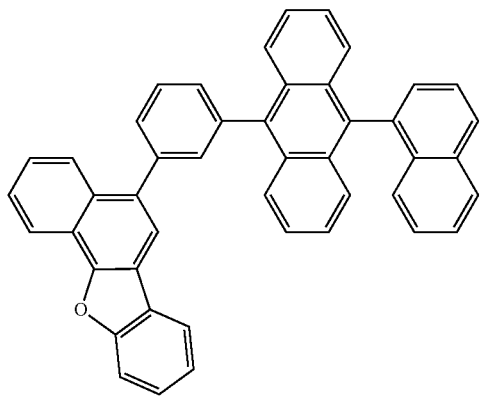
H98
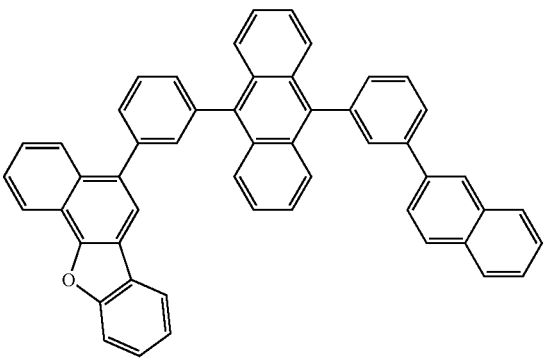
H99
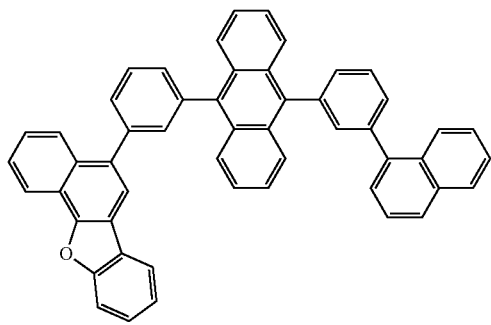
H100
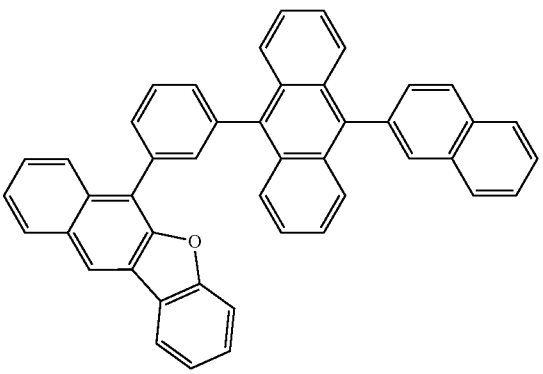
H101
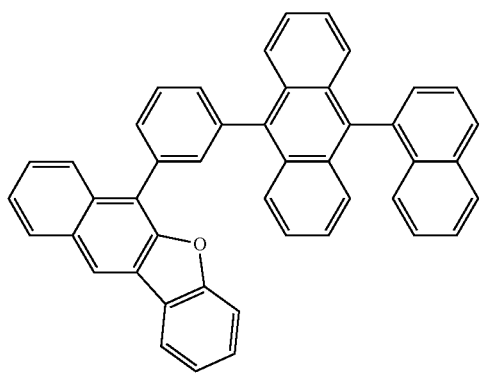
H102
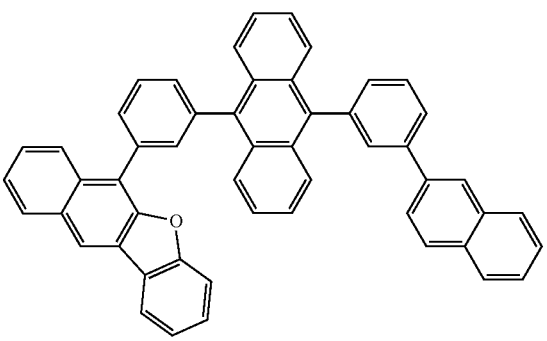

-continued
H103
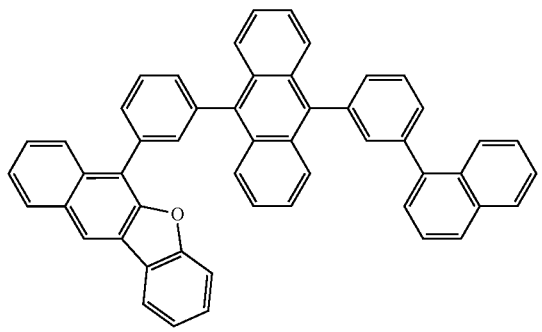
H104
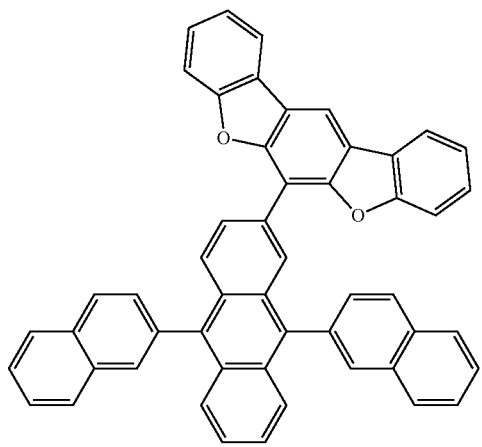
H105
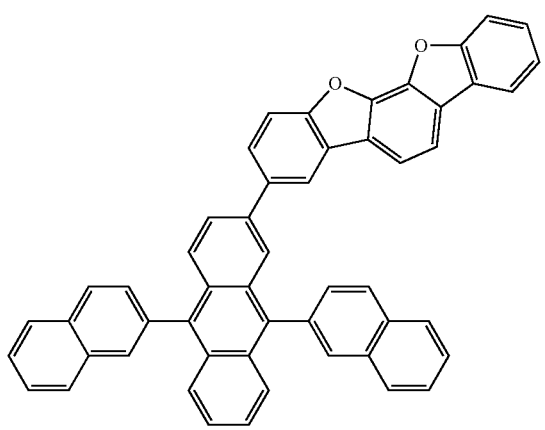
H106
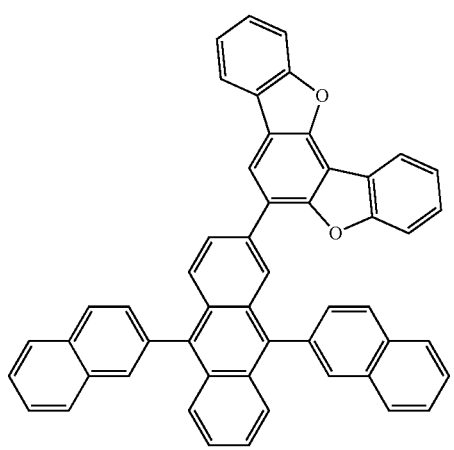
H107
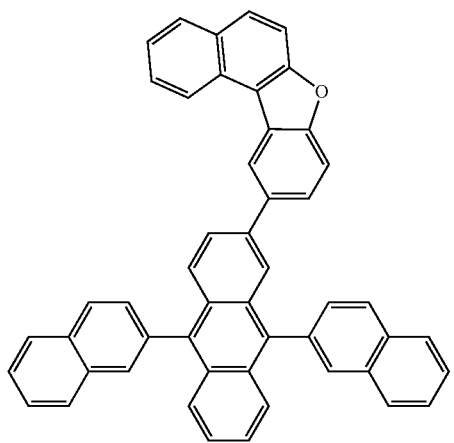
H108
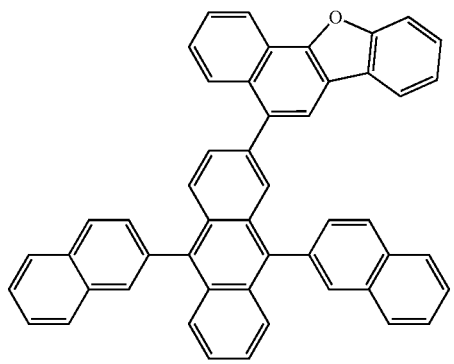

-continued
H109
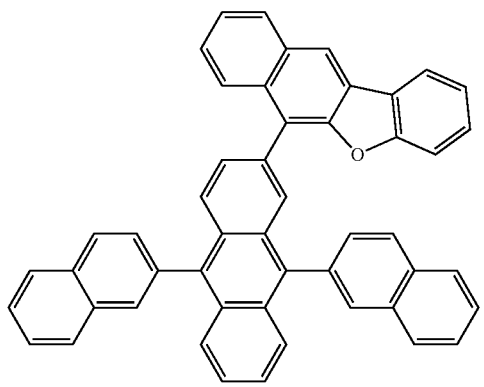
H110
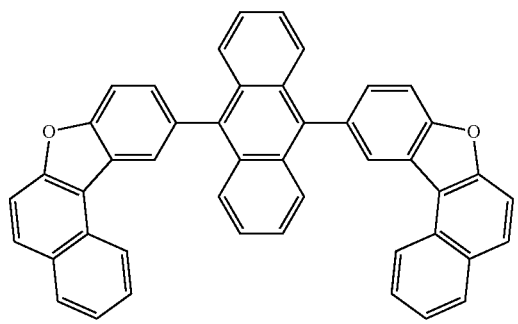
H111
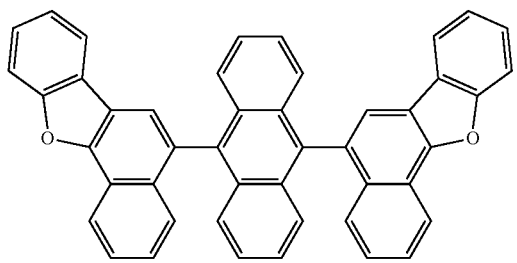
H112
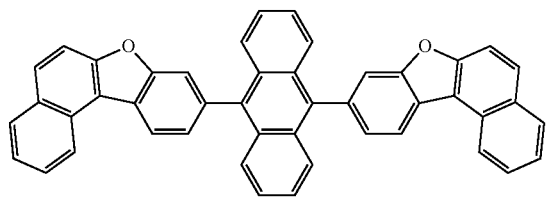
H113
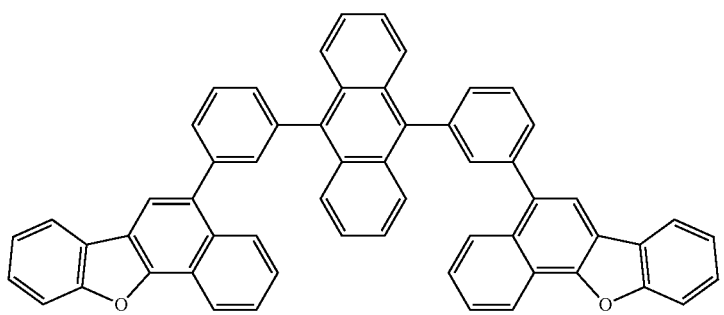
H114
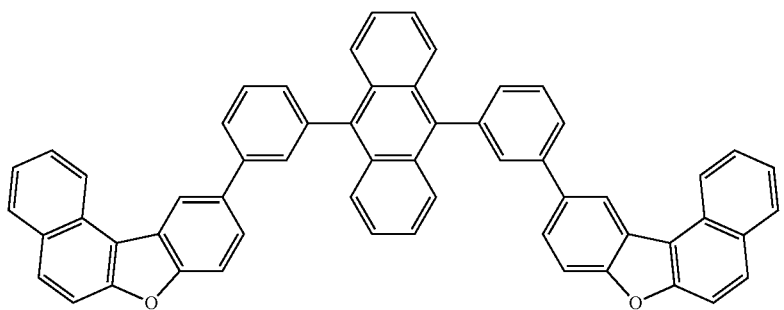

-continued
H115
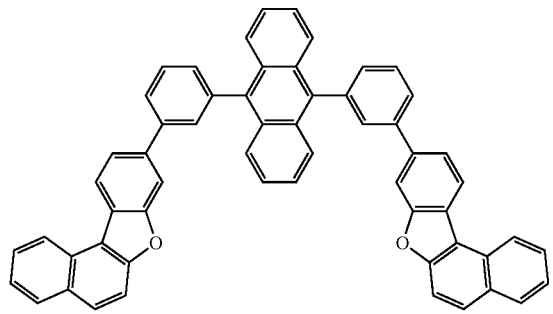
H116
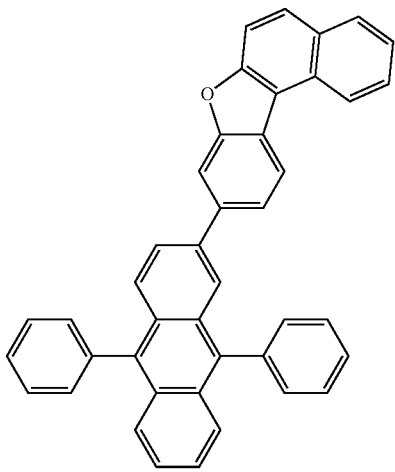
H117
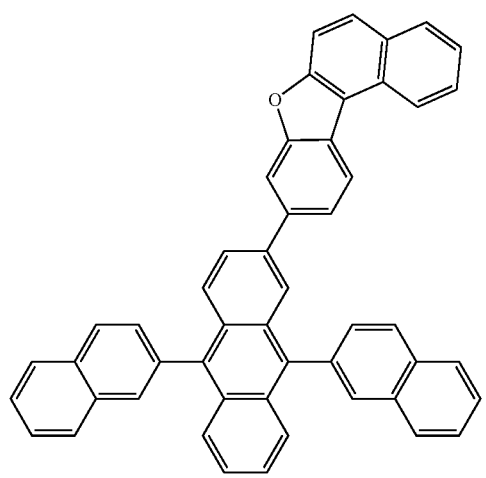
H118
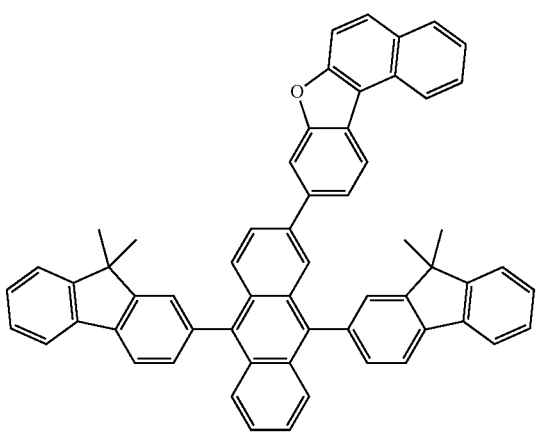
H119
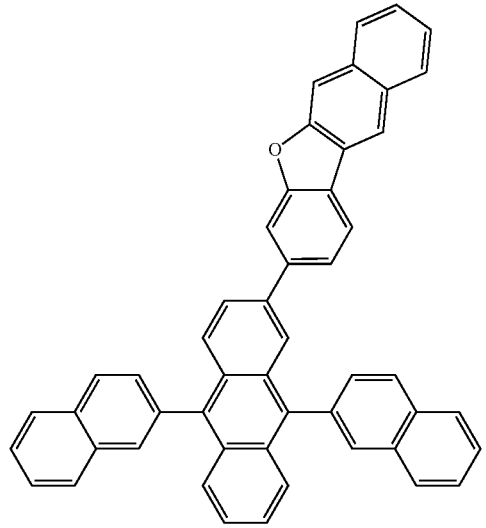
H120
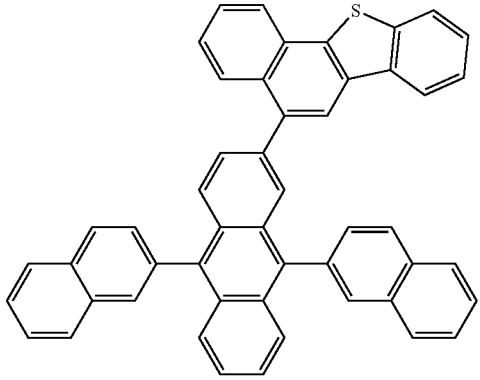

H121

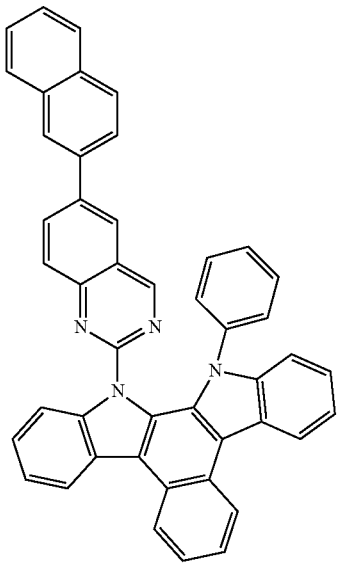

H122

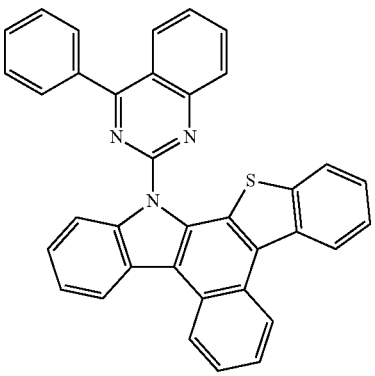

H123

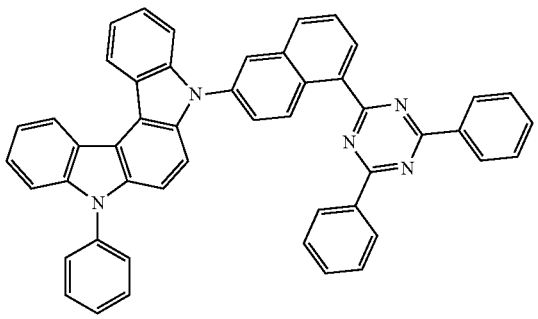

H124

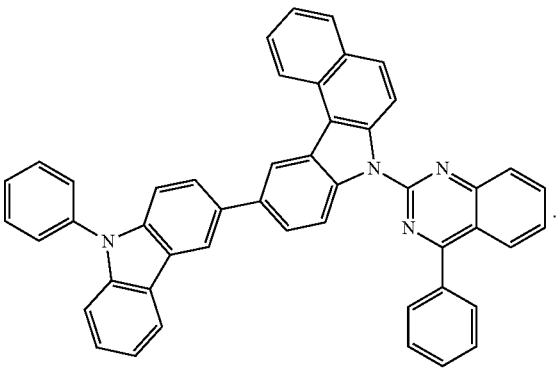

Phosphorescent Dopant in Emission Layer 153

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In some embodiments, the phosphorescent dopant may include an organometallic complex represented by Formula 401:

Formula 401

$M(L_{401})_{xc1}(L_{402})_{xc2}$

Formula 402

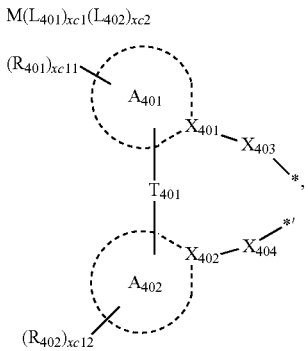

wherein, in Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)*', *—C($Q_{411}$)($Q_{412}$)*', *—C($Q_{411}$)=C($Q_{412}$)-*', *—C($Q_{411}$)=*', or *=C=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_{11}$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_{11}$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) $X_{401}$ and $X_{402}$ may both (e.g., simultaneously) be nitrogen.

In one or more embodiments, when xc1 in Formula 401 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each independently be the same as described in connection with $T_{401}$.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group).

The phosphorescent dopant may be, for example, one of Compounds PD1 to PD25 or any combination thereof:

PD1

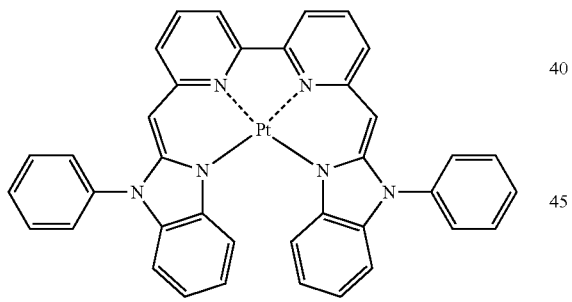

PD2

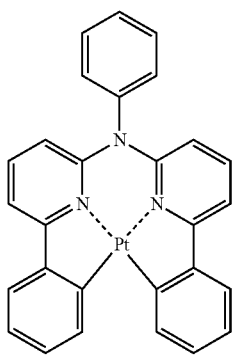

PD3

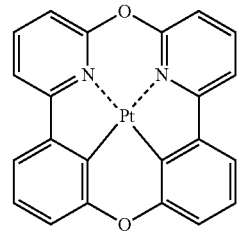

PD4

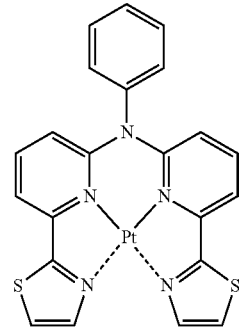

PD5

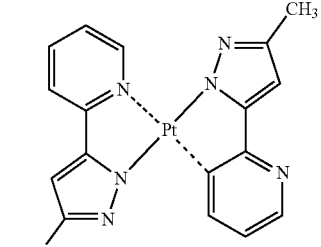

PD6

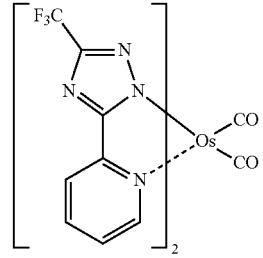

PD7

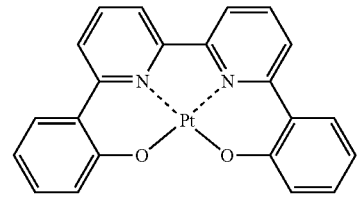

PD8

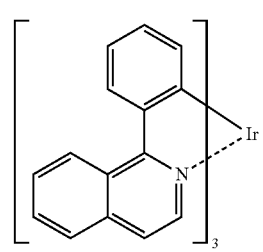

PD9 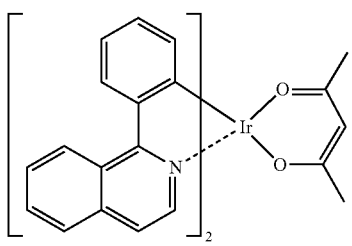
PD10 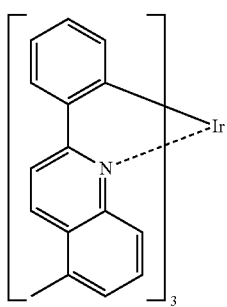
PD11 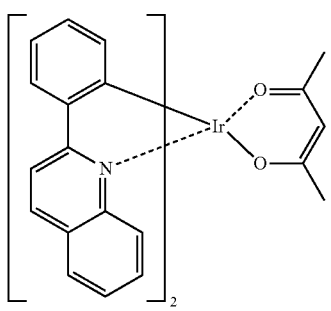
PD12 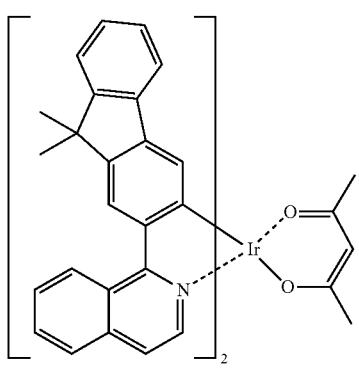
PD13 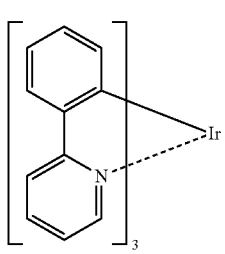
PD14 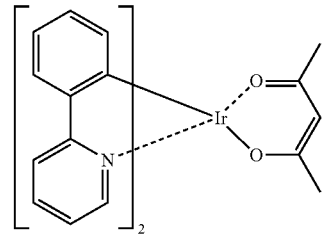
PD15 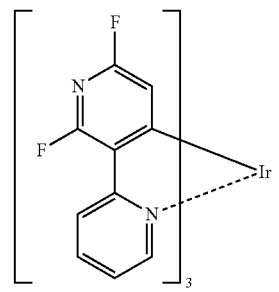
PD16 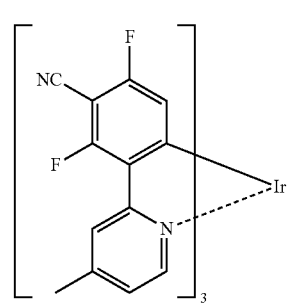
PD17 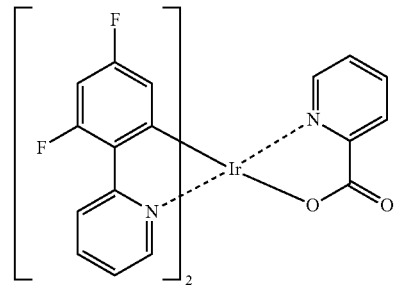
PD18 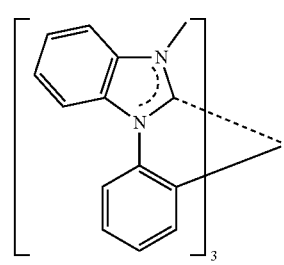

-continued

PD19 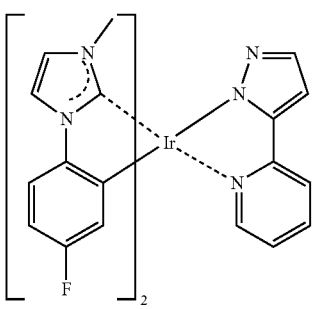

PD20 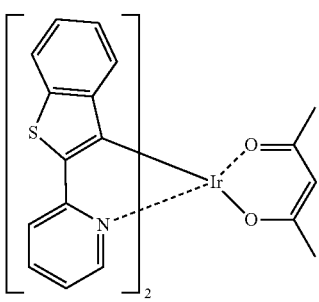

PD21 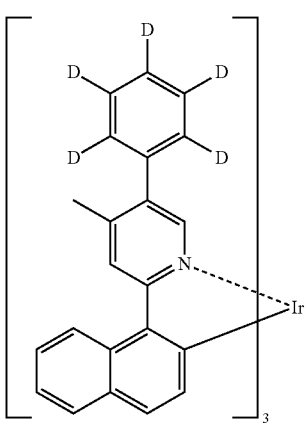

PD22 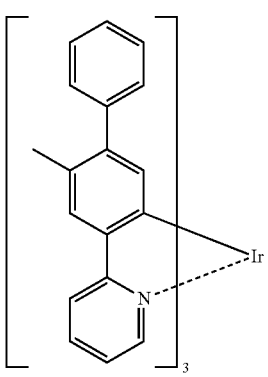

-continued

PD23 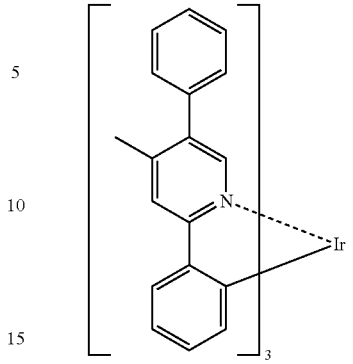

PD24 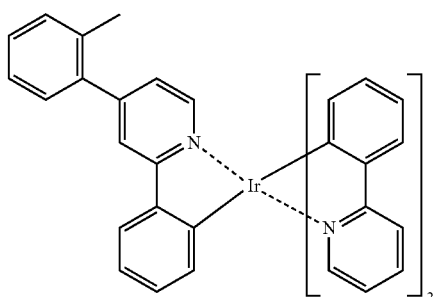

PD25 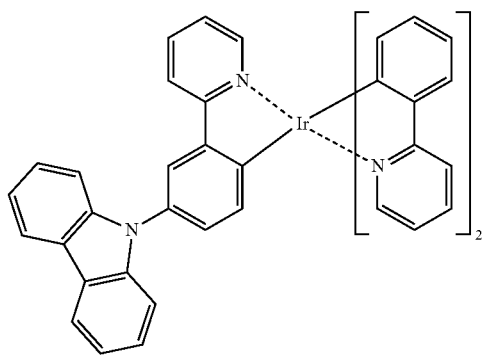

Fluorescent Dopant in Emission Layer 153

The fluorescent dopant may include an amine group-containing compound, a styryl group-containing compound, or any combination thereof.

In some embodiments, the fluorescent dopant may include a compound represented by Formula 501:

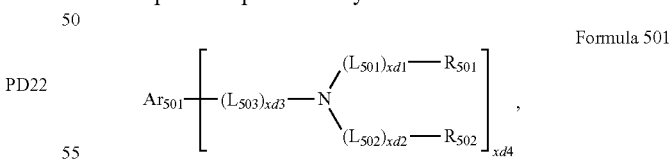

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, $Ar_{501}$ may include a condensed ring group (e.g., an anthracene group, a chrysene group, or a pyrene group) in which at least three monocyclic groups are condensed.

In some embodiments, xd4 in Formula 501 may be 2.
In some embodiments, the fluorescent dopant may include one of Compounds FD1 to FD36, DPVBi, DPAVBi, or any combination thereof:
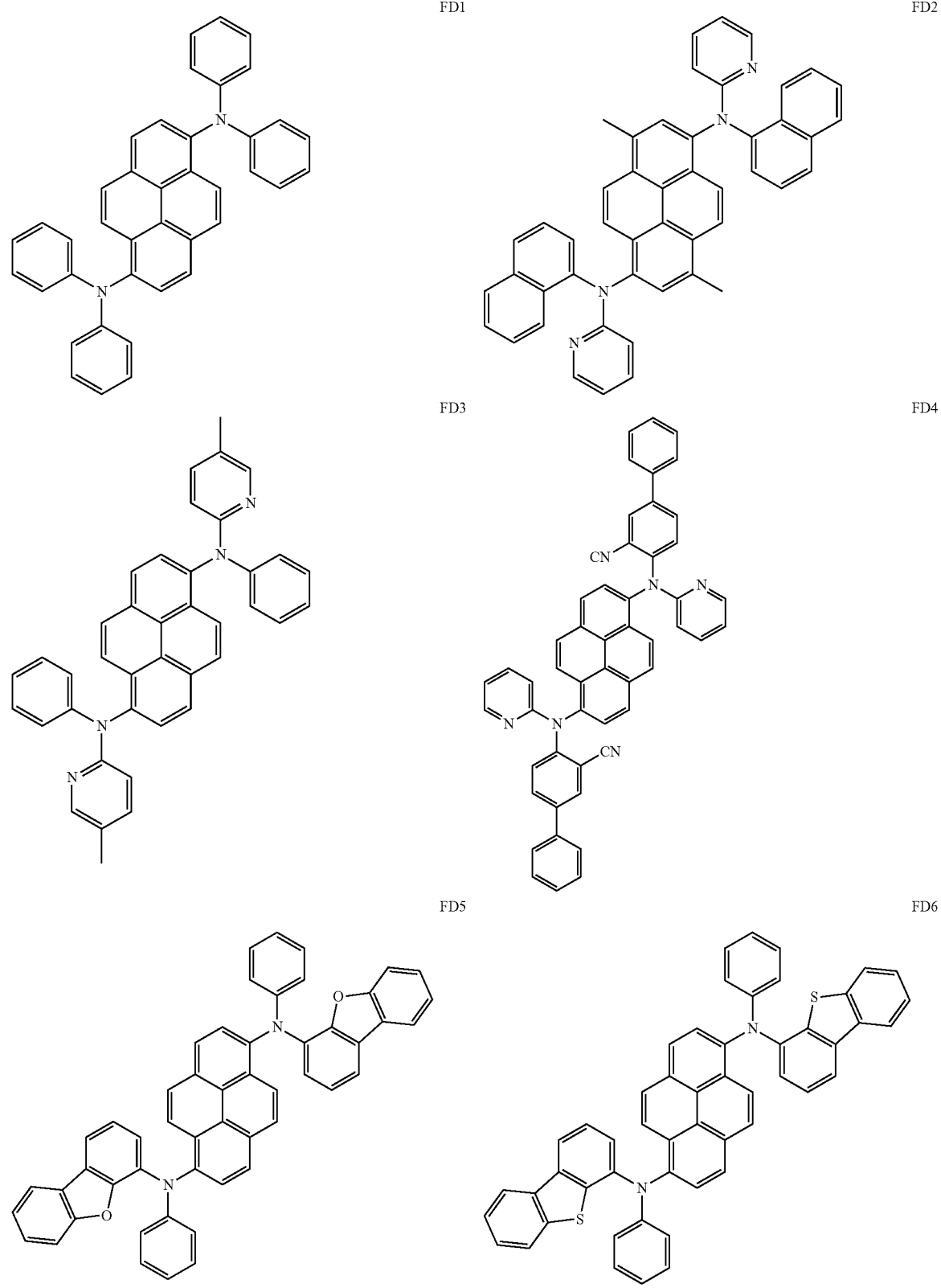

-continued
FD7
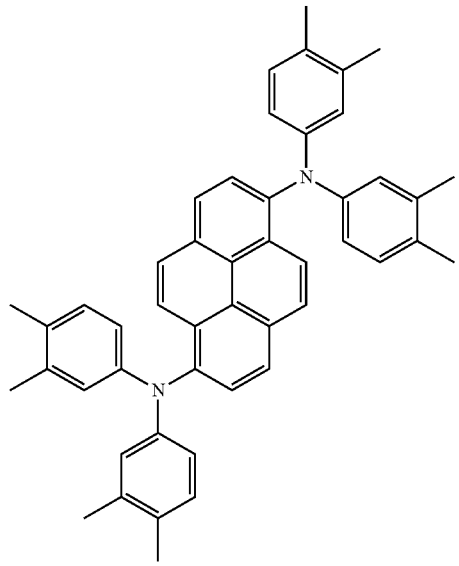
FD8
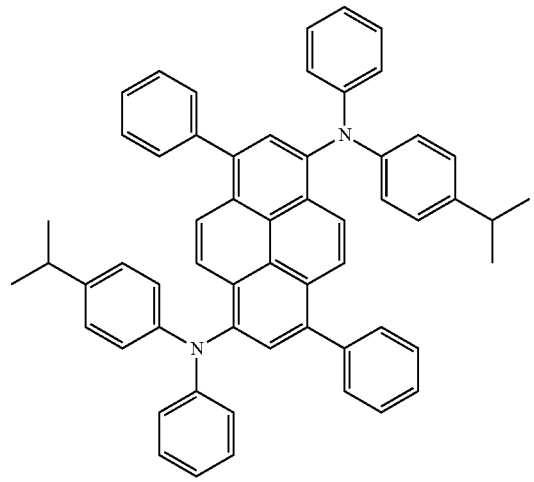
FD9
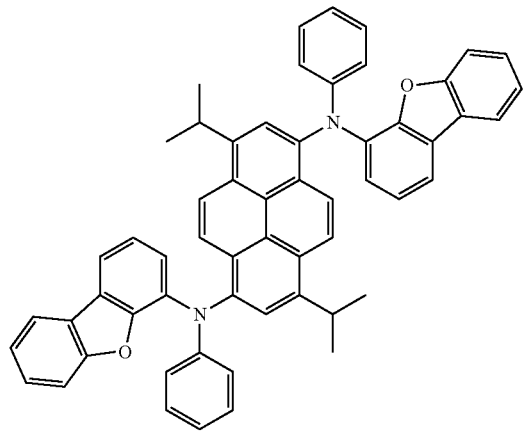
FD10
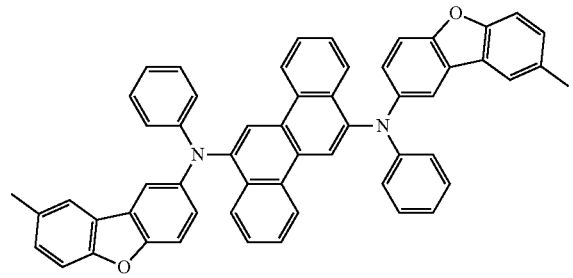
FD11
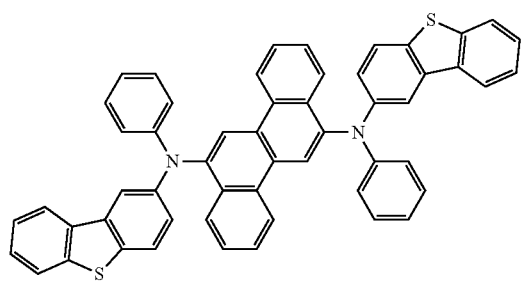
FD12
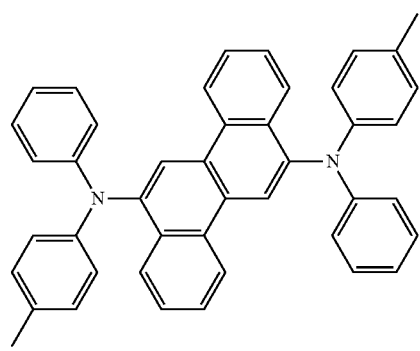

-continued
FD13
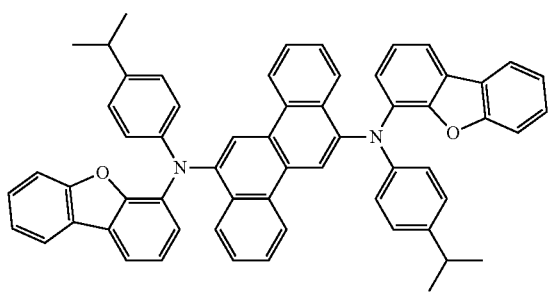
FD14
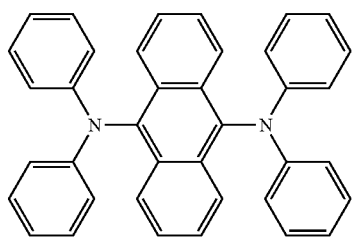
FD15
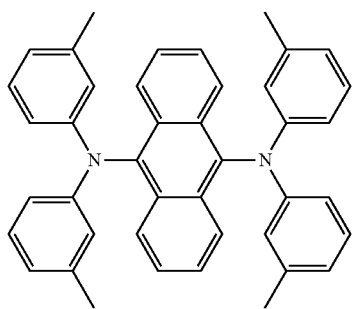
FD16
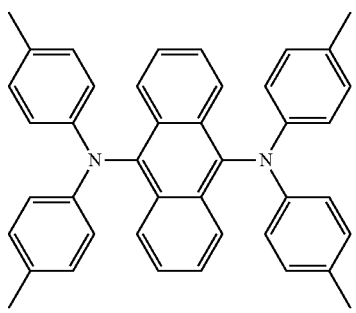
FD17
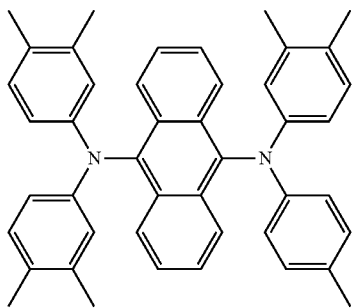
FD18
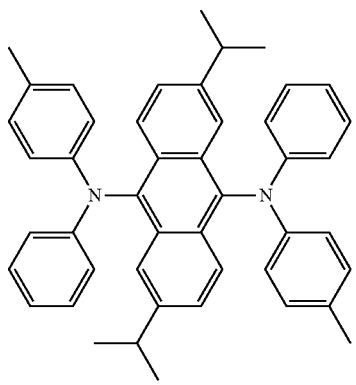
FD19
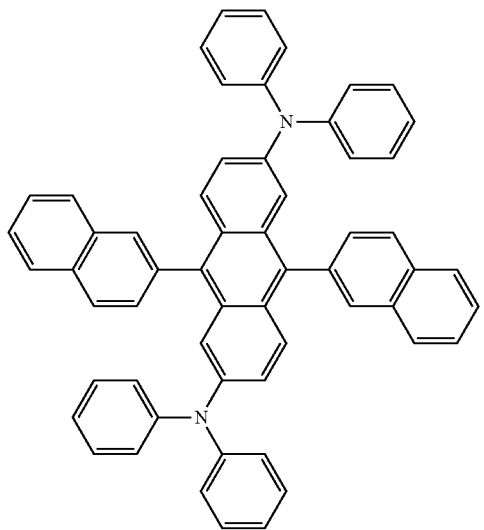
FD20
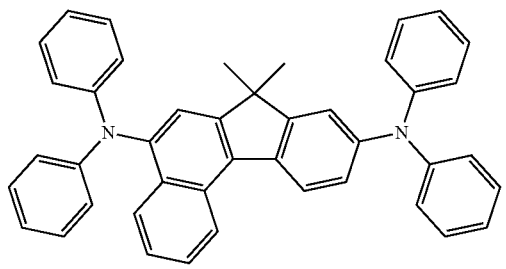

-continued
FD21
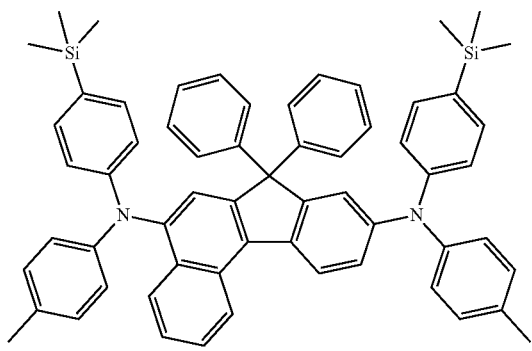
FD22
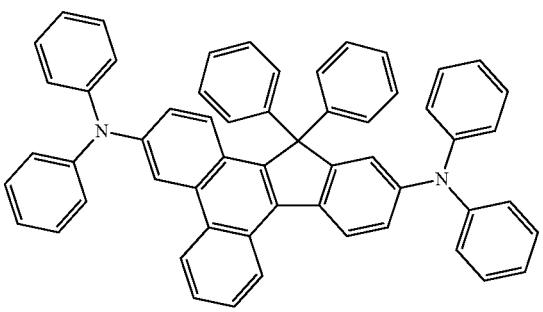
FD23
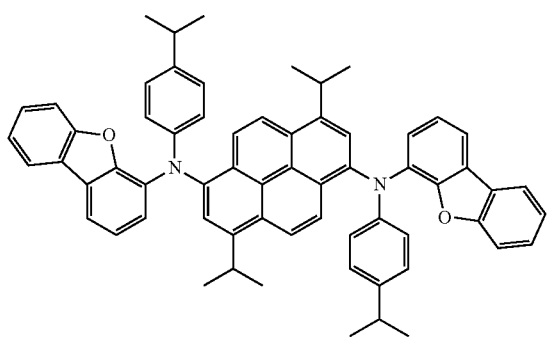
FD24
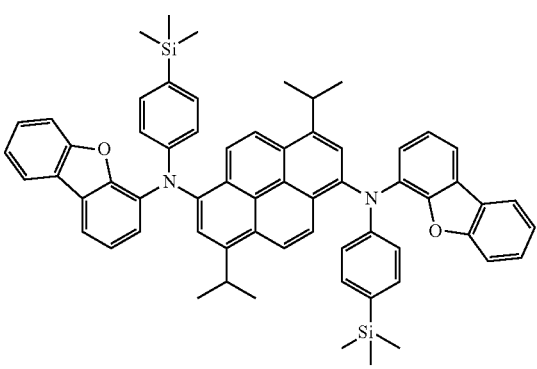
FD25
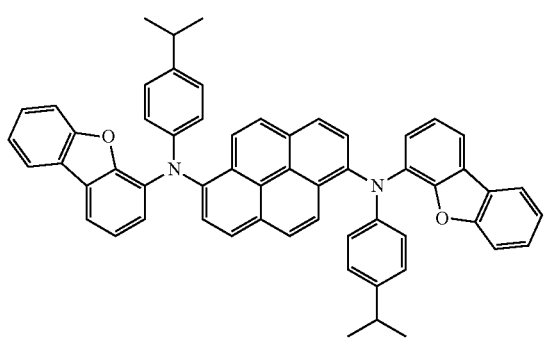
FD26
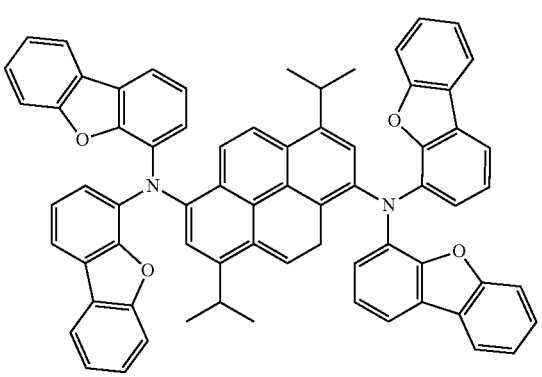
FD27
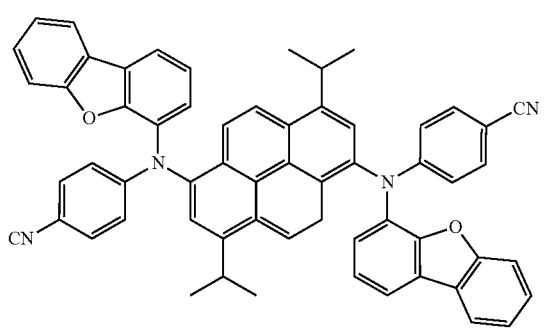
FD28
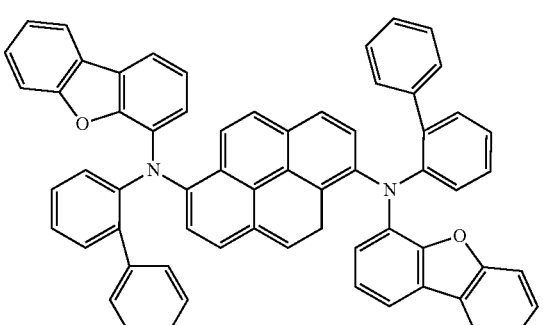

-continued
FD29
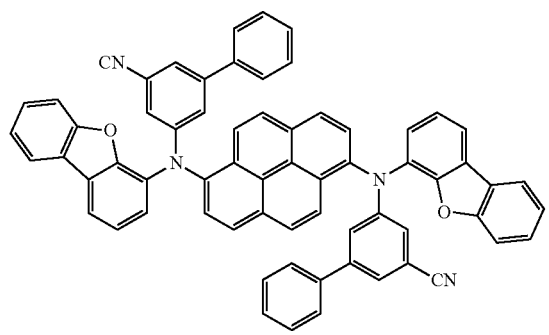
FD30
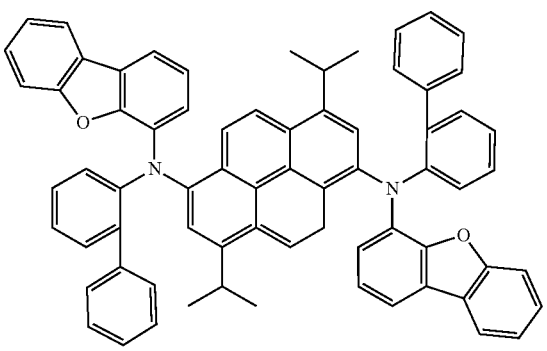
FD31
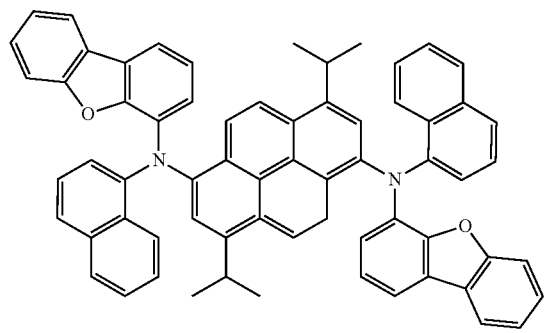
FD32
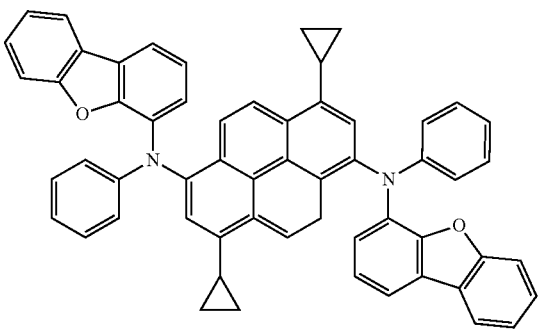
FD33
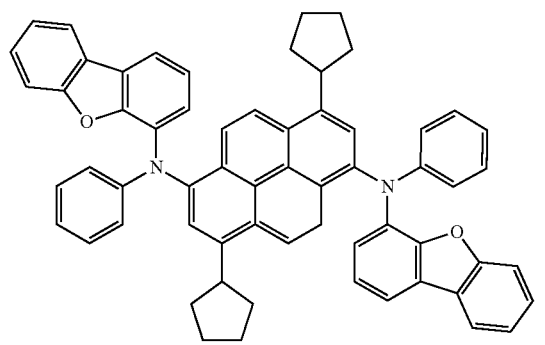
FD34
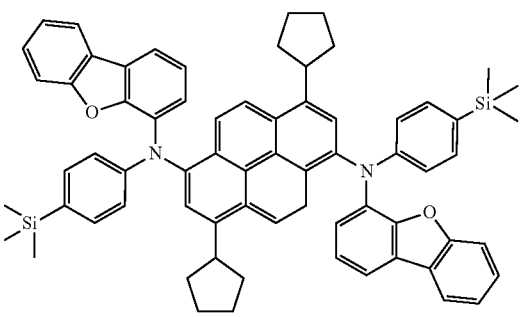
FD35
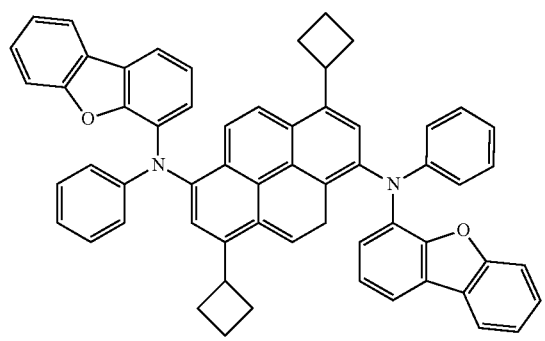
FD36
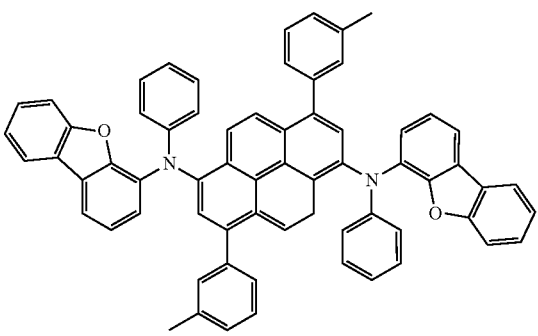

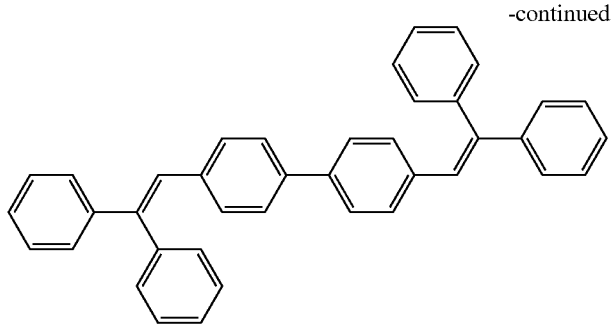

DPVBi

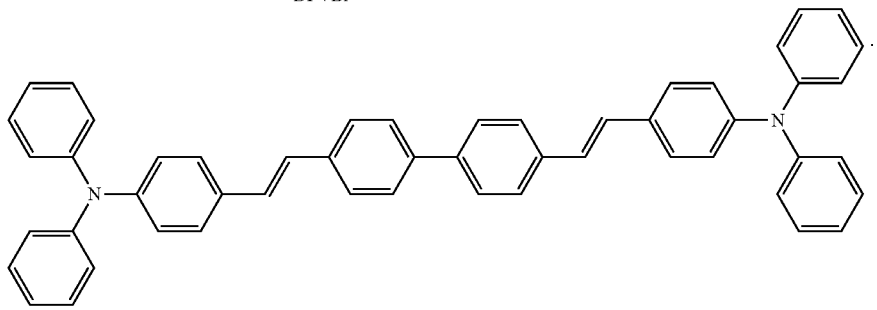

DPAVBi

Delayed Fluorescence Material

The emission layer may include a delayed fluorescence material.

The delayed fluorescence material described herein may be any suitable compound to emit delayed fluorescence according to a delayed fluorescence emission mechanism.

The delayed fluorescence material included in the emission layer may serve as a host or a dopant, depending on the types (kinds) of other materials included in the emission layer.

In some embodiments, a difference between a triplet energy level (eV) of the delayed fluorescence material and a singlet energy level (eV) of the delayed fluorescence material may be about 0 eV or greater and about 0.5 eV or smaller. When the difference between a triplet energy level (eV) of the delayed fluorescence material and a singlet energy level (eV) of the delayed fluorescence material is within this range, up-conversion from a triplet state to a singlet state in the delayed fluorescence material may be effectively occurred, thus improving luminescence efficiency and/or the like of the light-emitting device 10.

In some embodiments, the delayed fluorescence material may include: i) a material including at least one electron donor (e.g., a π electron-rich $C_3$-$C_{60}$ cyclic group (such as a carbazole group and/or the like)) and at least one electron acceptor (e.g., a sulfoxide group, a cyano group, a π electron-deficient nitrogen-containing $C_1$-$C_{60}$ cyclic group, and/or the like), ii) a material including a $C_8$-$C_{60}$ polycyclic group including at least two cyclic groups condensed to each other with a shared boron (B) atom, and/or the like.

Non-limiting examples of the delayed fluorescence material may include at least one of Compounds DF1 to DF9:

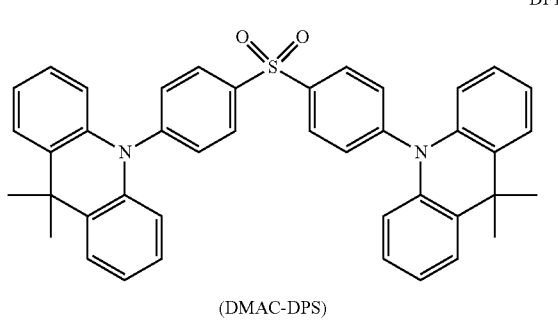

(DMAC-DPS)

DF1

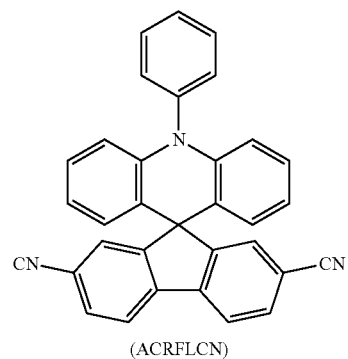

(ACRFLCN)

DF2

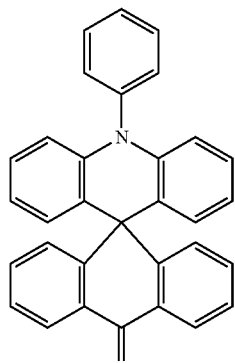

(ACRSA)

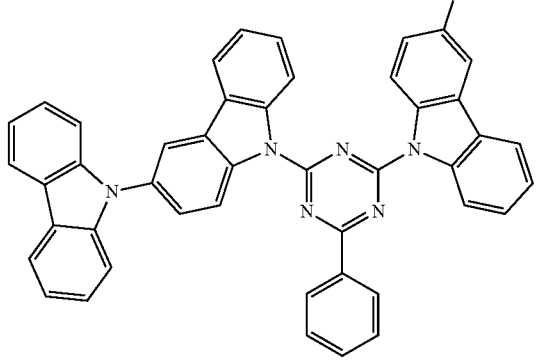

(CC2TA)

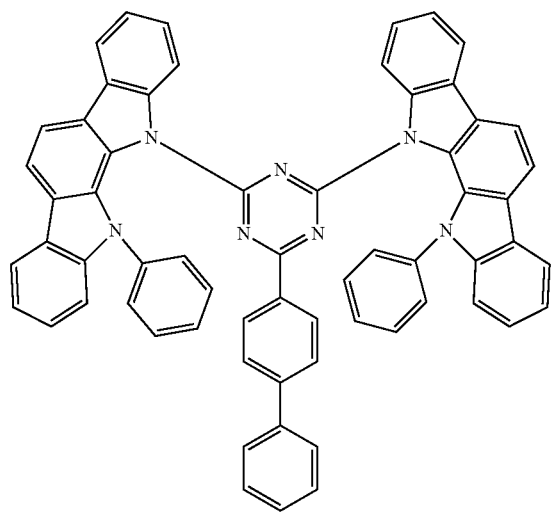

(PIC-TRZ)

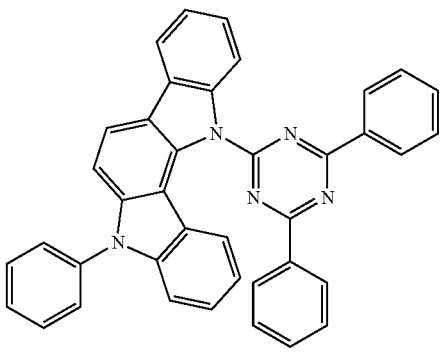

(PIC-TRZ2)

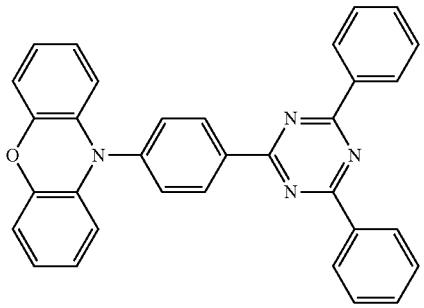

(PXZ-TRZ)

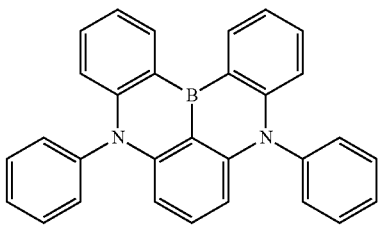

(DABNA-1)

(DABNA-2)

Emission Layer 153 Including Quantum Dots

In some embodiments, the emission layer 153 may include quantum dots. The emission layer 153 may further include a matrix material, in addition to quantum dots. For example, the emission layer 153 may include quantum dots and a matrix material, and quantum dots may be dispersed in the matrix material.

The term "quantum dot" as utilized herein refers to a crystal of a semiconductor compound and may include any suitable material capable of emitting one or more suitable emission wavelengths according to the size of the crystal.

The quantum dots may be synthesized according to a wet chemical process, a metal organic chemical vapor deposition (MOCVD) process, a molecular beam epitaxy (MBE) process, and/or the like.

The wet chemical process is a method of growing a quantum dot particle crystal by mixing a precursor material with an organic solvent. When the crystal grows, the organic solvent may naturally serve as a dispersant coordinated on the surface of the quantum dot crystal and may control the growth of the crystal. Thus, the wet chemical method may be easier than a vapor deposition process (such as the metal organic chemical vapor deposition (MOCVD) and/or the molecular beam epitaxy (MBE) process). Further, the growth of quantum dot particles may be controlled with a lower manufacturing cost.

The quantum dot may include a group III-VI semiconductor compound; a group II-VI semiconductor compound; a group III-V semiconductor compound; a group III-VI semiconductor compound; a group I-III-VI semiconductor compound; a group IV-VI semiconductor compound; a group IV element or semiconductor compound; or any combination thereof.

Non-limiting examples of the group III-VI semiconductor compound include a binary compound (such as $In_2S_3$); a ternary compound (such as AgInS), $AgInS_2$, CuInS, and/or $CuInS_2$; or any combination thereof.

Non-limiting examples of the group II-VI semiconductor compound include a binary compound (such as CdS, CdSe, CdTe, ZnS, ZnSe, ZnTe, ZnO, HgS, HgSe, HgTe, MgSe, and/or MgS); a ternary compound (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, and/or HgZnSTe); or any combination thereof.

Non-limiting examples of the group III-V semiconductor compound include a binary compound (such as GaN, GaP, GaAs, GaSb, AlN, AlP, AlAs, AlSb, InN, InP, InAs, and/or InSb); a ternary compound (such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb); a quaternary compound (such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb); or any combination thereof. In some embodiments, the group III-V semiconductor compound may further include a group II (e.g., IIB) element. Non-limiting examples of the group III-V semiconductor compound further including the group II element include InZnP, InGaZnP, InAlZnP, and/or the like.

Non-limiting examples of the group III-VI semiconductor compound include a binary compound (such as $In_2S_3$, GaS, GaSe, $Ga_2Se_3$, GaTe, InS, InSe, $In_2Se_3$, InTe, and/or the like); a ternary compound (such as $InGaS_3$, $InGaSe_3$, and/or the like); or any combination thereof.

Non-limiting examples of the group I-III-VI semiconductor compound include a ternary compound (such as AgInS, $AgInS_2$, CuInS, $CuInS_2$, $CuGaO_2$, $AgGaO_2$, $AgAlO_2$, and/or any combination thereof).

Non-limiting examples of the group IV-VI semiconductor compound include a binary compound (such as SnS, SnSe, SnTe, PbS, PbSe, and/or PbTe); a ternary compound (such as SnSeS, SnSeTe, SnSTe, PbSeS, PbSeTe, PbSTe, SnPbS, SnPbSe, and/or SnPbTe); a quaternary compound (such as SnPbSSe, SnPbSeTe, and/or SnPbSTe); or any combination thereof.

The group IV element or semiconductor compound may be a single element compound (such as Si and/or Ge); a binary compound (such as SiC and/or SiGe); or any combination thereof.

Individual elements included in the multi-element compound (such as a binary compound, a ternary compound, and a quaternary compound) may be present in the quantum dot particle at a substantially uniform or non-uniform concentration.

The quantum dot may have a single (e.g., unitary) structure in which the concentration of each element included in the quantum dot is substantially uniform, or a core-shell double structure. In some embodiments, materials included in the core may be different from materials included in the shell.

The shell of the quantum dot may serve as a protective layer for preventing or reducing chemical denaturation of the core to maintain semiconductor characteristics, and/or as a charging layer for imparting electrophoretic characteristics to the quantum dot. The shell may have a monolayer structure or a multilayer structure. An interface between a core and a shell may have a concentration gradient where a concentration of elements present in the shell decreases toward the core.

Non-limiting examples of the shell of the quantum dot include a metal oxide, a nonmetal oxide, a semiconductor compound, and/or a combination thereof. Non-limiting examples of the metal oxide and the nonmetal oxide may include: a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO); a ternary compound (such as $MgAl_2O_4$, $CoFe_2O_4$, $NiFe_2O_4$, and/or $CoMn_2O_4$); and/or any combination thereof. Non-limiting examples of the semiconductor compound include a group III-VI semiconductor compound; a group II-VI semiconductor compound; a group III-V semiconductor compound; a group III-VI semiconductor compound; a group I-III-VI semiconductor compound; a group IV-VI semiconductor compound; or any combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a spectral full width of half maximum (FWHM) of an emission wavelength of about 45 nm or less, about 40 nm or less, or about 30 nm or less. When the FWHM of the quantum dot is within this range, color purity and/or color reproducibility may be improved. In some embodiments, because light emitted through the quantum dot is emitted in all directions, an optical viewing angle may be improved.

In some embodiments, the quantum dot may be a spherical, pyramidal, multi-arm, and/or cubic nanoparticle, nanotube, nanowire, nanofiber, and/or nanoplate particle.

By adjusting the size of the quantum dot, the energy band gap may also be adjusted, thereby obtaining light of various suitable wavelengths in the quantum dot emission layer. By utilizing quantum dots of various suitable sizes, a light-emitting device to emit light of various suitable wavelengths may be realized. In some embodiments, the size of the quantum dot may be selected such that the quantum dot may be to emit red, green, and/or blue light. In some embodiments, the size of the quantum dot may be selected such that the quantum dot may be to emit white light by combining one or more suitable light of colors.

The quantum dot may have: a single structure having components and a composition that are homogeneous; or a composite structure (such as a core-shell structure or a gradient structure). The shell in the core-shell structure may be a single shell having components and a composition that are homogeneous, or a multi-shell structure having at least two layers having different components and/or compositions.

For example, the materials constituting the core and the shell in the core-shell structure may each be selected from the semiconductor compounds described.

In an embodiment, the quantum dot may include a group III-V semiconductor compound.

In one or more embodiments, the quantum dot may include In.

In one or more embodiments, the quantum dot may include In and P.

In one or more embodiments, the quantum dot may include a group III-V semiconductor compound and a group II-VI semiconductor compound.

In one or more embodiments, the quantum dot may have a core-shell structure, and the core may be a group III-V semiconductor compound, and the shell may be a group II-VI semiconductor compound.

In one or more embodiments, the quantum dot may have a core-shell structure, and the core may be GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the shell may be CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

In one or more embodiments, the quantum dot may have a core-shell structure, and the core may be CdSe, CdS, ZnS, ZnSe, CdTe, CdSeTe, CdZnS, PbSe, AgInZnS, ZnO, InN, InP, InAs, InSb, InGaP, or any combination thereof, and the shell may be CdSe, ZnSe, ZnS, ZnSeS ZnTe, CdTe, PbS, TiO, SrSe, HgSe, or any combination thereof.

In one or more embodiments, the quantum dot may be a InP/ZnS or InP/ZnSeS core-shell quantum dot.

The average diameter of the quantum dot may be in a range of about 1 nm to about 20 nm, for example, about 1 nm to about 15 nm, or for example, about 1 nm to about 10 nm.

When the quantum dot has a core-shell structure, a ratio of a radius of the core to a radius of the shell may be in a range of about 2:8 to about 8:2, for example, about 3:7 to about 7:3, or for example, about 4:6 to about 6:4.

The matrix material may include a polymer material that may serve as a matrix in which the quantum dots are dispersed.

Electron Transport Region 155

The electron transport region 155 may be located between the emission layer 153 and the second electrode 190. The electron transport region 155 may serve to transfer electrons injected from the second electrode 190 to the emission layer 153.

The electron transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

In some embodiments, the electron transport region may include at least one selected from a buffer layer, a hole blocking layer, an electron control layer, an electron transport layer, and an electron injection layer, but embodiments are not limited thereto.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the constituting layers of each structure are sequentially stacked on the emission layer in each stated order, but embodiments are not limited thereto.

In some embodiments, the electron transport region 155 may include an inorganic nanoparticle.

In some embodiments, at least a portion of the electron transport region may be formed by utilizing an inorganic nanoparticle composition including an inorganic nanoparticle and a highly fluorinated solvent.

Accordingly, in some embodiments, at least a portion of the electron transport region may include the inorganic nanoparticle and the highly fluorinated solvent that may remain in forming at least a portion of the electron transport region.

The inorganic nanoparticle and the highly fluorinated solvent may each be understood by referring to the descriptions of the inorganic nanoparticle and the highly fluorinated solvent provided herein.

In the light-emitting device according to one or more embodiments, at least a portion of the electron transport region may be formed by utilizing the inorganic nanoparticle composition, and mixing and/or deterioration of materials at an interface between an area including the inorganic nanoparticle and another area (e.g., an emission layer and/or the like) that may be adjacent thereto may be prevented or reduced, and the inorganic nanoparticle composition may be suitably utilized in an inkjet process.

In some embodiments, due to charge transportability of the inorganic nanoparticle included in the electron transport region, deterioration by heat generated while driving a light-emitting device or excess excitons migrated from the emission layer may be prevented or reduced. Thus, the light-emitting device may have excellent luminescence efficiency and/or lifespan.

In some embodiments, the electron transport region may include the electron transport layer, and the electron transport layer may be in direct contact with the emission layer and may be formed by utilizing the inorganic nanoparticle composition.

In the light-emitting device according to one or more embodiments, as the electron transport layer adjacent to the emission layer may be formed by utilizing the inorganic nanoparticle composition, material mixing and/or deterioration at an interface between an area including the inorganic nanoparticle and the emission layer that may be adjacent with the area may be prevented or reduced, and the inorganic nanoparticle composition may be suitably utilized in an inkjet process.

The thickness of the electron transport layer may be in a range of about 100 Å to about 1,000 Å, and in some embodiments, about 150 Å to about 500 Å. When the thickness of the electron transport layer is within any of these ranges, excellent charge transporting characteristics may be obtained without a substantial increase in driving voltage.

The electron transport region (e.g., a buffer layer, a hole blocking layer, an electron control layer, or an electron transport layer in the electron transport region) may include a metal-free compound including at least one π electron-deficient nitrogen-containing $C_1$-$C_{60}$ cyclic group.

In some embodiments, the electron transport region may include a compound represented by Formula 601: Formula 601

$[Ar_{601}]_{xe11}$-$[(L_{601})_{xe1}$-$R_{601}]_{xe21}$, wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($O_{601}$)($O_{602}$)($O_{603}$), —C(=O)($Q_{601}$), —S(=O)$_2$($Q_{601}$), or —P(=O)($Q_{601}$)($Q_{602}$), $Q_{601}$ to $Q_{603}$ may each be understood by referring to the description of $Q_{11}$ provided herein, xe21 may be 1, 2, 3, 4, or 5, and at least one of $Ar_{601}$, $L_{601}$, or $R_{601}$ may independently be a π electron-deficient nitrogen-containing $C_1$-$C_{60}$ cyclic group unsubstituted or substituted with at least one $R_{10a}$.

In some embodiments, when xe11 in Formula 601 is 2 or greater, at least two $Ar_{601}$(S) may be bound via a single bond.

In some embodiments, in Formula 601, $Ar_{601}$ may be a substituted or unsubstituted anthracene group.

In some embodiments, the electron transport region may include a compound represented by Formula 601-1:

Formula 601-1

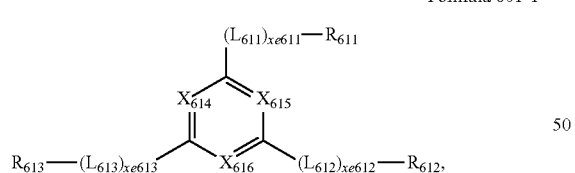

wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1

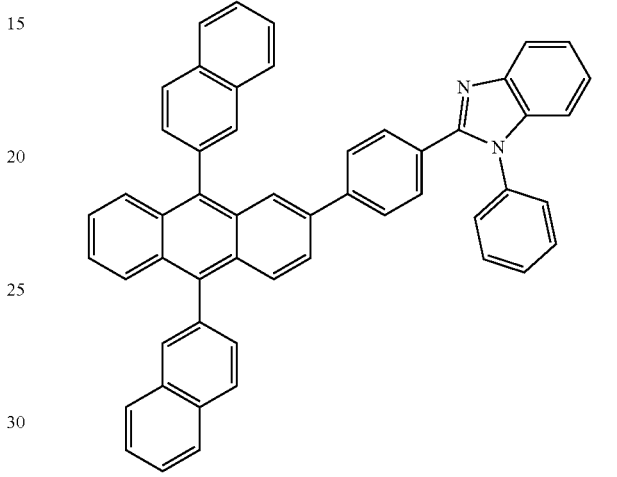

ET2

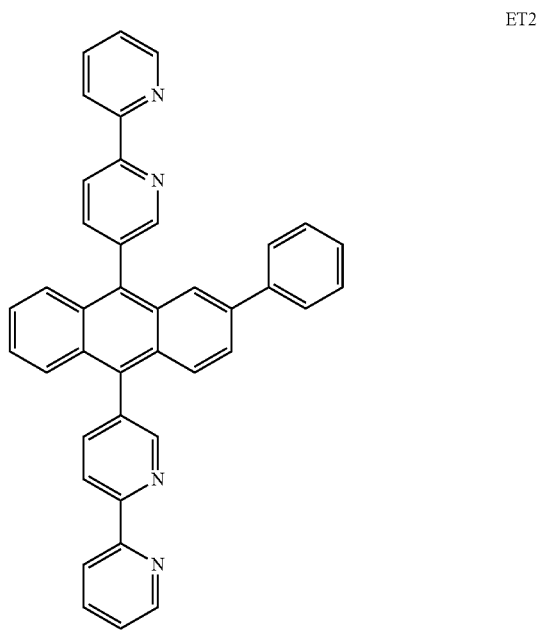

99
-continued
ET3
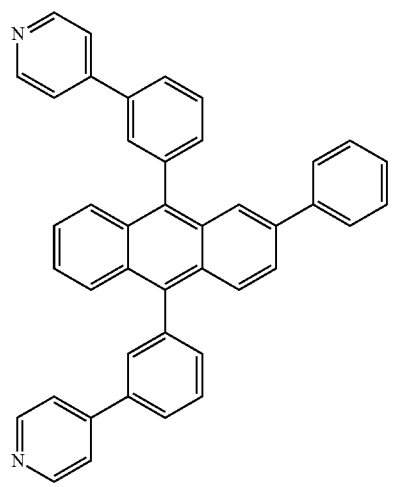
ET4
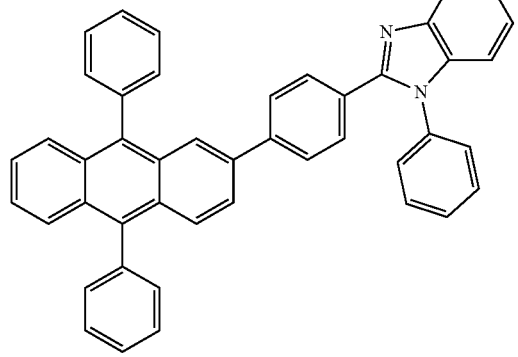
ET5
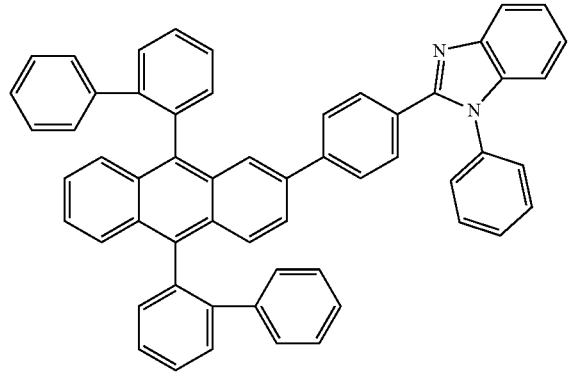
100
-continued
ET6
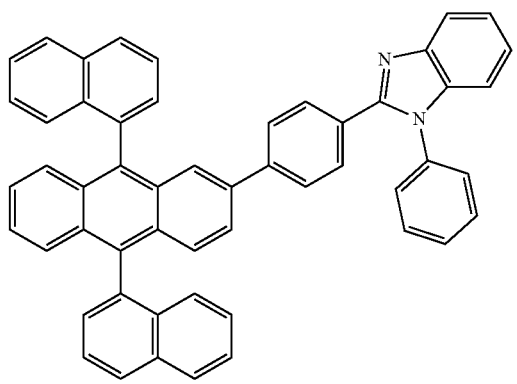
ET7
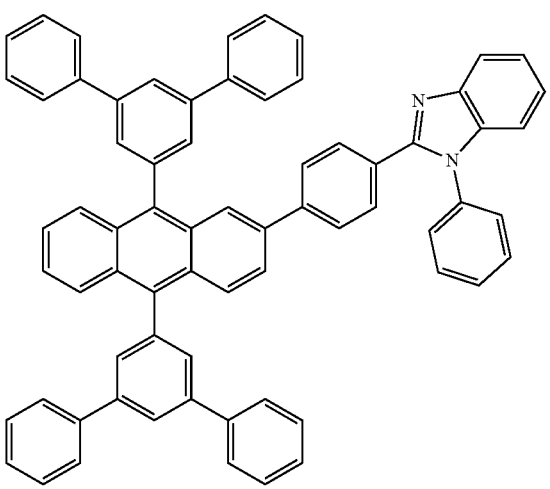
ET8
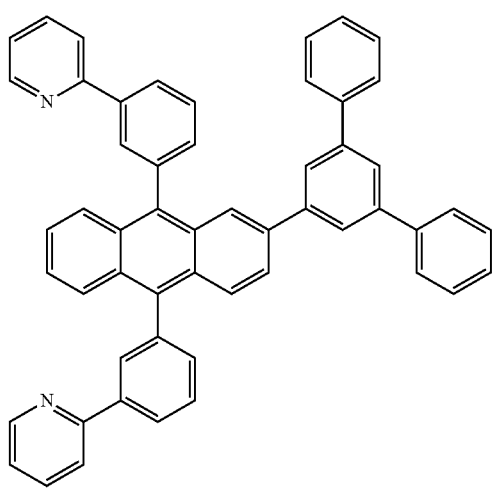

101
-continued
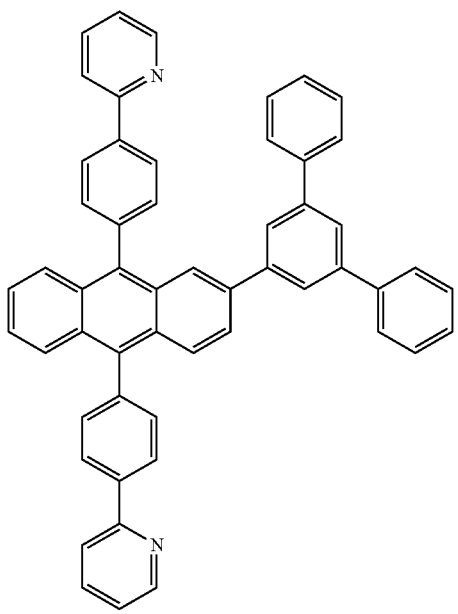
ET9
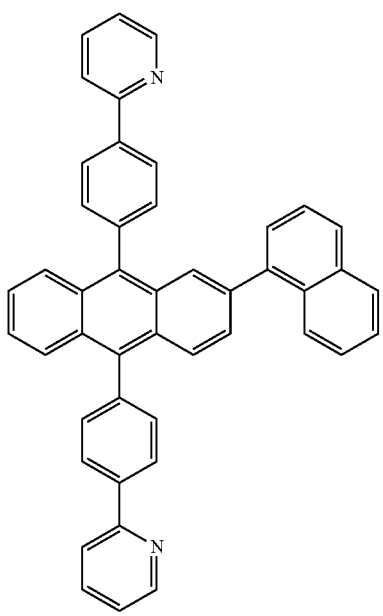
ET10
102
-continued
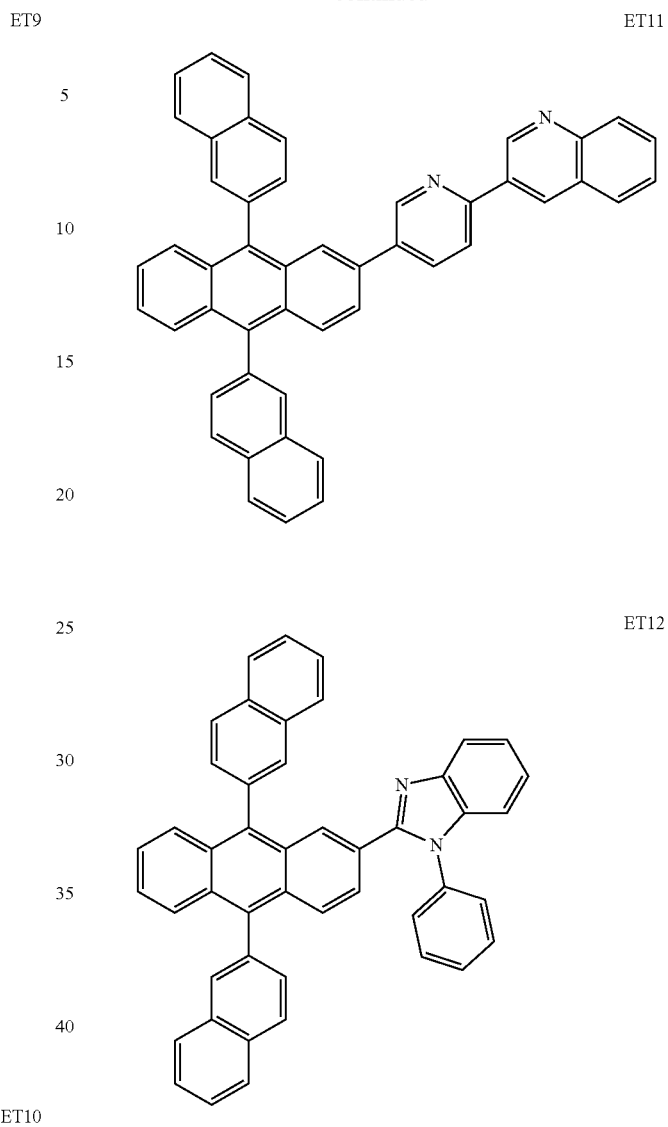
ET11
ET12
ET13

ET14
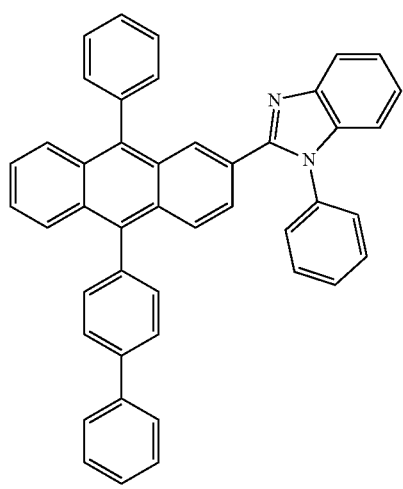
ET15
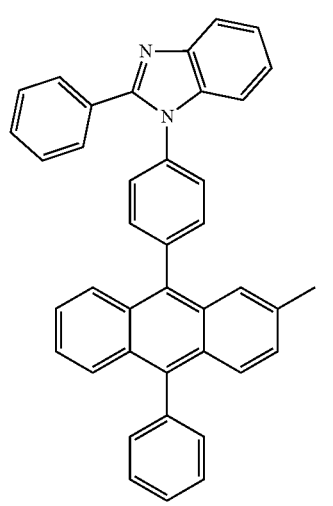
ET16
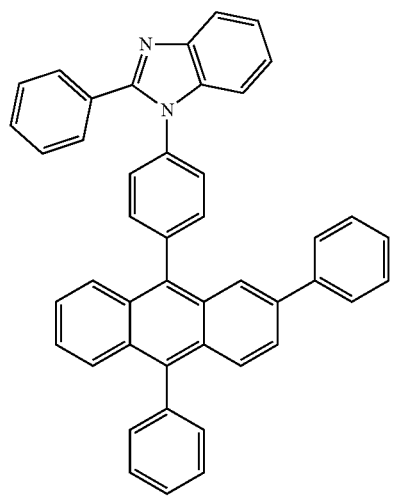
ET17
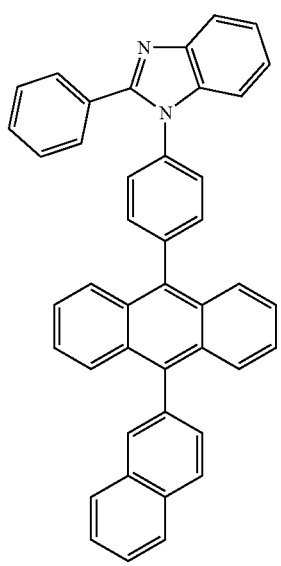
ET18
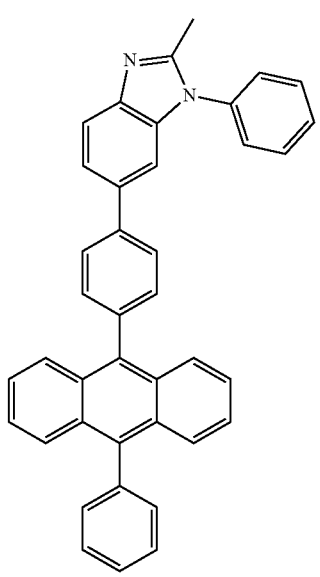
ET19
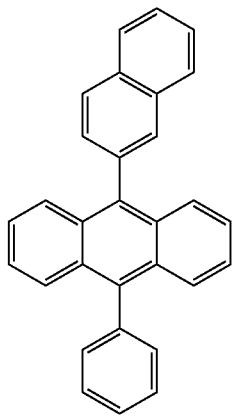

ET20
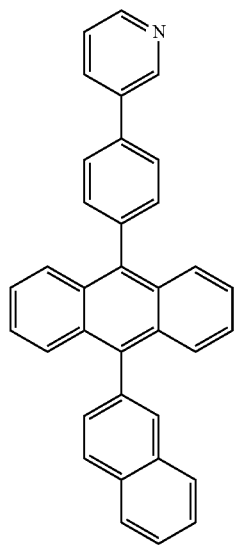
ET23
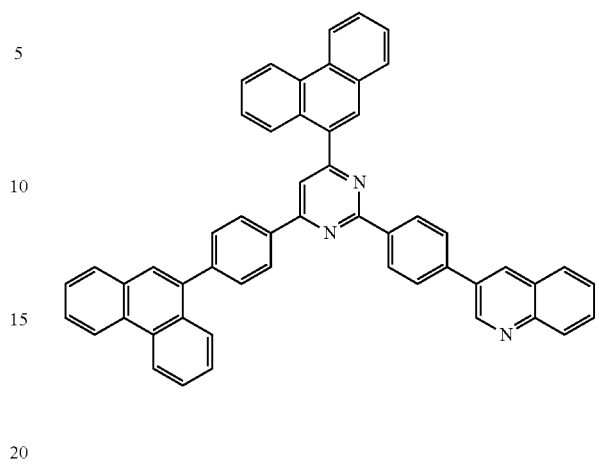
ET21
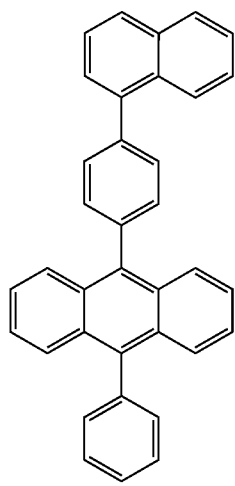
ET24
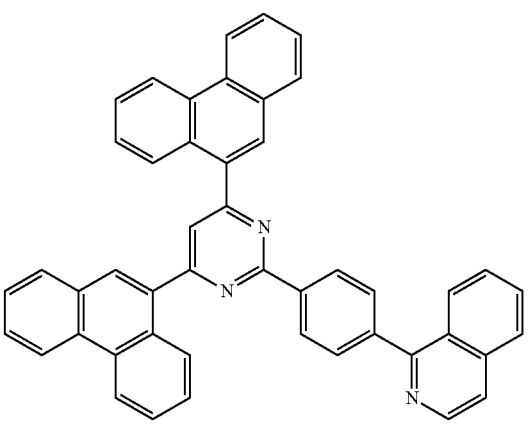
ET22
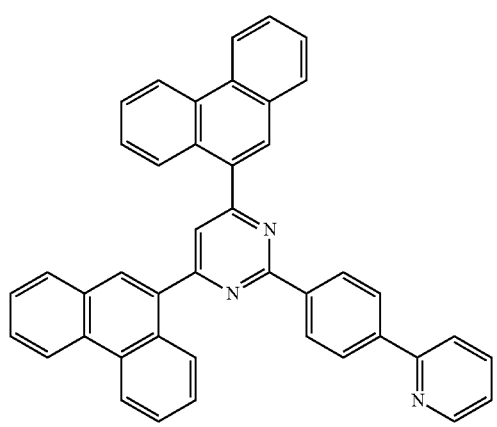
ET25
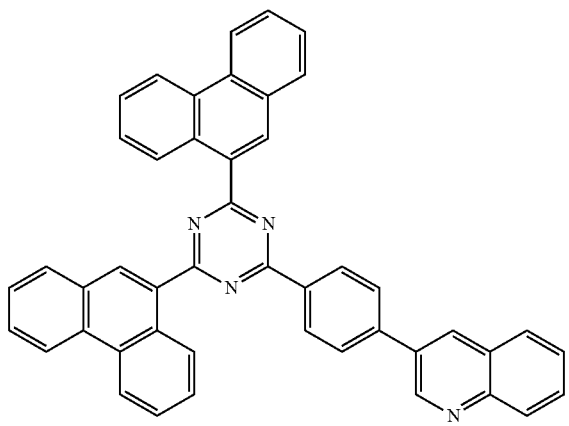

ET26
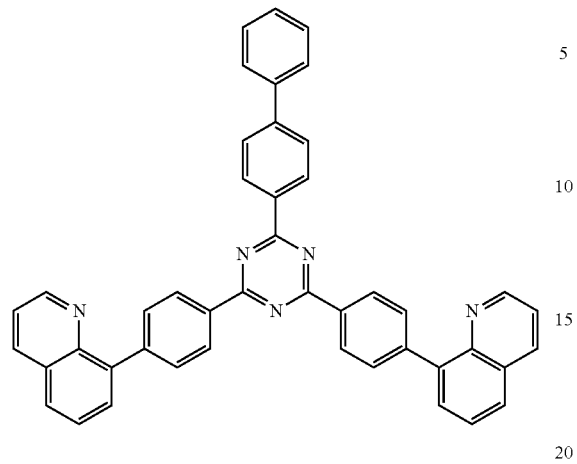
ET29
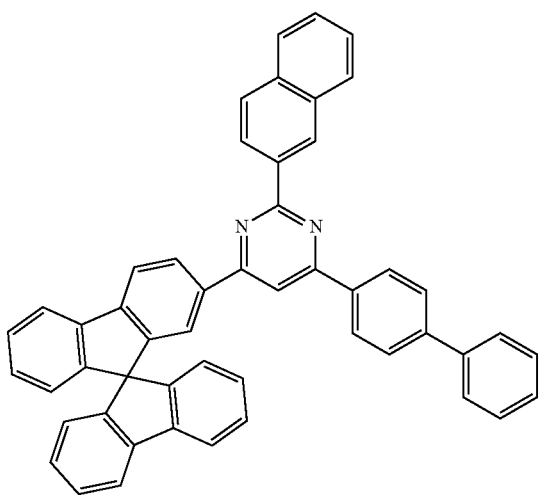
ET27
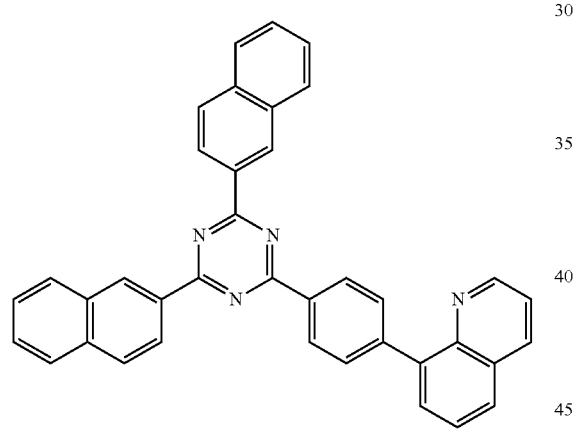
ET30
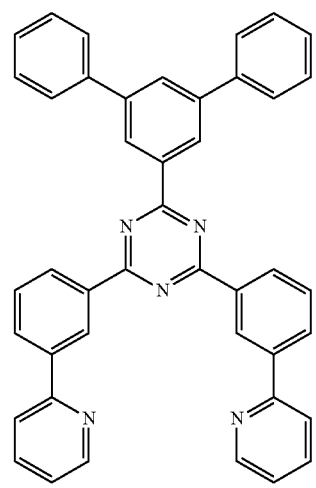
ET28
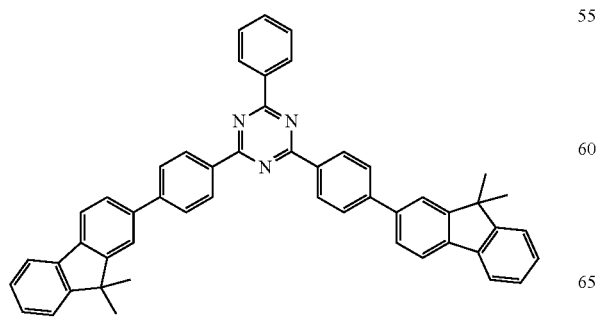
ET31
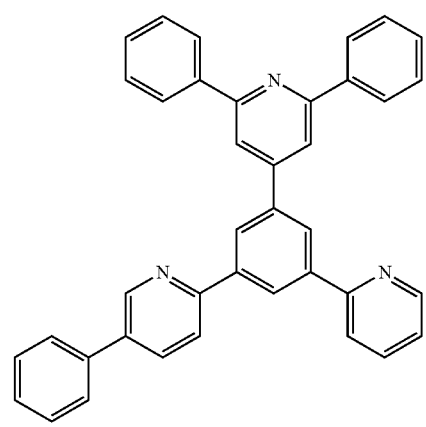

-continued
ET32
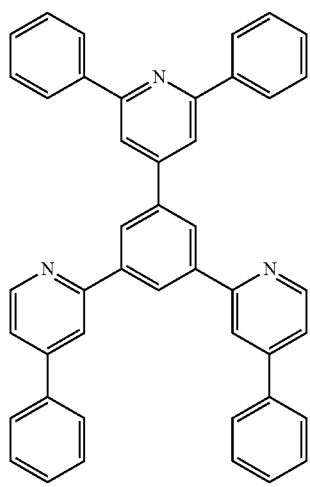
ET33
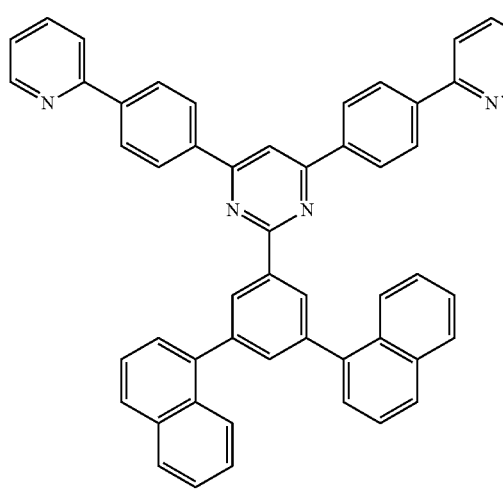
ET34
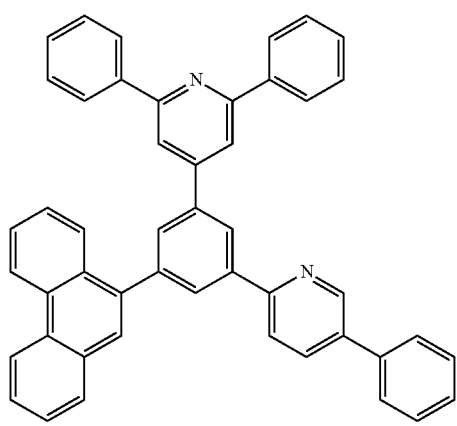
-continued
ET35
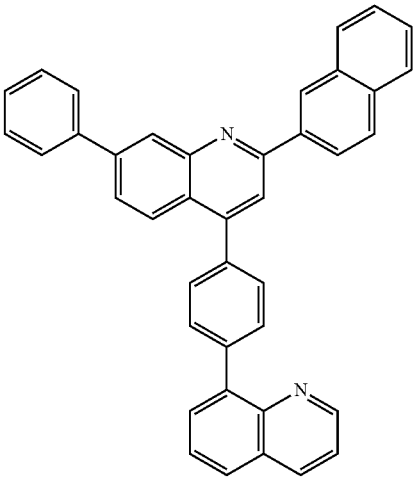
ET36
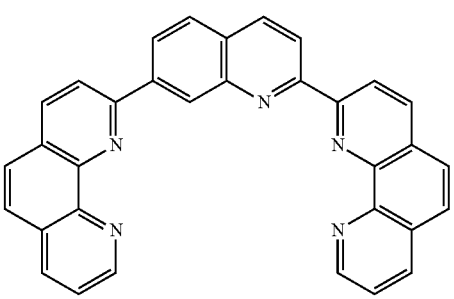
ET37
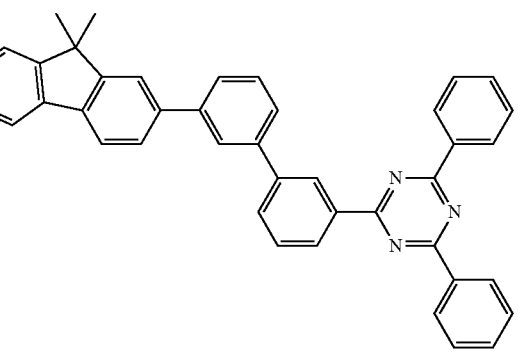
ET38
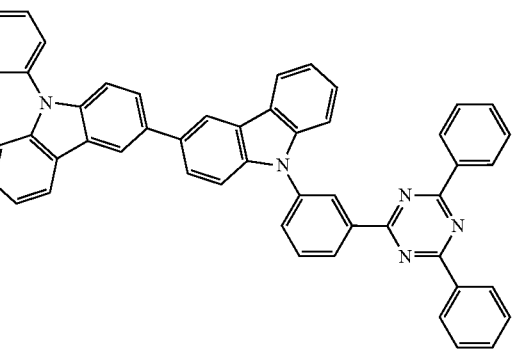

ET39
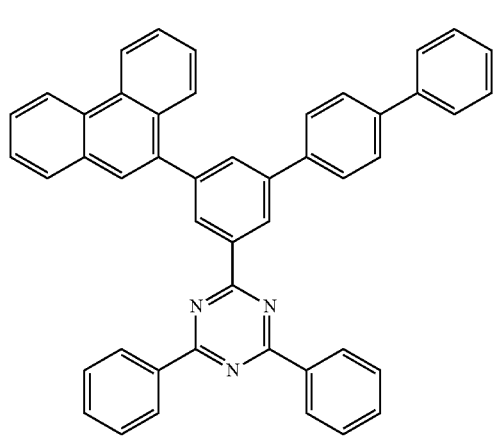
ET40
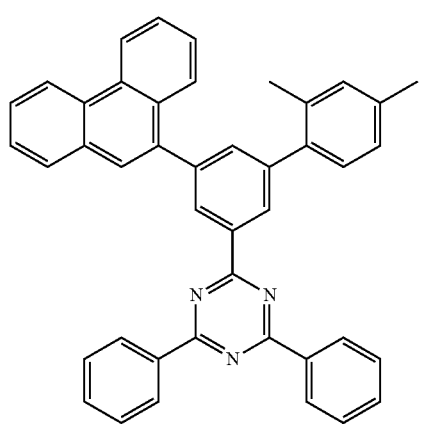
ET41
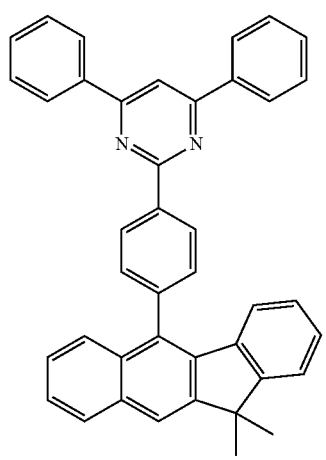
ET42
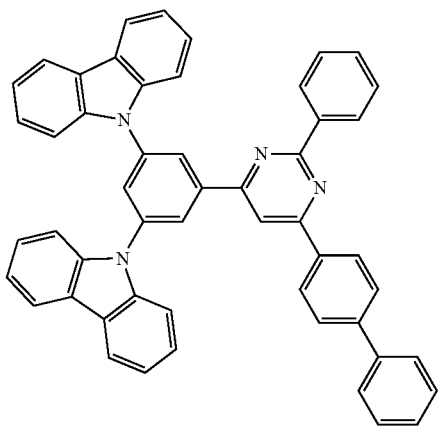
ET43
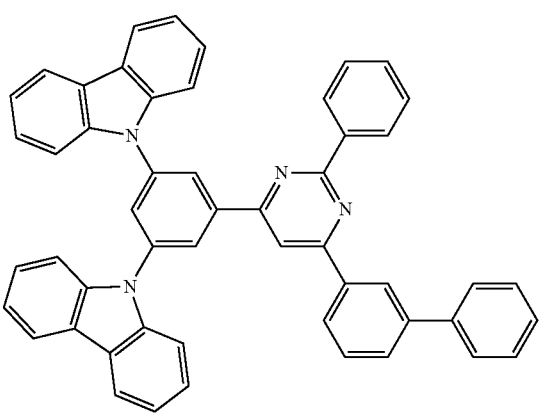
ET44
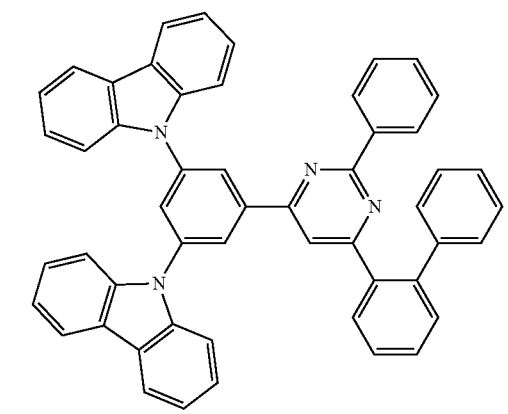
ET45
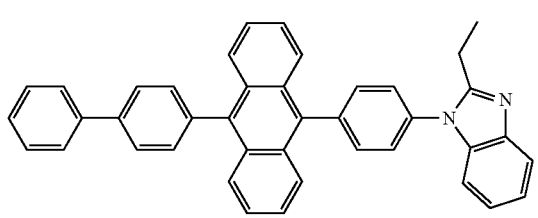

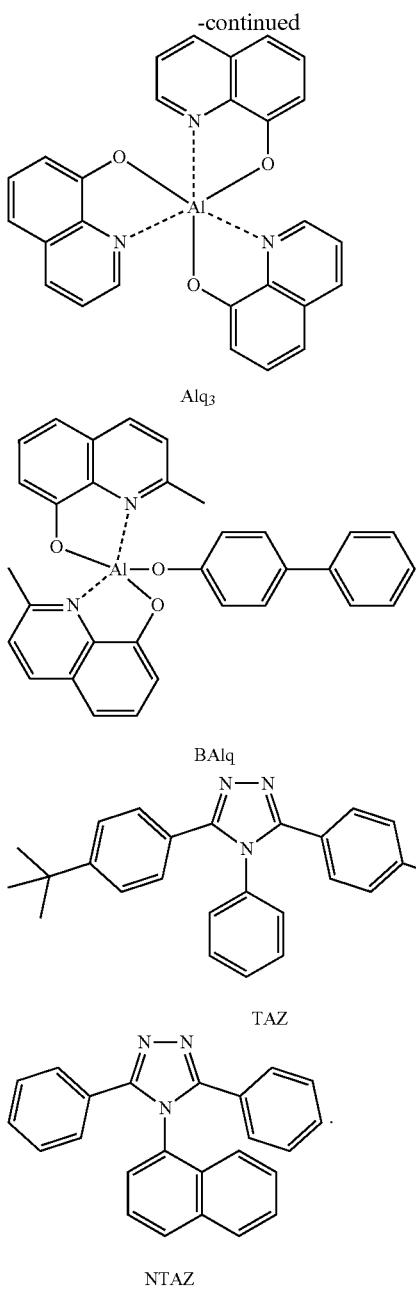

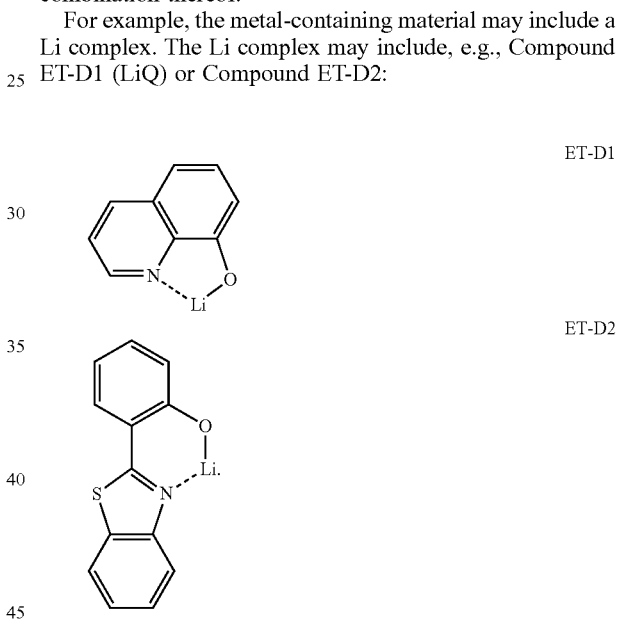

The thickness of the electron transport region may be in a range of about 100 Å to about 5,000 Å, and in some embodiments, about 160 Å to about 4,000 Å. When the electron transport region includes a buffer layer, a hole blocking layer, an electron control layer, an electron transport layer, or any combination thereof, the thicknesses of the buffer layer, the hole blocking layer, or the electron control layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron injection layer are each within these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of the alkali metal complex may be a lithium (Li) ion, a sodium (Na) ion, a potassium (K) ion, a rubidium (Rb) ion, or a cesium (Cs) ion. The metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

The electron transport region may include an electron injection layer to facilitate injection of electrons from the second electrode 190. The electron injection layer may be in direct contact with the second electrode 190.

The electron injection layer may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may each respectively be an oxide, a halide (e.g., a fluoride, a chloride, a bromide, or an iodide), a telluride, or any combination thereof of the alkali metal, the alkaline earth metal, and the rare earth metal.

The alkali metal-containing compound may be an alkali metal oxide (such as $Li_2O$, $Cs_2O$, and/or $K_2O$), an alkali metal halide (such as LiF, NaF, CsF, KF, LiI, NaI, CsI, and/or KI), or any combination thereof. The alkaline earth-metal-containing compound may include an alkaline earth-metal oxide, (such as BaO, SrO, CaO, $Ba_xSr_{1-x}O$ (wherein x is a real number that satisfying 0<x<1), and/or $Ba_xCa_{1-x}O$ (wherein x is a real number that satisfying 0<x<1)). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Non-limiting examples of the lanthanide metal telluride include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and/or the like.

The alkali metal complex, the alkaline earth metal complex, and the rare earth metal complex may include: i) an ion of the alkali metal, alkaline earth metal, and rare earth metal described above, respectively, and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof. In some embodiments, the electron injection layer may further include an organic material (e.g., a compound represented by Formula 601).

In some embodiments, the electron injection layer may include (e.g., consist of) i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposition layer, a RbI:Yb co-deposition layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or combination thereof may be substantially homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

A portion of the electron transport region 155 may not include carbon. For example, the electron transport region 155 may include an electron injection layer, and the electron injection layer may not include an organic material.

Second Electrode 190

The second electrode 190 may be on the electron transport region 155. In an embodiment, the second electrode 190 may be a cathode that is an electron injection electrode. In this embodiment, a material for forming the second electrode 190 may be a material having a low work function, for example, a metal, an alloy, an electrically conductive compound, or any combination thereof.

In some embodiments, the second electrode 190 may include lithium (Li), silver (Ag), magnesium (Mg), aluminum (Al), aluminum-lithium (Al—Li), calcium (Ca), magnesium-indium (Mg—In), magnesium-silver (Mg-Ag), ytterbium (Yb), silver-ytterbium (Ag-Yb), ITO, IZO, or any combination thereof.

In one or more embodiments, the second electrode 190 may include an alkali metal, a rare earth metal, or any combination thereof, in addition to Ag, Al, Mg, Ca, Sr, Ba, In, or any combination thereof.

The alkali metal may be Li, Na, K, Rb, Cs or any combination thereof. The rare earth metal may be Sc, Y, Ce, Tb, Yb, Gd, or any combination thereof.

The second electrode 190 may be a transparent electrode, a semi-transparent electrode, or a reflective electrode.

In some embodiments, the second electrode 190 may be a transparent electrode having a light transmittance of 50 percent (%) or higher (e.g., 60% or higher, 65% or higher, 70% or higher, 75% or higher, 80% or higher, 85% or higher, 90% or higher, or 95% or higher), based on light in a range of a visible light wavelengths (e.g., light having a maximum emission wavelength in a range of about 400 nm to about 700 nm). Accordingly, the light-emitting device 10 including the second electrode 190 may be a top emission light-emitting device having excellent luminescence efficiency and/or lifespan.

The second electrode 190 may have a single-layered structure, or a multi-layered structure including two or more layers.

The thickness of the second electrode 190 may be, for example, in a range of about 10 nm to about 1,000 nm, or for example, about 100 nm to about 300 nm.

Capping Layer

A first capping layer may be located outside the first electrode 110, and/or a second capping layer may be located outside the second electrode 190. In some embodiments, the light-emitting device 10 may have a structure in which the first capping layer, the first electrode 110, the emission layer 153, the electron transport region 155, and the second electrode 190 are sequentially stacked in this stated order, a structure in which the first electrode 110, the emission layer 153, the electron transport region 155, the second electrode 190, and the second capping layer are sequentially stacked in this stated order, or a structure in which the first capping layer, the first electrode 110, the emission layer 153, the electron transport region 155, the second electrode 190, and the second capping layer are sequentially stacked in this stated order.

In the light-emitting device 10, light emitted from the emission layer 153 may pass through the first electrode 110 (which may be a semi-transparent electrode or a transparent electrode) and through the first capping layer to the outside. In the light-emitting device 10, light emitted from the emission layer 153 may pass through the second electrode 190 (which may be a semi-transparent electrode or a transparent electrode) and through the second capping layer to the outside.

The first capping layer and/or the second capping layer may improve the external luminescence efficiency of the device based on the principle of constructive interference. Accordingly, the optical extraction efficiency of the light-emitting device 10 may be increased, thus improving luminescence efficiency of the light-emitting device 10.

The first capping layer and the second capping layer may each include a material having a refractive index of 1.6 or higher (at 589 nm).

The first capping layer and the second capping layer may each independently be an organic capping layer including an organic material, an inorganic capping layer including an inorganic material, or a composite capping layer including an organic material and an inorganic material.

At least one of the first capping layer or the second capping layer may each independently include a carbocyclic compound, a heterocyclic compound, an amine group-containing compound, a porphyrin derivative, a phthalocyanine derivative, a naphthalocyanine derivative, an alkali metal complex, an alkaline earth metal complex, or any combination thereof. The carbocyclic compound, the heterocyclic compound, and the amine group-containing compound may each optionally be substituted with a substituent of O, N, S, Se, Si, F, Cl, Br, I, or any combination thereof.

In some embodiments, at least one of the first capping layer or the second capping layer may each independently include an amine group-containing compound.

In some embodiments, at least one of the first capping layer or the second capping layer may each independently include the compound represented by Formula 201, the compound represented by Formula 202, or any combination thereof.

In one or more embodiments, at least one of the first capping layer or the second capping layer may each independently include one of Compounds HT28 to HT33, one of Compounds CP1 to CP6, β-NPB, or any combination thereof:

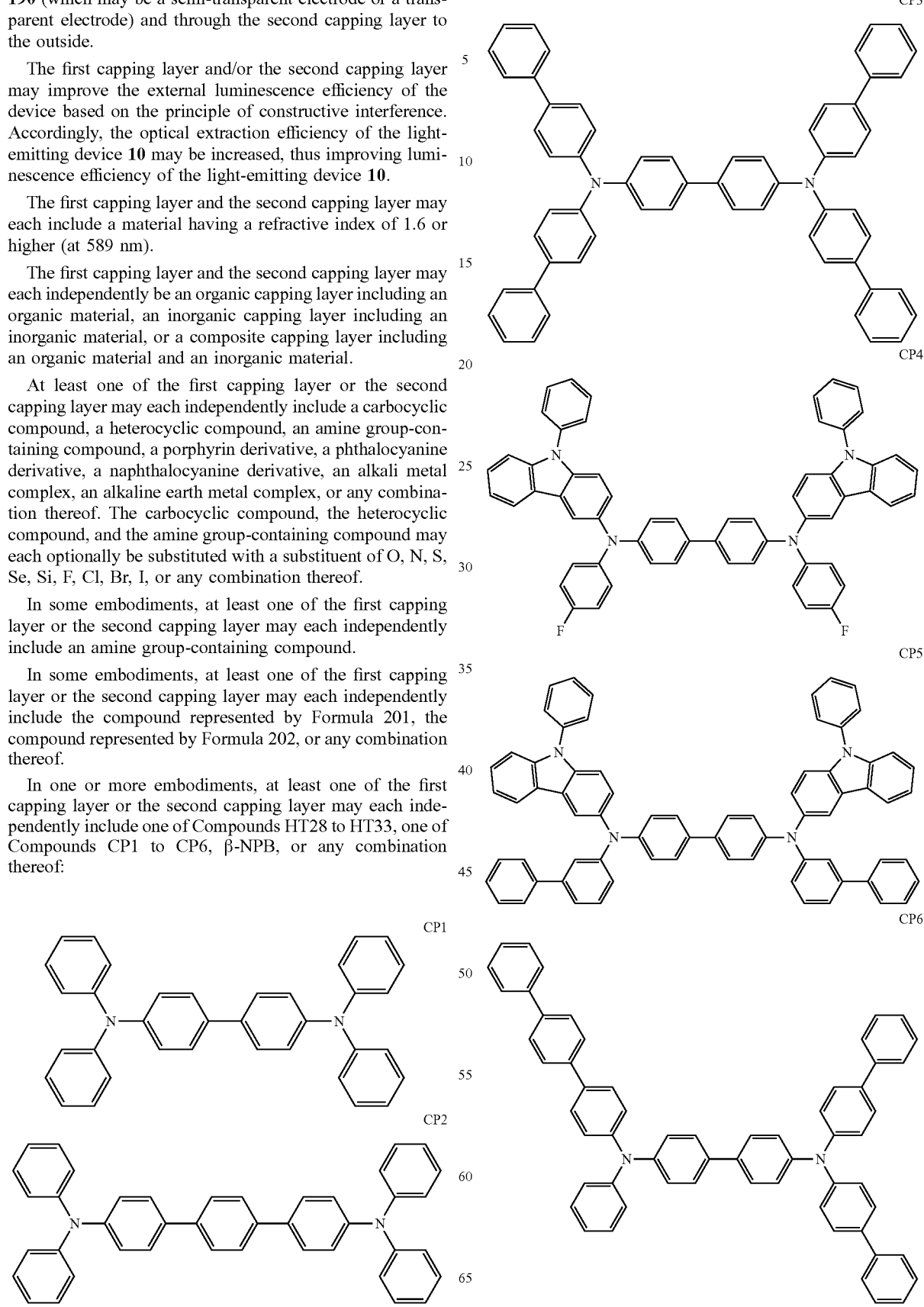

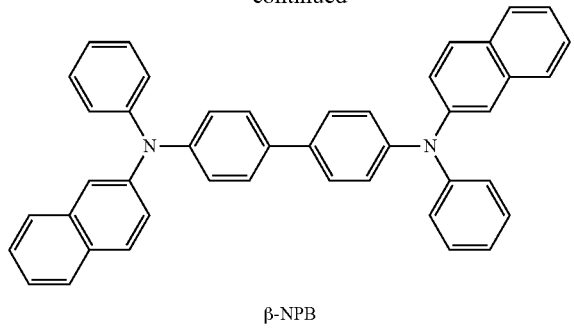

β-NPB

Electronic Apparatus

The light-emitting device 10 may be included in one or more suitable electronic apparatuses. In some embodiments, an electronic apparatus including the light-emitting device 10 may be an emission apparatus or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area to emit first color light; a second area to emit second color light; and/or a third area to emit third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include quantum dots. In some embodiments, the first area may include red quantum dots, the second area may include green quantum dots, and the third area may not include any quantum dot. The quantum dot may be understood by referring to the description of the quantum dot provided herein. The first area, the second area, and/or the third area may each further include an emitter.

In some embodiments, the light-emitting device may be to emit first light, the first area may be to absorb the first light to emit 1-1 color light, the second area may be to absorb the first light to emit 2-1 color light, and the third area may be to absorb the first light to emit 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an activation layer, wherein one of the source electrode or the drain electrode may be electrically connected to one of the first electrode or the second electrode of the light-emitting device.

The thin-film transistor may further include a gate electrode, a gate insulating film, and/or the like.

The activation layer may include a crystalline silicon, an amorphous silicon, an organic semiconductor, and/or an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and may prevent or reduce permeation of air and/or moisture to the light-emitting device at the same time (e.g., simultaneously). The encapsulation unit may be a sealing substrate including a transparent glass and/or a plastic substrate. The encapsulation unit may be a thin-film encapsulating layer including at least one of an organic layer or an inorganic layer. When the encapsulation unit is a thin film encapsulating layer, the electronic apparatus may be flexible.

In addition to the color filter and/or the color-conversion layer, one or more suitable functional layers may be disposed on the encapsulation unit depending on the use of an electronic apparatus. Non-limiting examples of the functional layer include a touch screen layer, a polarization layer, and/or the like. The touch screen layer may be a resistive touch screen layer, a capacitive touch screen layer, or an infrared beam touch screen layer. The authentication apparatus may be, for example, a biometric authentication apparatus that identifies an individual according biometric information (e.g., a fingertip, a pupil, and/or the like).

The light-emitting apparatus may be utilized in one or more suitable displays, light sources, and/or the like.

The authentication apparatus may be, for example, a biometric authentication apparatus that identifies an individual according biometric information (e.g., a fingertip, a pupil, and/or the like). The authentication apparatus may further include a biometric information collecting unit, in addition to the light-emitting device described above.

The electronic apparatus may be applicable to one or more suitable displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various suitable measurement devices, gauges (e.g., gauges of an automobile, an airplane, a ship), and/or a projector.

Manufacturing Method

A method of manufacturing a light-emitting device according to embodiments of the present disclosure includes: providing an emission layer on a first electrode; forming at least one layer in an electron transport region by providing the inorganic nanoparticle composition according to embodiments of the present disclosure on the emission layer; and providing a second electrode on the emission layer.

In some embodiments, the forming of at least one layer in the electron transport region is performed by utilizing an inkjet printing method.

General Definitions of Terms

The term "$C_3$-$C_{60}$ carbocyclic group" as utilized herein refers to a cyclic group including (e.g., consisting of) carbon atoms only and having 3 to 60 carbon atoms. The term "$C_1$-$C_{60}$ heterocyclic group" as utilized herein refers to a cyclic group having 1 to 60 carbon atoms in addition to a heteroatom other than carbon atoms. The $C_3$-$C_{60}$ carbocyclic group and the $C_1$-$C_{60}$ heterocyclic group may each be a monocyclic group including (e.g., consisting of) one ring or a polycyclic group in which at least two rings are condensed. For example, the number of ring-forming atoms in the $C_1$-$C_{60}$ heterocyclic group may be in a range of 3 to 61.

The term "cyclic group" as utilized herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as utilized herein refers to a heterocyclic group having 1 to 60 carbon atoms and *—N=*' as a ring-forming moiety.

In some embodiments, the $C_3$-$C_{60}$ carbocyclic group may be i) a T1 group (defined below) or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group (defined below), ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be i) a T1 group, ii) a condensed group in which at least two T1 groups are condensed, iii) a T3 group (defined below), iv) a condensed group in which at least two T3 groups are condensed, or v) a condensed group in which at least one T3 group is condensed with at least one T1 group (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the π electron-deficient nitrogen-containing $C_1$-$C_{60}$ cyclic group may be i) a T4 group (defined below), ii) a group in which at least twos T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a quadvalent group, and/or the like), depending on the structure of the formula to which the term is applied. For example, a "benzene group" may be a benzo group, a phenyl group, a phenylene group, and/or the like, and this may be understood by one of ordinary skill in the art, depending on the structure of the formula including the "benzene group".

Non-limiting examples of the monovalent $C_3$-$C_{60}$ carbocyclic group and the monovalent $C_1$-$C_{60}$ heterocyclic group include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and/or a monovalent non-aromatic condensed heteropolycyclic group. Non-limiting examples of the divalent $C_3$-$C_{60}$ carbocyclic group and the divalent $C_1$-$C_{60}$ heterocyclic group include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and/or a divalent non-aromatic condensed heteropolycyclic group.

The term "$C_1$-$C_{60}$ alkyl group" as used herein may refer to a linear or branched aliphatic hydrocarbon monovalent group having 1 to 60 carbon atoms, and non-limiting examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and/or a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group. Non-limiting examples thereof include an ethenyl group, a propenyl group, and/or a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Non-limiting examples thereof include an ethynyl group and/or a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Non-limiting examples thereof include a methoxy group, an ethoxy group, and/or an isopropyloxy group.

The term "$C_3$-$C_{10}$ cycloalkyl group" as used herein refers to a monovalent saturated hydrocarbon monocyclic group including 3 to 10 carbon atoms. Non-limiting examples of the $C_3$-$C_{10}$ cycloalkyl group include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, and/or a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Non-limiting examples thereof include a 1,2,3,4-oxatriazolidinyl group, a tetrahydrofuranyl group, and/or a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Non-limiting examples thereof include a cyclopentenyl group, a cyclohexenyl group, and/or a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and/or a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and/or an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Non-limiting examples of the $C_1$-$C_{60}$ heteroaryl group include a pyrrolyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a carbazolyl group, a phenanthrolinyl group, a phthalazinyl group, and/or a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms as ring forming atoms (e.g., 8 to 60 carbon atoms), wherein the entire molecular structure is non-aromatic (e.g., the structure when considered in its entirety is not aromatic). Non-limiting examples of the monovalent non-aromatic condensed polycyclic group include an indenyl group, a fluorenyl group, a spiro-bifluorenyl group, a benzofluorenyl group, an indenophenanthrenyl group, and/or an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the entire molecular structure is non-aromatic (e.g., the structure when considered in its entirety is not aromatic). Non-limiting examples of the monovalent non-aromatic condensed heteropolycyclic group include a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and/or a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein indicates —$OA_{102}$ (wherein $A_{102}$ is a $C_6$-$C_{60}$ aryl group), and a $C_6$-$C_{60}$ arylthio group as used herein indicates —$SA_{103}$ (wherein $A_{103}$ is a $C_6$-$C_{60}$ aryl group).

The term "$C_1$-$C_{60}$ heteroaryloxy group" as used herein indicates —$OA_{104}$ (wherein $A_{104}$ is a $C_1$-$C_{60}$ heteroaryl group). The term "$C_1$-$C_{60}$ heteroarylthio group" as used herein indicates —$SA_{105}$ (wherein $A_{105}$ is a $C_1$-$C_{60}$ heteroaryl group).

The term "$R_{10a}$" as used herein may be:

deuterium (—D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

At least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium (—D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), or —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), or —P(=O)($Q_{21}$)($Q_{22}$); or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$) or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Non-limiting examples of the heteroatom may include O, S, N, P, Si, B, Ge, Se, and/or any combination thereof.

The term "Ph" as used herein refers to a phenyl group. The term "Me" as used herein refers to a methyl group. The term "Et" as used herein refers to an ethyl group. The term "tert-Bu" or "Bu$^t$" as used herein refers to a tert-butyl group. The term "OMe" as used herein refers to a methoxy group.

The term "biphenyl group" as used herein refers to a phenyl group substituted with a phenyl group. The "biphenyl group" may be a substituted phenyl group having a $C_6$-$C_{60}$ aryl group as a substituent.

The term "terphenyl group" as used herein refers to a phenyl group substituted with a biphenyl group. The "terphenyl group" may be a substituted phenyl group having a $C_6$-$C_{60}$ aryl group substituted with a $C_6$-$C_{60}$ aryl group as a substituent.

The symbols * and *' as used herein, unless defined otherwise, refer to a binding site to an adjacent atom in a corresponding formula.

EXAMPLES

Preparation Example 1: Preparation of Inorganic Nanoparticle Composition

Trimethyloxonium tetrafluoroborate (($CH_3$)$_3$OBF$_4$) was capped on a surface of inorganic nanoparticles, and then, a highly fluorinated solvent (FC-770, 3M Company) was dispersed thereto to thereby prepare an inorganic nanoparticle composition.

FIG. 2 is an image in which a dispersion of quantum dots in a nonpolar organic solvent, and the prepared inorganic nanoparticle composition, are contained in one vessel. In FIG. 2 the upper portion of the vessel is the solution in which quantum dots are dispersed, and the lower portion is the inorganic nanoparticle composition. Because the quantum dots dispersed in the nonpolar organic solvent do not mix with the inorganic nanoparticle composition of the highly fluorinated solvent, when the inorganic nanoparticle composition is utilized in formation of the light-emitting device, orthogonality at the interface between adjacent layers may be obtained.

Comparative Preparation Example 1

A composition of Comparative Preparation Example 1 was prepared in substantially the same manner as in Preparation Example 1, except that an alcohol-based solvent was utilized instead of the highly fluorinated solvent, and the inorganic nanoparticle did not include a ligand.

Comparative Preparation Example 2

A composition of Comparative Preparation Example 2 was prepared in substantially the same manner as in Preparation Example 1, except that a nonpolar organic solvent was utilized instead of the highly fluorinated solvent, and octylamine(octylamine, $C_8H_{19}N$) was utilized as a ligand of an inorganic nanoparticle.

Comparative Preparation Example 3

A composition of Comparative Preparation Example 3 was prepared in substantially the same manner as in Preparation Example 1, except that a nonpolar organic solvent was utilized instead of the highly fluorinated solvent, and the inorganic nanoparticle did not include a ligand.

Evaluation Example 1: Evaluation of Composition Characteristics

The solubility and effects on an inkjet head of the compositions prepared in Preparation Example 1 and Comparative Preparation Examples 1 to 3 were evaluated. The results thereof are shown in Table 1.

Evaluation Criteria for Solubility

OK: The inorganic nanoparticle was dissolved in the solvent.
NG: The inorganic nanoparticle was not dissolved in the solvent.

Evaluation Criteria for Effects on Inkjet Head

OK: Damage to the inkjet head due to the composition was not occurred.
NG: Damage to the inkjet head due to the composition was occurred.

The damage to the inkjet head may be identified by overall observation of problem occurrence upon liquid drop discharge, for example, damage that may be observed with the naked eye, detection of residual components (viscous complexes, coating components, and/or the like) in the inkjet head from analysis of discharged liquid drops, nozzle blockage, change in liquid drop straightness, satellite generation, and/or the like.

TABLE 1

| Composition | Solvent | Ligand in inorganic nanoparticle | Solubility | Effects on inkjet head |
|---|---|---|---|---|
| Preparation Example 1 | Highly fluorinated solvent | $(CH_3)_3O(BF_4)$ | OK | OK |
| Comparative Preparation Example 1 | Alcohol-based solvent | — | OK | NG |
| Comparative Preparation Example 2 | Nonpolar organic solvent | octylamine | OK | OK |
| Comparative Preparation Example 3 | Nonpolar organic solvent | — | NG | NG |

Referring to the results of Table 1, it was found that the inorganic nanoparticle composition of Preparation Example 1 according to one or more embodiments may have excellent solubility and may have little effects on the inkjet head. Thus, the inorganic nanoparticle composition was found to be suitable for use in a wet process.

Example 1

As an anode, a glass substrate on which ITO were deposited was cut to a size of 50 millimeters (mm)×50 mm×0.7 mm, sonicated in isopropyl alcohol and pure water for 5 minutes in each solvent, cleaned with ultraviolet rays for 30 minutes, and then cleaned with ozone, and the glass substrate was mounted on a vacuum deposition apparatus.

PEDOT:PSS was spin-coated on the ITO electrode and dried to form a hole injection layer having a thickness of 40 nm, and TFB was spin-coated on the hole injection layer and dried to form a hole transport layer having a thickness of 40 nm.

A composition including InP/ZnSe/ZnS core-shell quantum dots (having an average diameter in a range of 3 nm to 8 nm) was spin-coated on the hole transport layer as quantum dots at a coating rate of 3,500 rotations per minute (rpm), followed by natural drying at room temperature for 5 minutes. Then, the layer was dried for 30 minutes at a temperature of 150° C. to thereby form a QD emission layer having a thickness of 30 nm.

A composition including perfluoropolyether and a ZnO inorganic nanoparticle surface-treated with $(CH_3)_3O(BF_4)$ as a charge-transporting ligand was spin-coated on the QD emission layer, followed by natural drying, to form an electron transport layer having a thickness of 40 nm. Subsequently, Ag was deposited on the electron transport layer to form a cathode having a thickness of 150 nm, thereby completing the manufacture of a light-emitting device.

Comparative Example 1

A light-emitting device was manufactured in substantially the same manner as in Example 1, except that an inorganic nanoparticle not including a ligand was utilized in forming an electron transport layer, and an alcohol-based solvent was utilized instead of a solvent including perfluoropolyether.

Comparative Example 2

A light-emitting device was manufactured in substantially the same manner as in Example 1, except that a ZnO inorganic nanoparticle surface-treated with an octylamine ligand was utilized in forming an electron transport layer, and a nonpolar organic solvent was utilized instead of perfluoropolyether.

Figure 3:
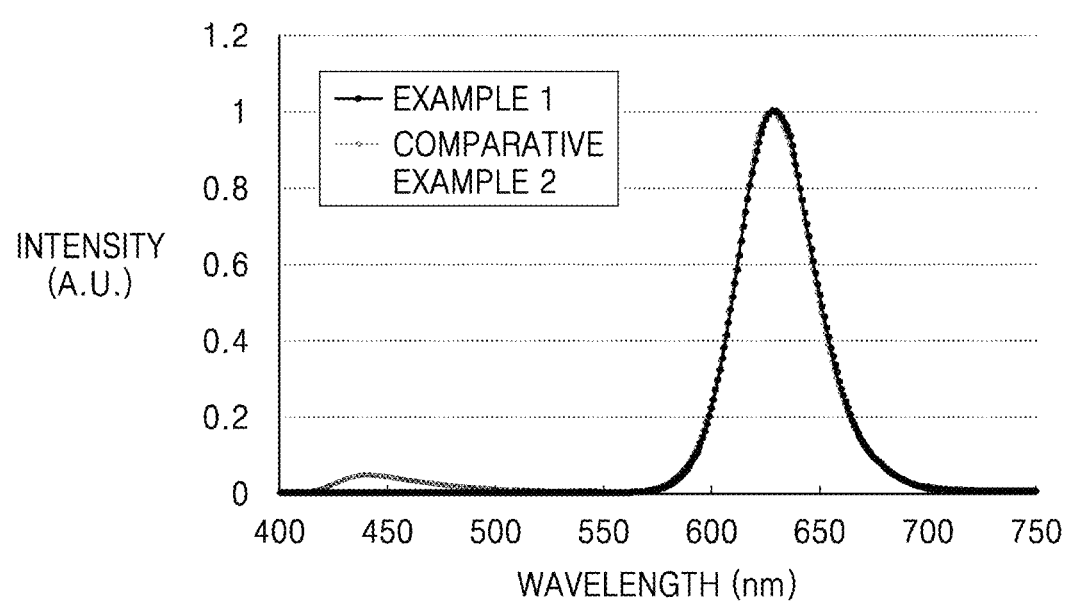
FIG. 3 is a graph of wavelength (nanometers, nm) versus intensity (arbitrary unit, a.u.) in the overlaid emission spectra for the light-emitting devices of Example 1 and Comparative Example 2.

Evaluation Example 2: Evaluation of Characteristics of Organic Light-Emitting Device The driving voltage (V) and luminescence efficiency (cd/A) of the light-emitting devices manufactured in Example 1 and Comparative Examples 1 and 2 were measured by utilizing a Keithley source-measure unit (SMU) 236 and a luminance meter PR650. The results thereof in relative values are shown in Table 2. In some embodiments, the damage of the QD emission layer was identified. The results thereof are shown in Table 2. In some embodiments, emission spectra of the light-emitting devices of Example 1 and Comparative Example 2 are shown in FIG. 3. X indicates that the QD emission layer is not damaged; and O indicates that the QD emission layer is damaged.

TABLE 2

| | Inorganic nanoparticle | Solvent | Ligand of inorganic nanoparticle | Driving voltage (relative value, %) | Luminescence efficiency (relative value, %) | QD emission layer Damage |
|---|---|---|---|---|---|---|
| Example 1 | ZnO nanoparticle | Perfluoropolyether Including | $(CH_3)_3O(BF_4)$ | 100 | 100 | X |
| Comparative Example 1 | | Alcohol-based solvent | — | 103 | 87 | X |
| Comparative Example 2 | | Nonpolar organic solvent | Octylamine | 90 | 31 | O |

Referring to the results of Table 2, it was found that the light-emitting device of Example 1 had a low driving voltage and excellent luminescence efficiency, as compared with the light-emitting device of Comparative Example 1. The light-emitting device of Example 1 was excellent in luminescence efficiency, as compared with the light-emitting device of Comparative Example 2.

Referring to the results of Table 2, it was found that the light-emitting device of Comparative Example 2 had a low driving voltage, as compared with the light-emitting device of Example 1. This low driving voltage may result from damage to the QD emission layer during manufacture of the light-emitting device. As shown in FIG. 3, the light-emitting device of Comparative Example 2 was found to emit light in a wavelength range of about 420 nm to about 450 nm, indicative of emission from the charge transport layer due to the damage to the QD emission layer.

As should be apparent from the foregoing description, when a light-emitting device is formed utilizing the inorganic nanoparticle composition, orthogonality at an interface between adjacent layers may be improved, and thus, the processing efficiency may be improved. Thus, a high-quality electronic apparatus may be realized by utilizing the inorganic nanoparticle composition.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that various suitable changes in form and details may be made without departing from the spirit and scope of the disclosure as defined by the following claims and equivalents thereof.

What is claimed is:

1. An inorganic nanoparticle composition comprising an inorganic nanoparticle and a highly fluorinated solvent,
   wherein the inorganic nanoparticle comprises an inorganic material and a fluorine-containing (F-containing) charge-transporting organic ligand,
   the highly fluorinated solvent comprises chlorofluorocarbon (CFC), perfluorocarbon (PFC), hydrofluorocarbon (HFC), hydrofluoroolefin (HFO), hydrochlorofluorocarbon (HCFC), hydrochlorofluoroolefin (HCFO), hydrofluoroether (HFE), perfluoropolyether (PFPE), or any combination thereof,
   the F-containing charge-transporting organic ligand is a compound represented by Formula 1 or a salt represented by Formula 2:

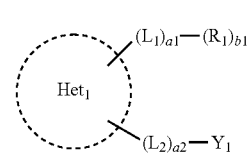

Formula 1

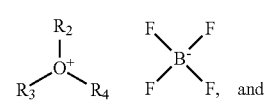

Formula 2 wherein, in Formulae 1 and 2.

ring $Het_1$ is a $\pi$ electron-depleted nitrogen-containing $C_1$-$C_{60}$ cyclic group, $L_1$ and $L_2$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $Y_1$ is —OH, —COOH, —NH$_2$, or —SH, $R_1$ to $R_4$ are each independently hydrogen, deuterium, —F, —Cl, —Br, —I, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, b1 is an integer from 1 to 20, and when b1 is 2 or greater, at least two $R_1$(s) are identical to or different from each other, at least one of the b1 $R_1$(s) is —F or a fluorine-containing group, and a1 and a2 are each independently an integer from 1 to 5, and when a1 is 2 or greater, at least two $L_1$(s) are identical to or different from each other, and when a2 is 2 or greater, at least two $L_2$(s) are identical to or different from each other.

2. The inorganic nanoparticle composition of claim 1, wherein the inorganic material comprises: an oxide, a nitride, a sulfide, or an oxynitride of zinc (Zn), molybdenum (Mo), tungsten (W), nickel (Ni), magnesium (Mg), zirconium (Zr), tin (Sn), tantalum (Ta), hafnium (Hf), aluminum (Al), titanium (Ti), or barium (Ba); or any combination thereof.

3. The inorganic nanoparticle composition of claim 1, wherein the F-containing charge-transporting organic ligand is a compound represented by Formula 1-1 or a salt represented by Formula 2-1 or Formula 2-2:

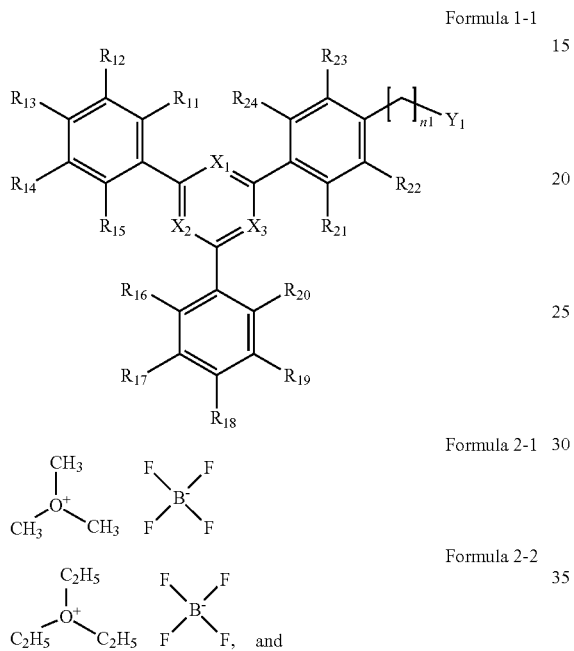

Formula 1-1

Formula 2-1

Formula 2-2 and wherein, in Formula 1-1,
$X_1$ to $X_3$ are each independently $C(R_{10})$ or N,
at least one of $X_1$ to $X_3$ is N,
$Y_1$ is —OH, —COOH, —NH$_2$, or —SH,
n1 is an integer from 0 to 20,
$R_{10}$ to $R_{24}$ are each independently hydrogen, deuterium, —F, —Cl, —Br, —I, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and
at least one of $R_{11}$ to $R_{24}$ is —F or a $C_1$-$C_{20}$ fluoroalkyl group.

4. The inorganic nanoparticle composition of claim 1, wherein the F-containing charge-transporting organic ligand covers at least a portion of a surface of the inorganic material.

5. The inorganic nanoparticle composition of claim 1, wherein a melting point of the inorganic nanoparticle composition is 150° C. or higher.

6. The inorganic nanoparticle composition of claim 1, wherein a viscosity of the inorganic nanoparticle composition is in a range of about 1 centipoise (cP) to about 10 cP, and a surface tension of the inorganic nanoparticle composition is in a range of about 10 dynes/cm to about 30 dynes/cm.

7. A light-emitting device comprising:
a first electrode;
a second electrode facing the first electrode; and
an interlayer between the first electrode and the second electrode and comprising an emission layer,
wherein the interlayer comprises an electron transport region between the emission layer and the second electrode,
at least a portion of the electron transport region is formed from an inorganic nanoparticle composition comprising an inorganic nanoparticle and a highly fluorinated solvent, and
the inorganic nanoparticle comprises an inorganic material and a F-containing charge-transporting organic ligand,
wherein the highly fluorinated solvent comprises chlorofluorocarbon (CFC), perfluorocarbon (PFC), hydrofluorocarbon (HFC), hydrofluoroolefin (HFO), hydrochlorofluorocarbon (HCFC), hydrochlorofluoroolefin (HCFO), hydrofluoroether (HFE), perfluoropolyether (PFPE), or any combination thereof,
the F-containing charge-transporting organic ligand is a compound represented by Formula 1 or a salt represented by Formula 2:

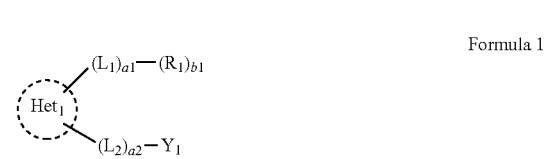

Formula 1

Formula 2 wherein, in Formulae 1 and 2,
ring $Het_1$ is a π electron-depleted nitrogen-containing $C_1$-$C_{60}$ cyclic group,
$L_1$ and $L_2$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group,
$Y_1$ is —OH, —COOH, —NH$_2$, or —SH, $R_1$ to $R_4$ are each independently hydrogen, deuterium, —F, —Cl, —Br, —I, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, b1 is an integer from 1 to 20, and when b1 is 2 or greater, at least two $R_1$(s) are identical to or different from each other at least one of the b1 $R_1$(s) is —F or a fluorine-containing group, and a1 and a2 are each independently an integer from 1 to 5, and when a1 is 2 or greater, at least two $L_1$(s) are identical to or different from each other, and when a2 is 2 or greater, at least two $L_2$(s) are identical to or different from each other.

8. The light-emitting device of claim 7, wherein the inorganic material comprises: an oxide, a nitride, a sulfide, or an oxynitride of zinc (Zn), molybdenum (Mo), tungsten (W), nickel (Ni), magnesium (Mg), zirconium (Zr), tin (Sn), tantalum (Ta), hafnium (Hf), aluminum (Al), titanium (Ti), or barium (Ba); or any combination thereof.

9. The light-emitting device of claim 7, wherein the F-containing charge-transporting organic ligand is a compound represented by Formula 1 or a salt represented by Formula 2:

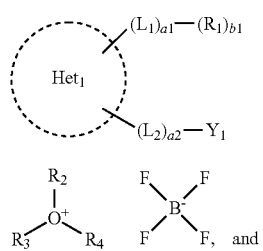

Formula 1

Formula 2 and wherein, in Formulae 1 and 2, ring $Het_1$ is a $\pi$ electron-depleted nitrogen-containing $C_1$-$C_{60}$ cyclic group, $L_1$ and $L_2$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $Y_1$ is —OH, —COOH, —NH$_2$, or —SH, $R_1$ to $R_4$ are each independently hydrogen, deuterium, —F, —Cl, —Br, —I, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, b1 is an integer from 1 to 20, and when b1 is 2 or greater, at least two $R_1$(s) are identical to or different from each other, at least one of the b1 $R_1$(s) is —F or a fluorine-containing group, and a1 and a2 are each independently an integer from 1 to 5, and when a1 is 2 or greater, at least two $L_1$(s) are identical to or different from each other, and when a2 is 2 or greater, at least two $L_2$(s) are identical to or different from each other.

10. The light-emitting device of claim 7, wherein the F-containing charge-transporting organic ligand is a compound represented by Formula 1-1 or a salt represented by Formula 2-1 or Formula 2-2:

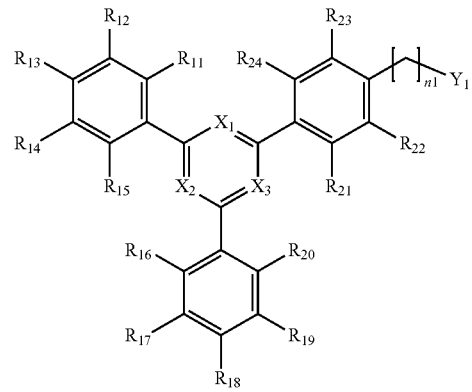

Formula 1-1

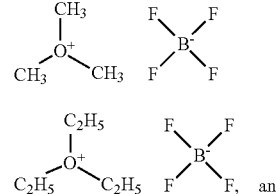

Formula 2-1

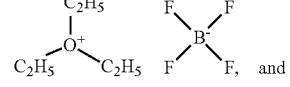

Formula 2-2 and wherein, in Formula 1-1, $X_1$ to $X_3$ are each independently $C(R_{10})$ or N, at least one of $X_1$ to $X_3$ is N, $Y_1$ is —OH, —COOH, —NH$_2$, or —SH, n1 is an integer from 0 to 20, $R_{10}$ to $R_{24}$ are each independently hydrogen, deuterium, —F, —Cl, —Br, —I, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and at least one of $R_{11}$ to $R_{24}$ is —F or a $C_1$-$C_{20}$ fluoroalkyl group.

11. The light-emitting device of claim 7, wherein the highly fluorinated solvent comprises chlorofluorocarbon (CFC), perfluorocarbon (PFC), hydrofluorocarbon (HFC), hydrofluoroolefin (HFO), hydrochlorofluorocarbon (HCFC), hydrochlorofluoroolefin (HCFO), hydrofluoroether (HFE), perfluoropolyether (PFPE), or any combination thereof.

12. The light-emitting device of claim 7, wherein the electron transport region comprises an electron transport layer, and the electron transport layer is in direct contact with the emission layer and is formed from the inorganic nanoparticle composition.

13. The light-emitting device of claim 7, wherein the emission layer comprises a plurality of quantum dots, and each of the plurality of quantum dots comprises a semiconductor material selected from the group consisting of a group III-VI semiconductor compound; a group II-VI semiconductor compound; a group III-V semiconductor compound; a group I-III-VI semiconductor compound; a group IV-VI semiconductor compound; and a group IV element or semiconductor compound; and any combination thereof.

14. The light-emitting device of claim 7, wherein:

the first electrode is an anode, the second electrode is a cathode, and a hole transport region is between the first electrode and the emission layer, wherein the hole transport region comprises a hole injection layer, a hole transport layer, an emission auxiliary layer, an electron blocking layer, or any combination thereof.

15. The light-emitting device of claim 7, wherein the second electrode is a transparent electrode having a light transmittance of 50 percent (%) or more in a range of visible light wavelengths.

16. A method of manufacturing a light-emitting device, the method comprising:

providing an emission layer on a first electrode;

forming at least one layer in an electron transport region by providing the inorganic nanoparticle composition according to claim 1 on the emission layer; and providing a second electrode on the emission layer.

17. The method of claim 16, wherein the forming of at least one layer in the electron transport region is performed by utilizing an inkjet printing method.

18. An electronic apparatus comprising the light-emitting device of claim 7.

\* \* \* \* \*